United States Patent
Shiomi et al.

(10) Patent No.: US 6,245,987 B1
(45) Date of Patent: Jun. 12, 2001

(54) SOLAR CELL MODULE, ENCLOSURE WITH SOLAR CELLS, ENCLOSURE INSTALLATION METHOD, AND SOLAR CELL SYSTEM

(75) Inventors: Satoru Shiomi, Kyotanabe; Kimitoshi Fukae; Yuji Inoue, both of Nara; Ichiro Kataoka, Kyotanabe; Fumitaka Toyomura, Kyotanabe; Makoto Sasaoka, Kyotanabe, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/149,017

(22) Filed: Sep. 8, 1998

(30) Foreign Application Priority Data

Sep. 10, 1997 (JP) .................................................. 9-245320
Feb. 12, 1998 (JP) ................................................ 10-029743

(51) Int. Cl.[7] .................................................. H01L 25/00
(52) U.S. Cl. ........................................ 136/244; 136/251
(58) Field of Search ..................................... 136/244, 251

(56) References Cited

U.S. PATENT DOCUMENTS

| 3,849,880 | * | 11/1974 | Haynos | 29/626 |
| 4,433,200 | * | 2/1984 | Jester et al. | 136/251 |
| 4,633,032 | * | 12/1986 | Oido et al. | 136/251 |
| 4,636,577 | * | 1/1987 | Peterpaul | 136/206 |
| 5,092,939 | * | 3/1992 | Nath et al. | 136/251 |
| 5,217,540 | * | 6/1993 | Ogura | 136/251 |
| 5,575,861 | * | 11/1996 | Younan et al. | 136/251 |
| 5,589,006 | | 12/1996 | Itoyama et al. | 136/248 |
| 5,707,459 | * | 1/1998 | Itoyama et al. | 136/251 |
| 5,849,107 | | 12/1998 | Itoyama et al. | 136/248 |

FOREIGN PATENT DOCUMENTS

| 7-211932 | 8/1995 | (JP) | H01L/31/42 |
| 7-302924 | 11/1995 | (JP) | H01L/31/42 |
| 9-55520 | 2/1997 | (JP) | H01L/31/04 |
| 9-55528 | 2/1997 | (JP) | H01L/31/04 |
| 9-83159 | 3/1997 | (JP) | H05K/7/00 |
| 9-186471 | 7/1997 | (JP) | H05K/7/00 |

OTHER PUBLICATIONS

Hunrath, "Solar Power Supplies for Ground use" Proceedings 17th Power Sources Conf. p. 8–11, May 1963.*
Sotolongo, "Reliability and Maintainability Considerations of Connector System for Photovoltaic Modules", 15th IEEE Photovoltaic Specialists Conf. p. 1382–1385, May 1981.*
Patent Abstracts of Japan, vol. 1997, No. 09, Sep. 30, 1997 (corresponds to JP 09–135039).
Patents Abstracts of Japan, vol. 1995, No. 09, Oct. 31, 1995 (corresponds to JP 07–153985).

* cited by examiner

Primary Examiner—Mark Chapman
(74) Attorney, Agent, or Firm—Fitzpatrick, Cella, Harper & Scinto

(57) ABSTRACT

By providing a non-contact means and/or a non-contact space between electric connecting members and an underlaying material and/or a substrate material and/or a rear material, the temporal degradation of a solar cell module can be prevented which is caused by a contact between the electric connecting members for the module and the underlaying material and/or the substrate material and/or the rear material.

90 Claims, 37 Drawing Sheets

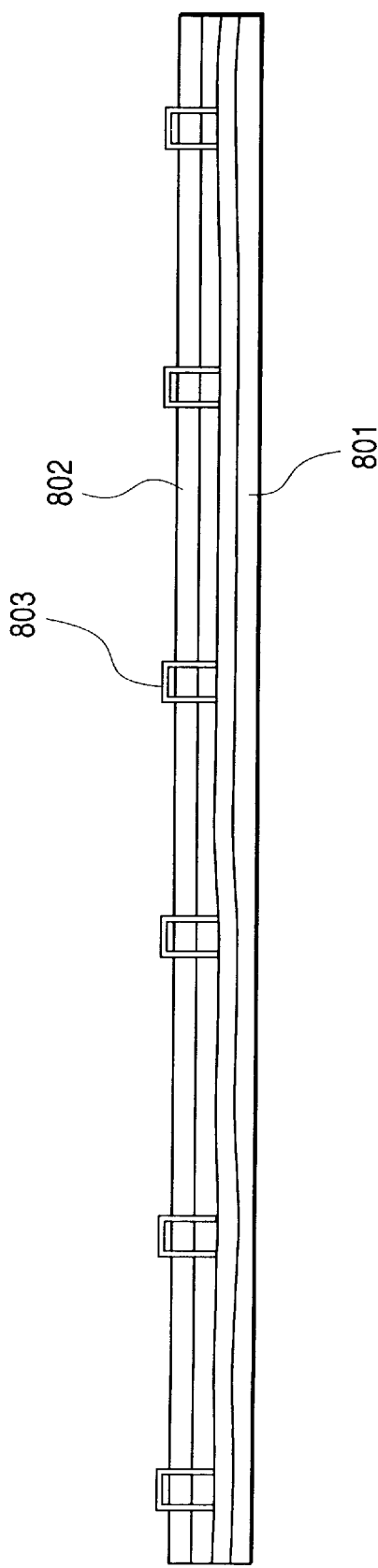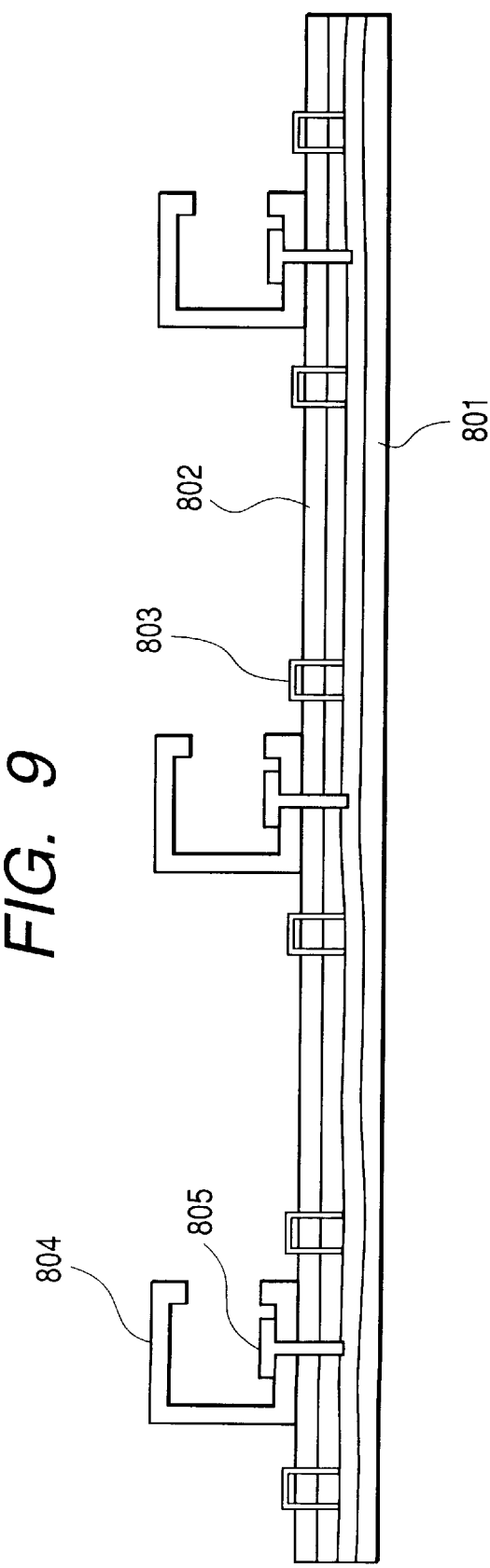

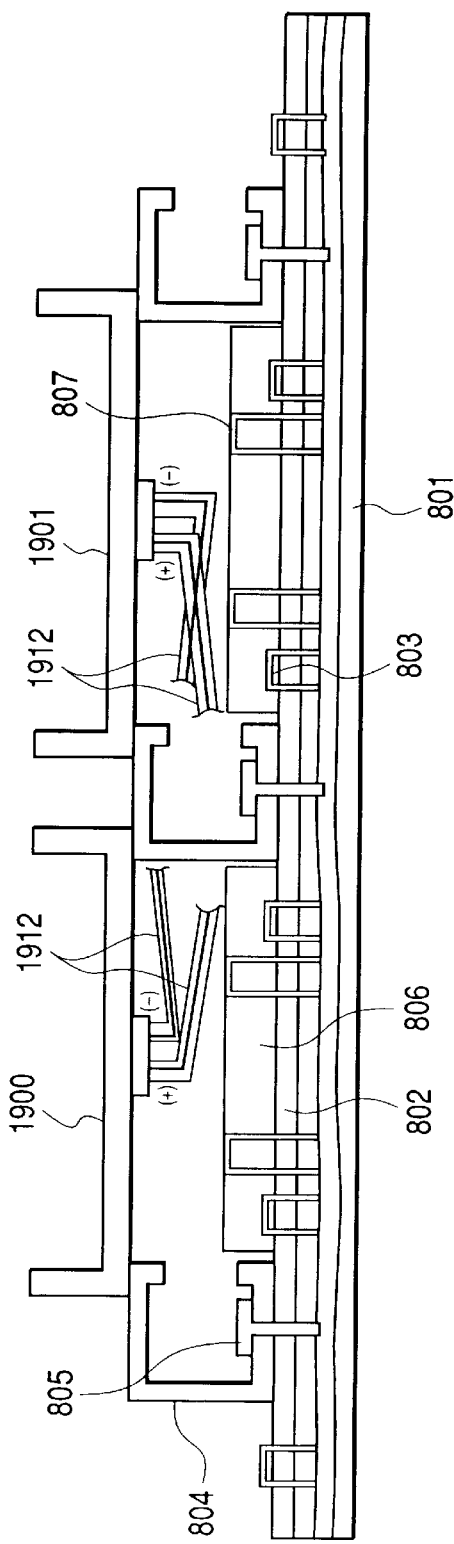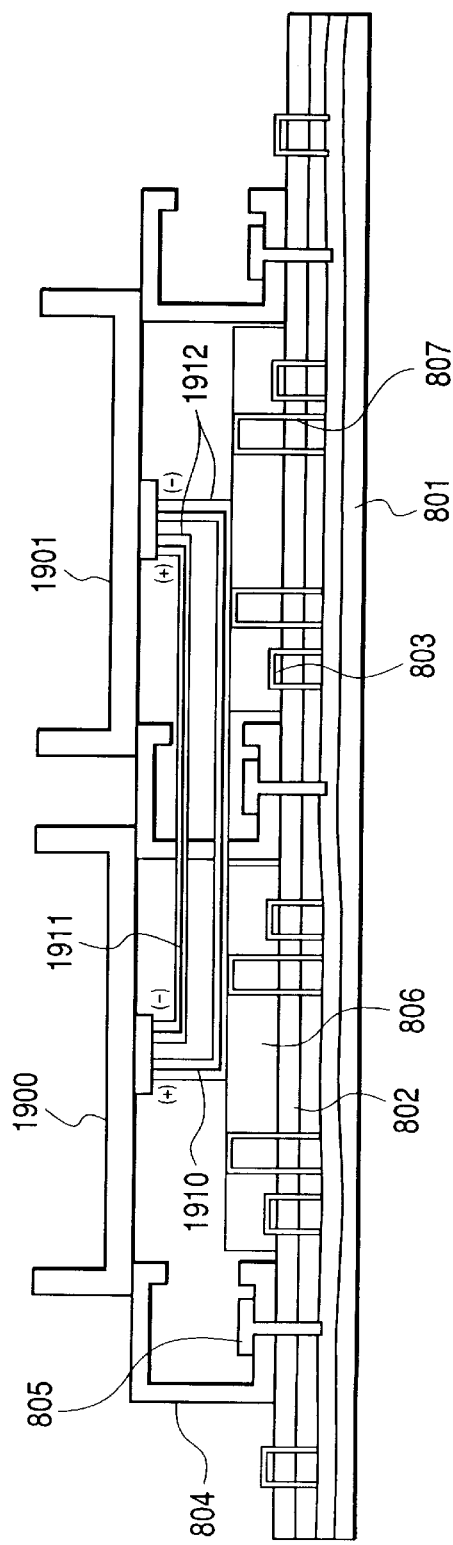

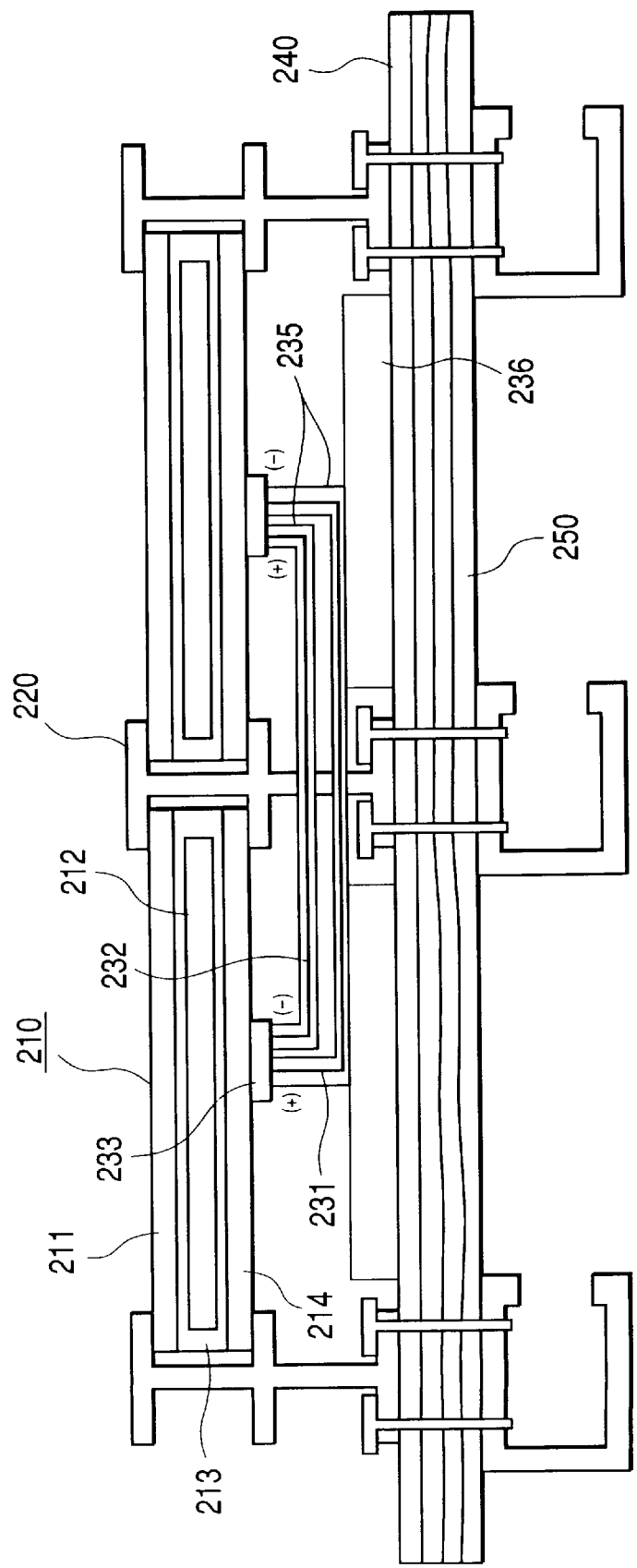

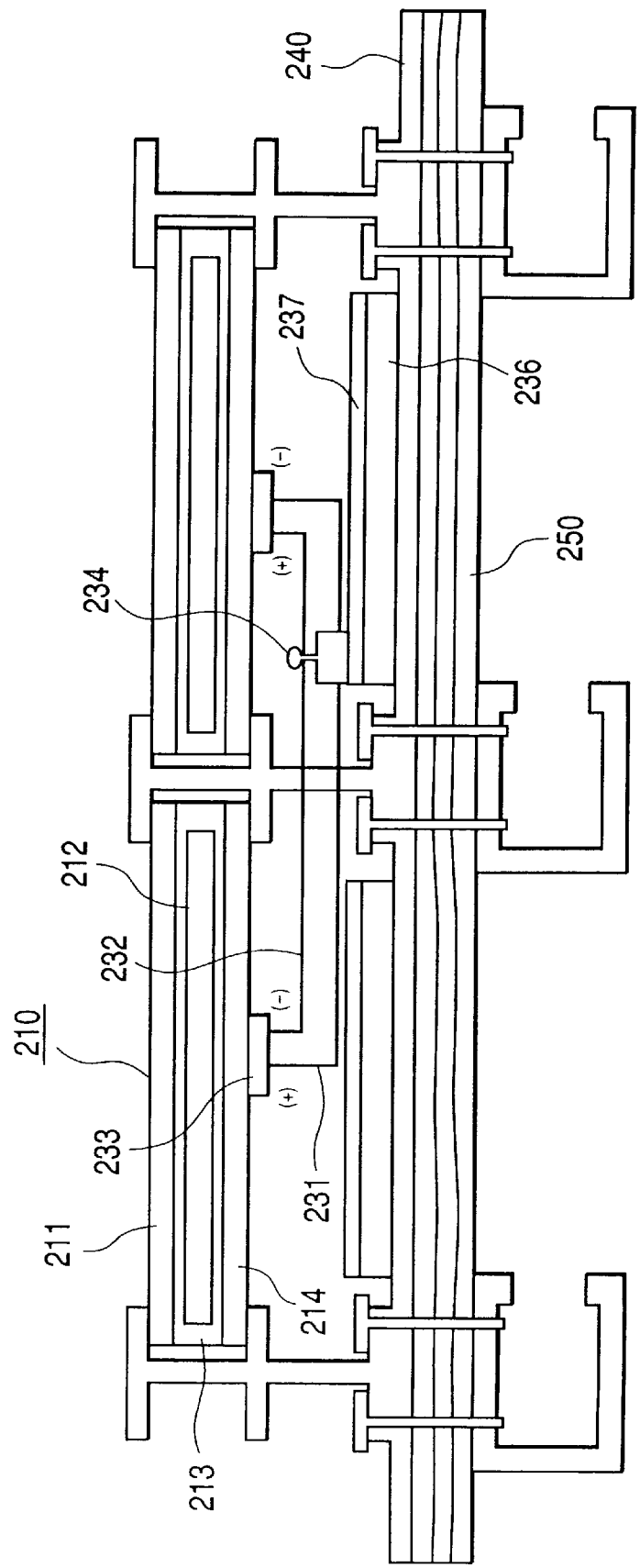

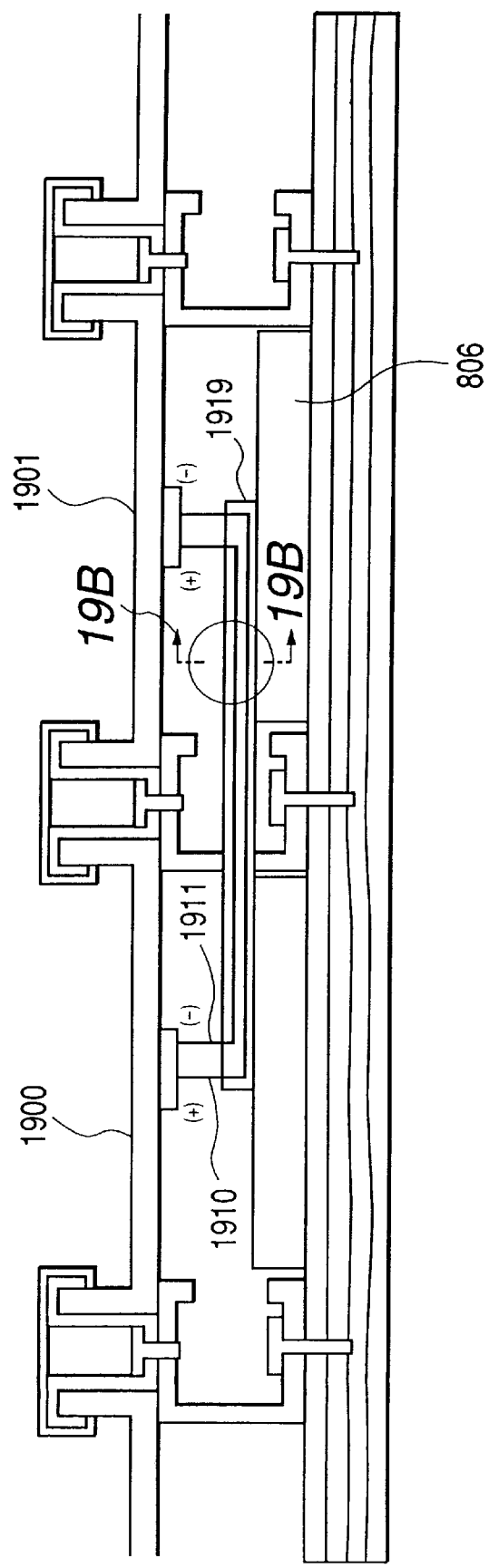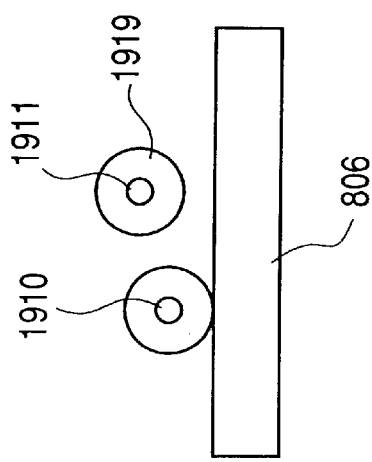

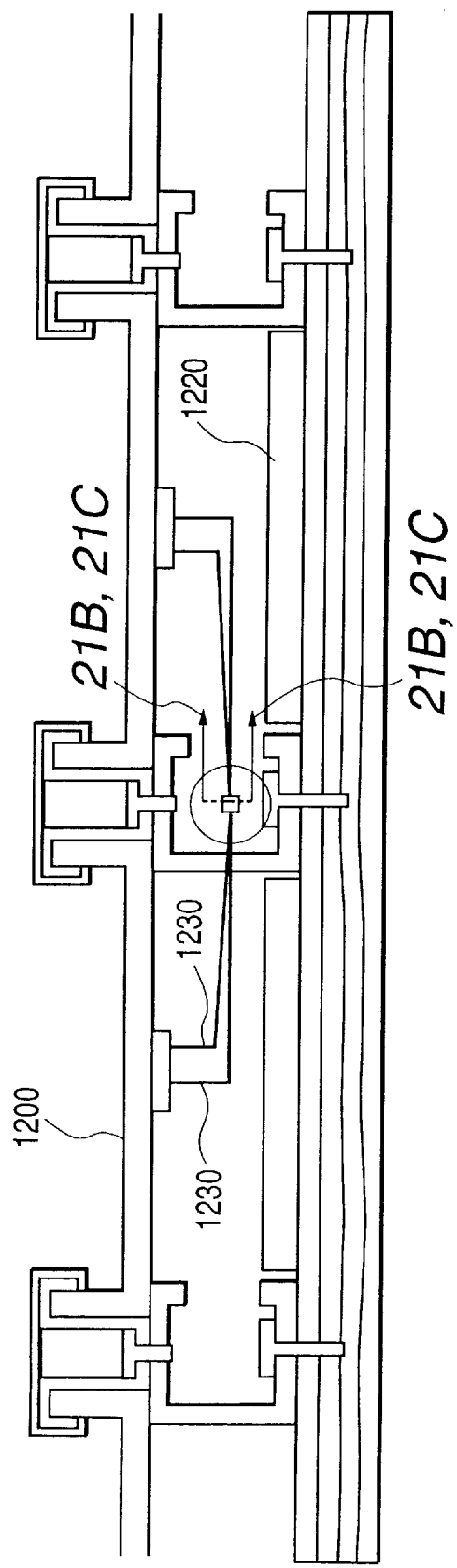
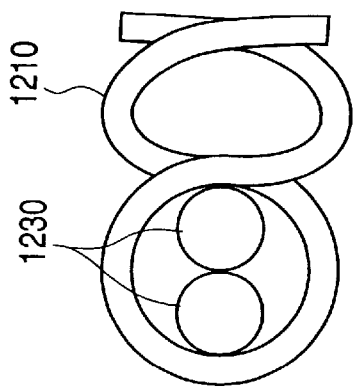
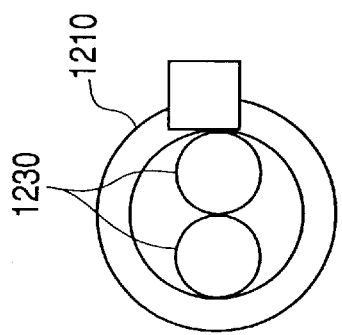

SOLAR CELL MODULE, ENCLOSURE WITH SOLAR CELLS, ENCLOSURE INSTALLATION METHOD, AND SOLAR CELL SYSTEM

BACKGROUND OF THE INVENTION

1. Field of the Invention

The present invention relates to a solar cell module, an enclosure with solar cells, a method for installing the enclosure with a solar cell, and a sunlight power generating system.

2. Related Background Art

Due to the recently increasing ecological consciousness, more and more attempts are made to develop and use solar cells that provide clean energy.

In particular, more and more solar cells are installed on the clay tile roofs of houses and the ceilings or walls of buildings.

Furthermore, in addition to such solar cells being installed on the roofs of buildings, a large number of solar cell modules integrated with construction materials such as "a solar cell module integrated with a roof" or "a solar cell module integrated with a wall" have been developed and constructed.

For example, in Japanese Patent Application Laid-Open No. 7-211932, roof materials integrated with ribbed seam-like solar cell modules are installed via spacer members on an underlaying material laid on a substrate material such as wood, mortar, or cement. Adjacent ribbed seam-like solar cell modules are electrically connected the space between the solar cell modules and the underlaying material using cords with connectors.

In addition, in Japanese Patent Application Laid-Open No. 7-302924, a plurality of laterally laying roof plates with solar cells are installed on an underlaying material, and wiring materials used to electrically connect adjacent roof plates with solar cells are passed through the space portion between the underlaying material and the laterally laying roof plates with solar cells.

In these roof plates with solar cells, the wiring materials, that is, connectors or connection cables, for electrically connecting adjacent solar cells are connected in the space between the underlaying material and the roof plates with solar cells.

As described above, when solar cell modules are installed on an underlaying material and/or a substrate material and adjacent solar cell modules are connected using electric connecting members such as cables or connectors, the solar cell modules are often sequentially installed above the underlaying material and/or substrate material while the electric connecting members for the adjacent solar cell modules are connected in the space between the underlaying material and/or substrate material and the solar cell modules.

Specifically, for example, the solar cell module on the eaves side is fixed to a bar on the underlaying material and/or substrate material, and the solar cell module on the eaves side and an electric connecting member of the solar cell module on the ridge side that is located immediately above the solar cell module on the eaves side are electrically connected in the space between the underlaying material and/or substrate material using, for example, a connector. Then, the solar cell module on the ridge side that is located immediately above the module on the eaves side is also fixed to the bar.

In such an installation method, however, the space portion between the underlaying material and/or substrate material and the solar cell modules is small, and electric connection operations must be performed on the rear side of the modules instead of their front side, thereby making operations difficult. Furthermore, when the temperature is low during winter, the cables and connectors are hardened, and the difficulty of the operations increases.

In addition, due to the need to connect the electric connecting members in the small space, the electric connecting member may be pulled too hard or excessive force may be exerted on the electric connecting member and the connection between the solar cell module and the electric connecting member. The electric connecting member may sometimes be disconnected from the solar cell module.

The length of the electric connecting members for the solar cell module may be increased to facilitate the use of the electric connecting members to connect the solar cell modules. In addition, when the lengths of plus and minus electric connecting members are equal, cable connectors can be produced by attaching plus and a minus connectors to the same electric connecting members, respectively, resulting in very high productivity.

On the other hand, to improve thermal insulation to cope with increasing needs for roofs, there is practically used a roof material integrated with a rear material, or a roof material comprising the rear material located between the roof material and the underlaying material and/or substrate material. The inventors have also been attempting to meet such needs for roofs with solar cells. The inventors have thus found that a problem may occur when the rear material is located on the underlaying material and/or substrate material, when the underlaying material and/or substrate material is composed of the rear material, when solar cell modules with the rear material are installed above the underlaying material and/or substrate material, or when the electric connecting members for the solar cells physically contact the rear material.

Furthermore, the inventors have found that the performance of the installed solar cell modules may be degraded when asphalt-based resin, polystyrene-based resin, polyurethane-based resin, or vinyl-based chloride resin that is often used as the underlaying material and/or substrate material and/or rear material contacts, over a long time, vinyl chloride-based resin that is used as a casing material for the electric connecting members used as wiring members for the solar cell modules and when these resins are under a resin degradation condition such as high temperature and high humidity.

SUMMARY OF THE INVENTION

It is an object of this invention to provide a solar cell module, an enclosure with solar cells, a method for installing them, and a sunlight power generating system using them, wherein excellent water-tightness and weatherability are provided, wherein solar cells can provide sufficient performance, and wherein long-time reliability is obtained. In particular, it is an object of this invention to provide a solar cell module, an enclosure with solar cells, a method for installing these devices, and a sunlight power generating system using them, wherein the degradation of an electric connecting member can be prevented (particularly when the casing material of the member is made of vinyl chloride), and wherein the output from solar cells can be prevented from decreasing.

It is another object of this invention to provide a solar cell module, an enclosure with solar cells, an enclosure installation method, and a solar cell system, wherein cracking of a covering material for electric connecting members is prevented, thereby improving reliability, particularly, long-time reliability.

It is yet another object of this invention to provide a solar cell module, an enclosure with solar cells, an enclosure installation method, and a solar cell system, wherein excessive force is prevented from being exerted on the connection between a solar cell body and electric connecting members, thereby improving the installation operation for the solar cell modules.

It is still another object of this invention to provide an enclosure with solar cells and a sunlight power generating system with the enclosure, wherein an underlaying material or a substrate material is disposed on the back side of a solar cell module that outputs electricity through electric connecting members and wherein a non-contact space between the electric connecting members and the underlaying material or substrate material is provided between the electric connecting members and the underlaying materials or substrate material.

It is still another object of this invention to provide a method for installing an enclosure with solar cells, wherein an underlaying material or a substrate material is disposed on the back side of a solar cell module that outputs electricity through electric connecting members and wherein the enclosure is arranged by providing a non-contact space between the electric connecting members and the underlaying material or substrate material.

It is still another object of this invention to provide a solar cell module that outputs electricity through electric connecting members, wherein an underlaying material or a substrate material is disposed on the back side of the solar cell module, and wherein the module comprises a non-contact means between the electric connecting members and the underlaying material or substrate material.

It is still another object of this invention to provide an enclosure with solar cells, wherein an underlaying material or a substrate material is disposed on the back side of a solar cell module that outputs electricity through an electric connecting member, and wherein the enclosure comprises a non-contact means between the electric connecting members and the underlaying material or substrate material.

It is still another object of this invention to provide a method for installing an enclosure with solar cells wherein an underlaying material or a substrate material is disposed on the back side of a solar cell module that outputs electricity through electric connecting members and wherein a non-contact means is disposed between the electric connecting members and the underlaying material or substrate material, in such a way that the electric connecting members do not contact the underlaying material or substrate material.

It is still another object of this invention to provide a solar cell module with a rear material, wherein the rear material is disposed on the back side of a solar cell module that outputs electricity through electric connecting members and wherein the module has a non-contact space between the electric connecting members and the rear material.

It is still another object of this invention to provide an enclosure with solar cells, wherein a rear material is disposed on the back side of a solar cell module that outputs electricity through electric connecting members and wherein the enclosure has a non-contact space between the electric connecting members and the rear material so that the electric connecting members do not contact the rear material.

It is still another object of this invention to provide a method for installing a solar cell module with a rear material in an enclosure for solar cells, by disposing an underlaying material or a substrate material on the back side of the solar cell module that outputs electricity through an electric connecting member, wherein the enclosure is installed by providing a non-contact space between the electric connecting members and the underlaying material or substrate material or the rear material.

It is still another object of this invention to provide a method for installing a solar cell module in an enclosure for solar cells, comprising placing a rear material between the solar cell module and the underlaying material or substrate material, using electric connecting members to connect a plurality of solar cell modules outputting electricity from their non-light-receiving surface sides through an electric connecting member, and providing a non-contact space between the electric connecting members and the underlaying material or substrate material or the rear material so that the electric connecting members do not contact the underlaying material or substrate member or the rear material.

It is still another object of this invention to provide a solar cell module with a rear material, wherein a rear material is disposed on the back side of the solar cell module that outputs electricity through electric connecting members, and wherein the module comprises a non-contact means between the electric connecting members and the rear material.

It is still another object of this invention to provide an enclosure with solar cells wherein a rear material is disposed on the back side of a solar cell module that outputs electricity through an electric connecting member, and wherein a non-contact means is provided between the electric connecting members and the rear material.

It is still another object of this invention to provide a method for installing a solar cell module with a rear material in an enclosure for solar cells, by disposing an underlaying material or a substrate material on the back side of a solar cell module that outputs electricity through an electric connecting member, wherein a non-contact means is provided between the electric connecting members and the underlaying material or substrate material or the rear material so as to prevent the electric connecting members from contacting the underlaying material or substrate material or the rear material.

It is still another object of this invention to provide a method for installing a solar cell module in an enclosure for solar cells, which comprises placing a rear material between the solar cell module and an underlaying material or a substrate material, using electric connecting members to connect a plurality of solar cell modules outputting electricity from their non-light-receiving surface sides through an electric connecting member, and providing a non-contact means between the electric connecting members and the underlaying material or substrate material or the rear material.

BRIEF DESCRIPTION OF THE DRAWINGS

FIGS. 8, 9, 10, 11, 12A, 12B, 13 and 14 are schematic sectional views illustrating an example of an installation procedure using an enclosure according to this invention;

FIGS. 16A and 16C are schematic sectional views showing an example of an installed enclosure according to this invention, and FIGS. 16B and 16D are schematic sectional views illustrating test methods for the examples shown in FIGS. 16A and 16C, respectively;

FIGS. 18, 19A, 20A, 21A, 23, 26, 28, 29, 30, 33, 35, 36, 37, 38, 39 and 40 are schematic sectional views showing an example of an installed enclosure;

FIG. 19B is a partially enlarged cross-sectional view of the portion surrounded by a circle, taken along the line 19B—19B of FIG. 19A;

FIG. 21B is a partially enlarged cross-sectional view of the portion surrounded by a circle, taken along the line 21B, 21C-21B, 21C of FIG. 21A;

FIG. 21C is a partially enlarged cross-sectional view of the portion surrounded by a circle, taken along the line 21B, 21C-21B, 21C of FIG. 21A;

DETAILED DESCRIPTION OF THE PREFERRED EMBODIMENTS

This invention is described in detail with reference to embodiments.

Figure 1A:
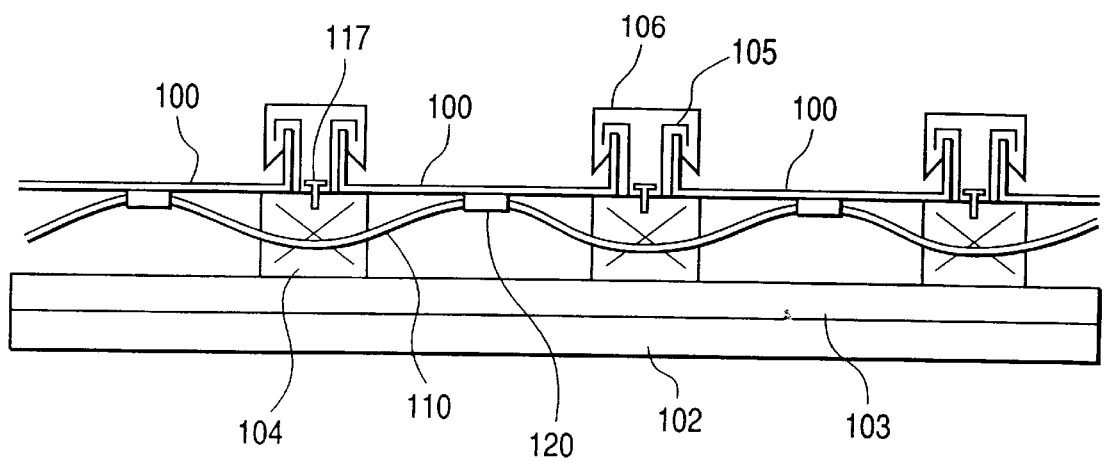
FIGS. 1A and 1B are schematic sectional views showing an example of an installed enclosure with solar cells according to this invention.

FIG. 1A shows an example of an embodiment of this invention. In this figure, a plurality of solar cell modules 100 are installed above an underlaying material and/or a substrate material 103 via a spacer member 104, and an electric connecting member 110 drawn out from a terminal box 120 is wired between the solar cell module 100 and the underlaying material and/or substrate material 103 and is electrically connected to the adjacent solar cell module.

According to this invention, a non-contact space is provided between the electric connecting member 110 and the lower cover material and/or substrate material 103. That is, the electric connecting member 110 is held in the air so as not to physically be in direct contact with the underlaying material and/or substrate material. Incidentally, a rear material may be provided between the lower cover material and/or substrate material and the solar cell module. When a rear material is stuck to the back surface of the solar cell module, a part of the rear material which is located in a wiring path for the electric connecting member is cut out to provide a space in order to prevent physical contact, or a plurality of rear materials are stuck to the solar cell module except for the position of the wiring path for the electric connecting member.

Figure 1B:
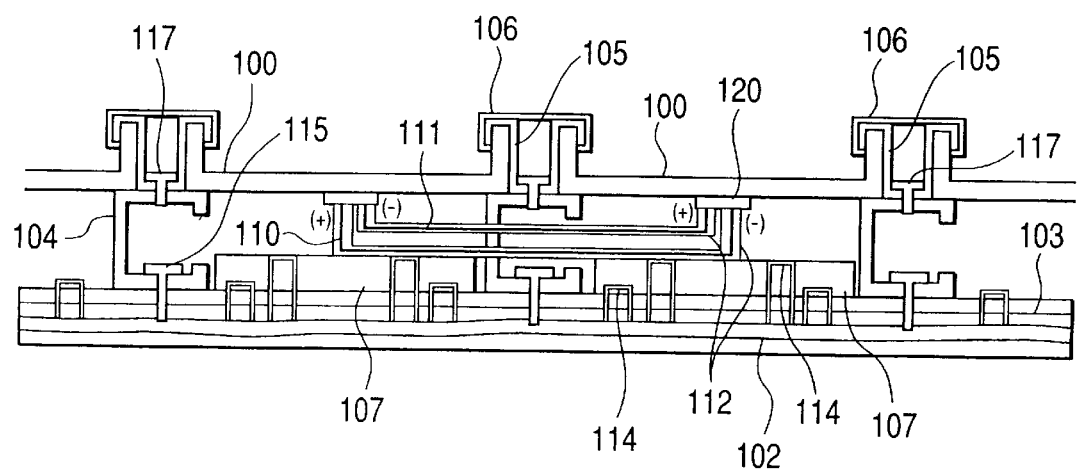

FIG. 1B shows an example of an embodiment of this invention. In this figure, a thermal insulation rear material 107 is laid on the underlaying material and/or substrate material 103, the plurality of solar cell modules 100 are installed via spacer members 104, and electric connecting members 110 and 111 drawn out from the terminal box are wired between the solar cell module 100 and the rear material 107 and are electrically connected to the adjacent solar cell module.

In FIG. 1B, a non-contact means is provided between the electric connecting members 110 and 111 and the rear material 107 to prevent the electric connecting members and the rear material from physically contacting each other. Specifically, the electric connecting members are covered with a covering material such as a tube 112. Alternatively, films or sheets may be laid between the electric connecting members and the rear material, a tape may be wound around the electric connecting members or rear material, an electric path supporting material may be laid in the electric connecting member path between the electric connecting members and the rear material, a wiring binding device may be provided on the back surface of the solar cell module to support the electric connecting members, a paint may be applied to the electric connecting members or rear material, or an adhesive or a pressure sensitive adhesive may be applied to the electric connecting members or rear material.

Figure 41:
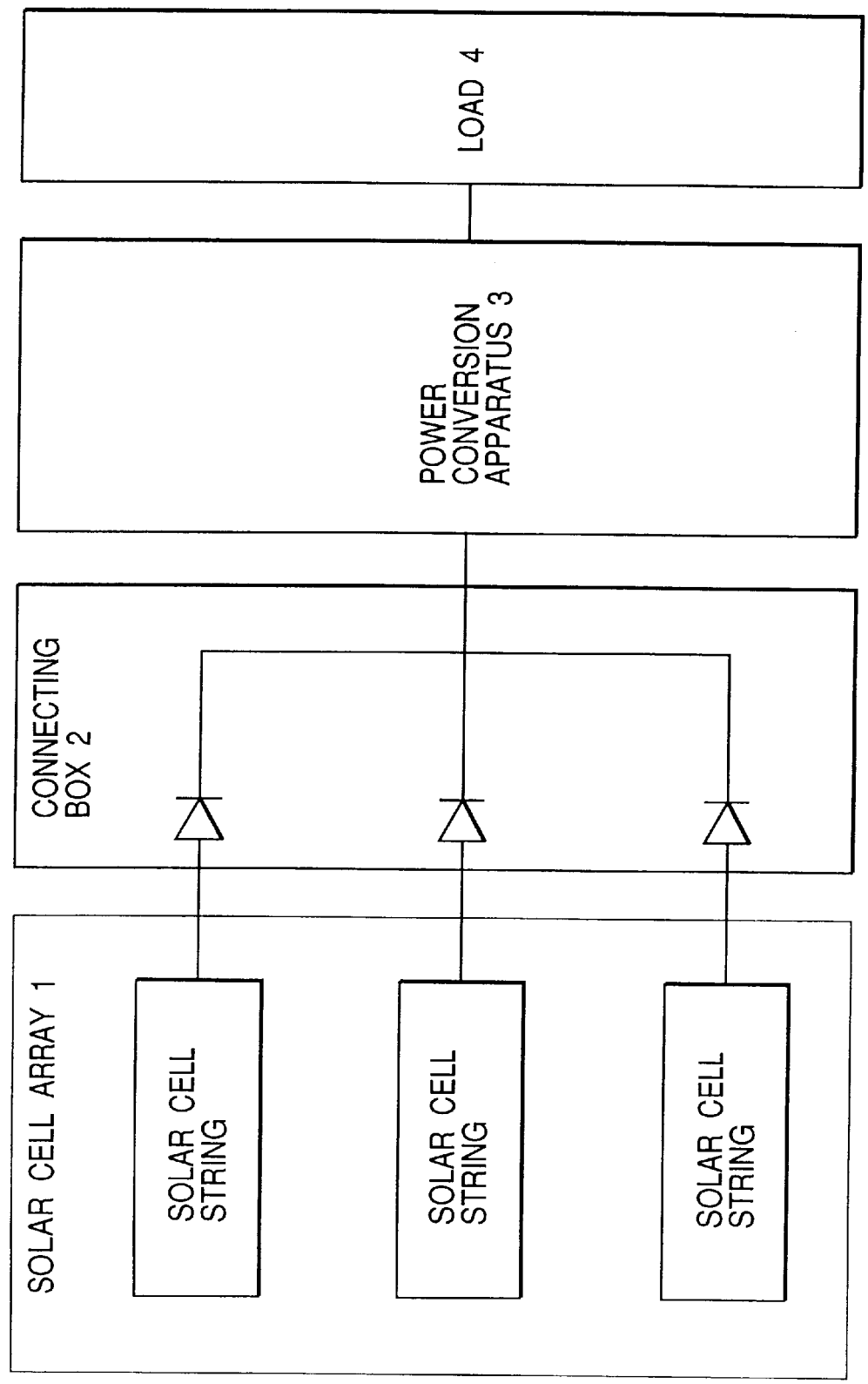
FIG. 41 is a block diagram showing an example of a configuration of a sunlight power generating system.

Next, as shown in FIG. 41, a sunlight power generating system according to this invention is configured by electrically connecting a plurality of solar cell modules together to constitute a solar cell string so as to obtain a desired output current, connecting such solar cell strings in series and in parallel to constitute a solar cell array 1, and constructing an enclosure comprising these cells. The output power from the individual solar cell strings of the solar cell enclosure is collected in a connection box 2 via a blocking diode that prevents a reverse current caused by solar radiation and is then supplied to a load 4 via a power conversion apparatus 3. The load 4 comprises an electrothermal load, an electric motor load, a commercial AC system, or combination thereof.

Solar Cell

Solar cells used for an enclosure with cells according to this invention are not particularly limited but may be single-crystalline, polycrystalline, or amorphous silicon solar cells that comprise silicon semiconductors, or Group III–V, II–VI, or I–III–VI compound solar cells that comprise compound semiconductors.

The solar cells used in this invention are preferably amorphous silicon solar cells. The amorphous silicon solar cell can be formed as a thin film on a film substrate or an electroconductive substrate, so this type of cell is lighter than other types. In particular, amorphous silicon solar cells having an electroconductive substrate are structurally strong and flexible, so they can be very freely shaped like various roofs or walls.

When the solar cells comprise amorphous silicon and the underlaying material comprises asphalt, temporally degraded amorphous silicon solar cells can be recovered due to the high thermal insulation of the asphalt underlaying material that serves to increase the temperature between the solar cell module and the asphalt underlaying material. Similar effects can be obtained by placing a thermal insulation rear material between the underlaying material and/or substrate material and the solar cell module.

Furthermore, the solar cell modules used in this invention preferably have a light-receiving surface having an entirely dark-based color. The entirely dark light-receiving surface enables the entire solar cell module to absorb energy from sunlight in order to further recover temporally degraded solar cell modules.

When, instead of glass, a weatherproof film is used as a surface protecting material for the solar cell module and a metal steel plate used for a metal roof is used as a rear reinforcing plate, the solar cell module can be bent and shaped like the metal roof and can be molded into, for example, a folded plate-like shape, a ribbed seam-like shape, or a laterally laying shape.

The solar cell module according to this invention preferably has a back reinforcing plate having a dark-based color. The dark back reinforcing plate enables the entire light-receiving surface to be darkened easily. The dark-based color is, for example, black, brown, dark blue, or dark red, but is not limited to these colors. The back reinforcing plate is preferably a metal steel plate having a dark-based color. Due to its heat conductivity, the dark metal steel plate can further recover the temporal degradation of the amorphous silicon solar cells.

When installed above the underlaying material and/or substrate material and/or rear material, conventional solar cell modules each having glass on its surface requires an intermediate material such as a chassis between the module and a structure. However, solar cell modules each comprising an amorphous silicon solar cell on a conductive substrate sandwiched between a weatherproof film and a metal steel plate as the back reinforcing material can be directly installed on the underlaying material and/or substrate material and/or the rear material. As a result, when this invention is applied to a roof material, it can provide an excellent solar cell module integrated with the roof material.

The enclosure with solar cells or the solar cell module integrated with a roof material as described herein are not a type for placing on an existing roof but a type which functions as both a roof material and solar cells. Thus, since the solar cell modules can be shaped like conventional roofs and function as roofs, total cost reduction, compatibility and a high degree of freedom in design can be achieved.

In addition, due to the absence of glass in the surface protective material, these solar cell modules are lighter than the other modules. Since these modules do not require an intermediate material such as a chassis, the weight of the roof is reduced, thereby alleviating possible damage caused by an earthquake.

Roof Substrate Material

A roof substrate material (hereinafter simply referred to as "substrate material") used in this invention locks or adheres various roofing materials and does not include an underlaying material for providing water-tightness or a rafter for supporting the substrate material or main house material locking the substrate material. The roof substrate material (substrate material) herein is described below, but the substrate material used in this invention is not limited to the following materials.

In the case of a wooden roof frame, a narrow plate of Japanese cedar or plywood as a substrate material generally called a sheathing roof board is used. In the case of a steel-framed roof frame, generally a hard cemented chip board, a high-pressure cemented excelsior board, or a particle board is generally used. In addition, roofing materials are also used for a concrete roof, and this type of roof uses mortar filled with a light aggregate such as pearlite or hard foaming urethane to which various roofing materials can be nailed. In either case, the roofing materials are generally mounted using nailing, but adhesion execution by asphalt can be carried out when asphalt single or incombustible single is provided on the light mortar substrate material of the roof of a low building.

The substrate material includes a narrow plate of Japanese cedar, a particle board, plywood, a cemented excelsior board, a cemented chip board, or light mortar. Specific examples of the material are shown below but these materials are not limited thereto. The cemented chip board includes a cemented hard chip board, a cemented normal chip board, a cemented chip board, a reinforced cemented chip board, a cemented finish reinforced chip plate, but the cemented hard chip board is mainly used as the roof substrate material. The cemented excelsior board is generally one mixed with wooden fabric or pearlite and press-molded under a high pressure. Commonly used mortar is light mortar formed by mixing cement mortar with obsidian pearlite or hard foaming polyurethane particles to enable nailing.

Roof Underlaying Material

The underlaying material 103 used in this invention is basically used for water-tightness and heat insulation and is situated on the substrate material or the back side of the solar cell module. The roof underlaying material (hereinafter simply referred to as "underlaying material") herein is described below but is not limited to the following materials.

The underlaying material is not particularly limited but is required to be water-tight, weatherproof, and permeable and be capable of controlling humidity conditioning and have thermal insulation. Specifically, the underlaying material includes asphalt-based or modified asphalt-based underlaying material; vinyl chloride-based underlaying material; polyester resin based underlaying material; polystyrene resin-based underlaying material; or polyurethane resin-based underlaying material, but the asphalt-based or modified asphalt-based underlaying material is most suitable due to its water-tightness, workability, permeability, weatherproofness, costs, and heat insulation capability.

Due to their high heat-insulation effect, these underlaying materials relatively increase the temperature between the solar cell module and the underlaying material. Thus, when the solar cell module comprises amorphous silicon, the Staebler-Wronski effect (effect of recovering the degraded performance of the solar cell by heat) can restrain the performance of the solar cell module from being degraded. In particular, it is more preferable that a back reinforcing plate having a dark-based color be provided on the back side of the amorphous silicon solar cell module, because the above effect can be remarkably improved.

Specific examples of the underlaying material are shown below, but this material is not limited thereto. It is possible to use, for example, a thermal insulation material board or water-tight sheet. For example, the thermal insulation material board includes "polystyrene foam (formed like a board)" or "hard polyurethane foam (formed like a board)". The "polystyrene foam (formed like a board)" is classified into primary foaming articles based on continuous extrusion foaming methods (extrusion method polystyrene foam) and secondary foaming articles formed by melting and molding primarily foamed beads (beads method polystyrene foam), depending on the manufacturing method. Available products are, for example, "Kanelite Foam" and "Varilac" manufactured by Kanegafuchi Kagaku Kogyo Corporation; "Styrofoam" manufactured by Dow Chemical Company;

"Mirafoam" manufactured by JSP; and "ESLEN FOAM" manufactured by Sekisui Chemical Industry Inc.

The hard polyurethane foam (formed like a board) is generally a thermal insulation material formed by molding into a board a foam obtained by chemically reacting polyol and isocyanate with a foaming agent. Due to the use of a fleon gas as the foaming agent, the hard polyurethane foam is characterized by its low thermal conductivity and high thermal insulation capability. Specific products are obtained by foaming the resin into a plate of a predetermined thickness between two face members to form a sandwiched shape using the adhesion of urethane resin or by cutting a required shape out from a large block of the resin. Available products are, for example, "Ever Light Panel" and "Ever Light Board" manufactured by Bridgestone Company; "Achilles Board", "Achilles Hynon" manufactured by Achilles Company; "Foam Light" and "Thermax" manufactured by Inoac Corporation; "Crown Panel" Kurashiki Spinning Inc.; "SOFLAN PANEL" manufactured by Toyo Rubber Inc.; and "Iso Band" manufactured by Daido Steel Plate Inc.

In addition, the underlaying material for the roof can be constructed so as to prevent rain water that cannot be removed by the roofing material or roof finish material. For example, a "sheet-like material" or a "foaming plastic product" can be used as the roof underlaying material.

The "sheet-like material" may comprise an "asphalt roofing material" or "synthetic resin".

The "asphalt roofing material" includes an asphalt roofing material and an asphalt felt material, and the former is obtained by impregnating special paper called roofing original paper with straight asphalt and coating blown asphalt on the surface of the paper. Examples of such products that can be used in this invention are "Triple-star Asphalt Roofing" manufactured by Tajima Roofing Inc.; "Asphalt Roofing" manufactured by Shichioh Industry Inc.; and "Asphalt Roofing" manufactured by Nisshin Industry Inc. The latter is obtained by impregnating roofing original paper with straight asphalt. Examples of such products are "Triple-star Asphalt Felt" manufactured by Tajima Roofing Inc.; "Asphalt Felt" manufactured by Shichioh Industry Inc.; and "Asphalt Felt" manufactured by Nisshin Industry Inc.

In addition, the "modified asphalt" is obtained by mixing asphalt with an appropriate amount of synthetic rubber or resin compatible with asphalt to modify the asphalt so as to improve its low-temperature characteristic, high-temperature characteristic, nail hole sealing capability, adhesion, and durability. The modified asphalt is coated on one or both of the surfaces of a synthetic fiber non-woven fabric used as a reinforcing material or is laminated between two fibrous sheets. Products that can be used in this invention include "Under Roof K", "Liner Roofing", "Under GAMRON MG Substrate M", "Under GAMRON MG Substrate F", "Under GAMRON MG Substrate B", and "Home Roof" manufactured by Tajima Roofing Inc.; "Marasan No. 1", "Marasan No. 2", "Marasan Ace", "Bester No. 1", "Bester No. 2", "Marasan ALC", and "Marasan No. 3" manufactured by Shichioh Industry Inc.; "Color House Roof", "Ban Color Roof", "House Roof No. 2", "House Roof No. 3", and "Custom SA" manufactured by Nisshin Industry Inc.; "Yane Roof", "Aqua Cut RR2100", "Aqua Cut SS15R", "Aqua Cut SS201", and "Aqua Cut ZR20T" manufactured by Ube Kosan Inc.; "Super Bird G520" and "Super Bird G220" manufactured by Shizuoka Bitumen Industry Inc.; "Toho GA Roof B-3", "Toho GA Roof B-4", "Toho GA Roof B-5", and "Toho GA Roof B-10" manufactured by Toho Pearlite Inc.; and "MICHELON SHEET 2000" and "MICHELON SHEET 3000" manufactured by Hayakawa Rubber Inc., but are not limited to them.

Furthermore, the "synthetic resin" comprises, for example, polyvinyl chloride, and may be formed into a unitary sheet or may be laminated with other materials (such as craft paper, non-woven fabric, asphalt, coal tar, or asphalt felt).

Specifically, available products are, for example, "Hi Tong Tong", "High Guard", and "Full Best Sheet" manufactured by Matsushita Electric Industry; "Sun Roof King" and "Sun Roof Persimon Board" manufactured by Sun Roof Industry Inc.; "Sun Tack Roof TY" manufactured by Hayakawa Rubber Inc., "TYVEK" manufactured by Du Pont Japan LTD., "Nito Roof", "All-Weather Sheet GR", and "All-Weather Sheet GRA" manufactured by Nitto Denko Corporation; and "DOUTOMI Champion" manufactured by Toto Space Inc.

In addition, the "foaming plastic product" is used to provide thermal insulation, to prevent condensation, and to silence the sound of rain. Available products are, for example, "Mirawoody" manufactured by JSP; "AsFoam II" manufactured by Tajima Roofing Inc.; "BAN MAT No. 1" manufactured by Nisshin Industry Inc.; "FORMNERT PANEL" manufactured by NICHIAS CORPORATION; and "YUKA ROOF" manufactured by Yuka Roof Lnc.

Rear Material

The rear material according to this invention must provide thermal insulation and thermal resistance, must be weatherproof and permeable, and must have a high compression strength. This material is used as a thermal insulation material or a buffer material for enclosures for buildings such as roofs or walls. Structurally, the rear material is located on the underlaying material and/or substrate material or the back surface of the solar cell module.

In view of durability, cost, and workability, the rear material preferably comprises a material selected from polystyrene, polyurethane, vinyl chloride, or asphalt. Specifically, available products are "Kane Light Foam" and "Varilac" manufactured by Kanegafuchi Kagaku Kogyo Corporation; "Styrofoam" manufactured by Dow Chemical Company; "G-FUNEN NEO", "TAIKA-SOFTLON", "SOFTLON SR", and "SOFTLON SK" manufactured by Sekisui Chemical Industry Inc.; "Ever Light-R", "Ever Light-NR", "Ever Light Panel", and "Ever Light Board" manufactured by Bridgestone Company; "Foam Light" and "Thermax" manufactured by Inoac Corporation; "MIRAFIT" and "MIRAFOAM" manufactured by JSP; "Achilles Board" and "Achilles Hynon" manufactured by Achilles Company; "Crown Panel" manufactured by Kurashiki Spinning Inc.; "SOFLAN PANEL" manufactured by Toyo Rubber Inc.; "Iso Band" manufactured by Daido Steel Plate Inc.; "HOUSELON", "DANBUROU", and "Feather Glass" manufactured by Paramount Glass Industry Inc.; "Super Fine" and "House Mat" manufactured by Japan Radio Inc.; "OPABEST" and "TAIKALITE" manufactured by Japan Insulation; "ESLEN BEADS FTR" and "ESLEN FOAM" manufactured by Sekisui Chemical Industry Inc.; "Triple-star Asphalt Felt" manufactured by Tajima Roofing Inc.; "Asphalt Felt" manufactured by Nisshin Industry Inc.; "Under Roof K", "Liner Roofing", "Under Gamron MG Substrate M", "Under Gamron MG Substrate F", "Under Gamron MG Substrate B", and "Home Roof" manufactured by Tajima Roofing Inc.; "Mirawoody" manufactured by JSP; "AsForm II" manufactured by Tajima Roofing Inc.; "BAN MAT No. 1" manufactured by Nisshin Industry Inc.; "FORMNERT PANEL" manufactured by NICHIAS COR- PORATION; and "YUKA ROOF" manufactured by Yuka Roof Inc. The rear material also includes foaming or porous materials such as polystyrene foam, polyethylene foam, hard polyurethane foam, soft polyurethane foam, hard vinyl chloride foam, urea foam, phenol foam, rubber foam, polypropylene, polyethyleneterephthalate, pearlite, vermiculite, and foam glass; fibrous materials such as asbestos, rock wool, glass wool, ceramic fibers, or soft fibrous materials; granular or powdery material such as calcium silicate, basic magnesium carbonate, diatomaceous earth, diatomaceous earth insulating bricks, insulating firebricks, castable fire-and-heat-resisting materials, cork, or carbon powders; a multilayer foil material such as an aluminum foil; foamed rubber materials such as hard foamed rubber and foamed chloroprene rubber; light bubble concrete; and foamed aluminum. The rear material preferably consists of one or more kinds selected from the above materials, but is not limited thereto. Due to its high thermal insulation effect, such a rear material can be provided on the rear side to facilitate the annealing effect in order to prevent performance from being degraded.

Electric Connecting Members

Electric connecting members (1200) electrically connecting the solar cell modules according to this invention preferably include vinyl chloride-based resin as their casing material. Since the electric connecting members installed between the solar cell module and the underlaying material and/or substrate material and/or the rear material is subject to stress such as vibration or bending force of the electric connecting member caused by strong winds or rain, they must be very flexible, and connecting members including vinyl chloride-based resin as their casing material are preferable because of their flexibility.

Due to their flexibility, the electric connecting members including vinyl chloride resin as their casing material can connect adjacent solar cell modules appropriately. The solar cell modules are normally connected by connecting the electric connecting members for the adjacent solar cell modules in a narrow space between the solar cell modules and the underlaying material and/or substrate material and/or the rear material while sequentially installing the solar cell modules. When, however, the electric connecting members are not flexible, the adjacent solar cell modules cannot be connected easily, so the electric connecting members may be pulled too hard and may sometimes disengage from the solar cell modules. When, however, the electric connecting members including vinyl chloride resin as their casing material are used for the solar cell modules, the flexibility of the connecting members serves to prevent such an accident.

In addition, when the solar cell modules are installed above the underlaying material and/or substrate material and/or the rear material, the temperature of the space between the module and these materials necessarily significantly increases due to sunlight. Thus, the electric connecting members located between the solar cell modules and the underlaying material and/or substrate material and/or the rear material preferably has excellent heat dissipation property, and the electric connecting members including vinyl chloride resin as their casing material are preferable because they have this property. Heat dissipation property refers to a characteristic indicating how easily heat is dissipated.

In particular, when the solar cell modules comprise amorphous silicon solar cells and the reinforcing plates of a dark-based color are used as the back reinforcing plates of the amorphous silicon solar cells, the temperature of the modules further increases, so the electric connecting members including vinyl chloride-based resin as their casing material are preferable due to the material's excellent heat dissipation property. Consequently, the casing material of the electric connecting members electrically connecting the solar cell modules most preferably comprises vinyl chloride, but is not limited to this compound. The electric connecting members may also be coated with another heat-resisting material.

Specifically, the electric connecting members including vinyl chloride resin as their casing material are not particularly limited, but the lead of the electric connecting member that can be used as such connecting members include 600-V vinyl insulated wires (IV), 600-V type-II vinyl insulated wires (HIV), outdoor vinyl insulated wires (OW), lead-in vinyl insulated wires (DV·DVF), 600-V vinyl insulated vinyl sheath cable (VV·VVR·VVF), and crosslinked polyethylene insulated vinyl sheath cables (CV).

In addition, connecting members such as connectors may be attached to the tips of the lead. The casing material of the connectors is not particularly limited but may include vinyl chloride, polyethylene resin, polyamide resin, vinylidene fluoride resin, chloroprene rubber, ethylenepropylene rubber, silicone resin, fluorine resin, modified PPO, modified PPE, nylon, polycarbonate, polybutyleneterephthalate, and polypropylene, in view of their heat-resistance, environment and humidity resistance, and workability.

Enclosure

The enclosure according to this invention refers to a structure in which the solar cells can be installed and all its members attached. Specifically, the enclosure may be a roof (including each portion of it such as an eaves, a ridge, or a verge) comprising substrate materials, underlaying materials, roof plates, roof tiles; an external wall; a veranda; a balcony; a car port; a sound insulating wall; a structure in which the solar cell modules can be installed and its members attached, but is preferably a roof in view of the need to utilize sunlight.

Non-contact Space

The non-contact space between the electric connecting members and the underlaying material and/or substrate material and/or rear material according to this invention refers to a physical spatial arrangement in which the electric connecting members are not physically in direct contact with the underlaying material and/or substrate material and/or rear material.

Specifically, the non-contact space may be an arrangement in which the electric connecting members are held in the air so as not to physically contact the underlaying material and/or substrate material and/or rear material, an arrangement in which a part of the rear material corresponding to the location of the wiring path for the electric connecting members is cut out to provide a space so that the connecting members do not physically contact the material, or an arrangement in which a plurality of rear materials are provided on the solar cell module except for the position of the wiring path for the electric connecting members.

Non-contact Means

The non-contact means for the electric connecting members and the underlaying material and/or substrate material and/or rear material according to this invention refers to a physical means for preventing the electric connecting members from physically directly contacting the underlaying material and/or substrate material and/or rear material.

Specifically, this means may include a method of covering the electric connecting members with "tubes"; a method of laying "films" or "sheets" between the electric connecting members and the underlaying material and/or substrate material and/or rear material; a method of winding a "tape" around the electric connecting members or the underlaying material and/or substrate material and/or rear material; a method of installing an "electric path supporting material" in the electric connecting member path between the electric connecting members and the underlaying material and/or substrate material and/or rear material; a method of providing a "wiring binding device" on the back side of the solar cell module to support the electric connecting member; a method of applying a "paint" to the electric connecting members or the underlaying material and/or substrate material and/or rear material; and a method of applying an "adhesive or a pressure sensitive adhesive" to the electric connecting members or the underlaying material and/or substrate material and/or rear material.

Tube

The non-contact means located between the electric connecting members or the underlaying material and/or substrate material and/or rear material may comprise a tube according to this invention. The tube that can be used in this invention comprises a material having heat resistance, oil resistance, and chemical resistance except for vinyl chloride resin, asphalt resin, polyurethane resin, and polystyrene resin. In view of these points, the tube preferably consists of one or more materials selected from crosslinked polyethylene, polyolefin, nylon, fluorine resin, silicone resin, ethylenepropylene rubber, nitrilebutadiene rubber, steel, stainless steel, and aluminum. When the interconnections of the solar cell modules are taken into account, the tube more preferably has a retractable bellows mechanism or is spiral. In addition, thermally contracting tubes may be used that contract when heated for a specified period of time.

Specifically, the tube includes a "steel conduit tube" that is used for general electrical work and shown in JIS C 8305, a "hard vinyl conduit tube" that is shown in JIS C8430, a "synthetic-resin flexible conduit tube" that is defined in JIS C8411, and a "metal flexible conduit tube" according to JIS C 8309. The "synthetic-resin flexible conduit tube" includes PF and CD tubes. The PF tube is represented by a double tube comprising a hard corrugated polyethylene or polypropylene tube covered with soft incombustible vinyl, and the CD tube is a single hard corrugated polyethylene or polypropylene tube that is not incombustible. For example, "Pana Fleki", "Pana Fleki Ace", "Pana Fleki CD", "No-screw Conduit Tube E", "Conduit Tube White", "Mecha Fleki", "High Flex White", "High Flex White PVC", "No-screw Polyethy Lining Steel Tube", and "Polyethy Lining Steel Tube" manufactured by Matsushita Electric Works Ltd.; and "Fujiflex" and "Fuji Duct" manufactured by Fujikura Inc. can be used depending on the purpose.

Other available tubes include "Silicone Rubber Tube", "Heat-resistant Silicone Rubber Tube", "Ultra-heat-resistant Silicone Rubber Tube", "Reinforced Silicone Rubber Tube", "Incombustible Silicone Rubber Tube", "Silicone Rubber Glass Braided Tube", "Glass Braided Silicone Rubber Extruded Tube", "Silicone Varnished Glass Braided Tube", "Fluorine Resin Tube", "Piping Tube", "Fluorine Resin Glass Braided Tube", "Fluorine Resin Metal Braided Tube", "Fluorine Resin Curled Tube", "Fluorine Rubber Tube", and "Fluorine type Thermoplastic Elastomer Tube" manufactured by Nissei Electric Inc.; and "Nitfron Tube" manufactured by Nitto Denko Corporation, as well as thermally contracting tubes such as "Silicone Rubber Thermally-contracting Tube" and "Fluorine Resin Thermally-contracting Tube" manufactured by Nitto Denko Corporation; "Sumi Tube" manufactured by Sumitomo Electric Industry Inc.; "Nishi Tube" manufactured by Nishinihon Wire Inc.; "F Tube" manufactured by Fujikura Inc.; "Tere Tube" manufactured by Teijin Inc.; "Thermally-contracting Rubber Tube" manufactured by Shinetsu Chemical Industry Inc.; and "Nitfron Thermally-contracting Tube" manufactured by Nitto Denko Corporation.

Film and Sheet

According to this invention, a film or sheet can be used as a non-contact means located between the electric connecting members and the underlaying material and/or substrate material and/or rear material. The film may be wound around the electric connecting members, may be laid on the underlaying material and/or substrate material and/or rear material, or may be sandwiched between the electric connecting members and the underlaying material and/or substrate material and/or rear material.

The film or sheet that can be used in this invention comprises a material having heat resistance, oil resistance and chemical resistance except for vinyl chloride-based resin, asphalt-based resin, polyurethane-based resin and polystyrene-based resin. In view of these points, the film or sheet preferably consists of one or more materials selected from polyolefin, polyvinyl alcohol, fluorine resin, cellulose, polycarbonate, polyester, polyamide, stainless steel, and aluminum. Specifically, available films or sheets include "Surface Protective Sheet Sumiron E Series" and "Sumiron VE·DE Series" manufactured by Sumiron Inc.

Tape

According to this invention, a tape can be used as a non-contact means located between the electric connecting members and the underlaying material and/or substrate material and/or rear material. The tape may be wound around the electric connecting members or may be laid on the underlaying material and/or substrate material and/or rear material.

The tape that can be used in this invention comprises a material having heat resistance, oil resistance and chemical resistance except for vinyl chloride-based resin, asphalt-based resin, polyurethane-based resin and polystyrene-based resin. In view of these points, the tape preferably consists of one or more materials selected from polyester, polyimide, polyphenylene sulfide, paper, cloth, polyolefin, polyvinyl alcohol, fluorine resin, cellulose, polycarbonate, polyamide, silicone rubber, stainless steel, and aluminum. The substrate material of the tape may be a foam that is preferably capable of self-welding.

Specifically, available products are "Polyester Adhesive Tape", "Polyimide Adhesive Tape", "PPS Adhesive Tape", "Nomex Adhesive Tape", "Acetate Cloth Adhesive Tape", "Composite Adhesive Tape", "Glass Cloth Adhesive Tape", "Cotton Adhesive Tape", "Paper Adhesive Tape", "Cloth Adhesive Tape", "Vinyl Adhesive Tape", "Ept Sealer", and "Anti-corrosive Tape" manufactured by Nitto Denko Corporation but are not limited thereto.

Electric Path Supporting Material

According to this invention, an electric path supporting material can be used as a non-contact means located between the electric covering members and the underlaying material and/or substrate material and/or rear material.

The electric path supporting material that can be used in this invention comprises a material having heat resistance, oil resistance and chemical resistance except for vinyl chloride-based resin, asphalt-based resin, polyurethane-based resin and polystyrene-based resin. In view of these points, the electric path supporting material consists of one or more substrate materials selected from nylon, ABS resin, polycarbonate, stainless steel, aluminum, and melted-zinc-plated steel. This material preferably has a structure that can be fixed using a pressure sensitive adhesive tape as required.

Specifically, available products are "Cable Rack", "E Hanger", "Lace Way", "Metal Duct", "Metal Mall", and "Metal Wipro" manufactured by Matsushita Electric Works Ltd.; and "Cutting Duct", "Miniature Duct", and "UD Protector" manufactured by Shinagawa Commerce and Industry Inc.

Wiring Binding Device

According to this invention, a wiring binding device can be used as a non-contact means located between the electric covering members and the underlaying material and/or substrate material and/or rear material.

The wiring binding device is used to bind the electric connecting members together.

The wiring binding device that can be used in this invention comprises a material having heat resistance, oil resistance and chemical resistance except for vinyl chloride-based resin, asphalt-based resin, polyurethane-based resin and polystyrene-based resin. In view of these points, the wiring binding device preferably consists of one or more materials selected from polyolefin, fluorine resin, polycarbonate, zinc-plated steel, stainless steel, and aluminum. This material can preferably be fixed to the solar cell module or frame as required.

Specifically, available products are "Tie Wrap", "Insulok Tie", "Twist Band", "Wire Clamp", "Wire Clip", "COATING CLIP", and "PITAK" manufactured by Shinagawa Commerce and Industry Inc.

Paint

According to this invention, a paint can be used as a non-contact means located between the electric covering members and the underlaying material and/or substrate material and/or rear material. The paint that can be used in this invention is not particularly limited, but vinyl chloride resin primer is preferably applied to improve the adhesion to vinyl chloride resin. In addition, the application method includes brushing and dipping, but is not limited thereto.

Adhesive and Pressure Sensitive Adhesive

According to this invention, an adhesive or a pressure sensitive adhesive used to fix the electric connecting members together can be used as a non-contact means located between the electric covering members and the underlaying material and/or substrate material and/or rear material. The adhesive or pressure sensitive adhesive is not particularly limited, but preferably comprises epoxy-based resin or a silicone-based adhesive sealing compound that has a high insulating function. When flexibility is taken into account, silicone based resin is more preferable. Furthermore, when operability is taken into account, the adhesive preferably has a short curing time and a viscosity that is not too low. The viscosity is preferably 300 poise or more.

Available epoxy resin adhesives manufactured by Three Bond Co, Ltd. include, for example, "2001", "2002H", "2003", "2016B", and "2022" (trade names), and such an epoxy resin can be mixed with a curing agent such as "2102B", "2103", "2104", "2105F", "2105C", "2106", "2131B", "2131D", "2131F", or "2163" (trade names) at a predetermined ratio.

In addition, available epoxy resins manufactured by Sumitomo 3M Ltd. include "EW-2" (one-liquid type), "S/W-2214" (one-liquid type), "XA7416" (one-liquid type), "JA7437" (one-liquid type), "1838B/A" (two-liquid type; the mixing ratio of a substrate agent to a curing agent=4:5), "S/W-2216B/A", "DP-100" (1:1), "DP-110" (1:1), "DP-190" (1:1), "DP-PURE60" (1:1), and "DP-270" (1:1).

In addition, available epoxy resins manufactured by Yuka Shell Epoxy K. K. include substrate agents "Epikote" 812, 815, 827, 828, and 834, and the curing agent can be selected as required. Available silicone adhesive sealing compounds include "1220" and "1230" manufactured by Three Bond Co, Ltd.; "SE9156", "SE9157", "SE9166", "SE9176", "SE9185", "SE9186", "SE9186L", "SE9187", "SE1811", "SE1740" (two-liquid type), "SE1821" (two-liquid type), "CY52-005" (two-liquid type), "SH780", "SH781", "SH790", "SH794" (two-liquid type), "SE5010", "SE777", "SE555", "SE792" (two-liquid type), "SE794" (two-liquid type), "SE9090", "SE796" (two-liquid type), "SE797" (two-liquid type), "SE798", "SE9500", "SE5080", "SE5081", "SE5002", "SE5003", "SE5004", "SE5006", "SE5022", and "SE5085" manufactured by Toray Dow Corning Silicone Inc.; "SILASTIC 739 RTV", "SILASTIC 738 RTV", "3140 RTV", and "3145 RTV" manufactured by Dow Corning Corporation; "KE42", "KE41", "KE420", "KE45", "KE44", "KE4525", "KE40", "KE402", "KE348", "KE347", "KE3490", "KE3494", "KE4897", "KE4896", "KE4895", "KE4890", "KE4866", "KE4805", "KE66" (two-liquid type), and "KE67" (two-liquid type) manufactured by Shinetsu Chemical Industry Inc.; "TSE385", "TSE392", "TSE397", "TSE3971", "TSE3972", "TSE3940", "TSE3941", "TSE3663" (two-liquid type), "TSE382", "TSE3826", "TSE384-B", "TSE3843-W", "TSE387", "TSE3876", "TSE388", "TSE3886", and "TSE370" manufactured by Toshiba Silicone Inc.

Power Conversion Apparatus

A power conversion apparatus connected to the solar cell modules according to this invention to constitute a sunlight power generating system comprises a DC/DC converter or a self-excited DC/AC inverter that use a self-arc-extinguishing switching device such as a power transistor, a power MOSFET, an IGBT, or a GTO. The power conversion apparatus controls a current tide, an I/O voltage, and an output frequency by controlling the turn-on and -off of a gate path.

This invention is described below in detail with reference to the examples, but is not limited thereto.

Example 1

This example is the example of using a tube as the non-contact means. Solar cell modules were obtained by producing amorphous silicon solar cell elements on a stainless steel substrate, connecting the elements in series, providing a galbarium steel plate on the back surfaces of the elements, and sealing them with a weatherproof resin. The solar cell modules were then bent to form a ribbed seam roofing-like shape and two of them were installed on the various underlaying material and/or substrate material via a space. This is described below in detail.

First, a procedure for producing an amorphous silicon solar cell element (300) is described with reference to FIGS. 2 and 3. The sputtering method was used to form an Al layer containing 1% of Si (back-surface reflecting layer 302) with the thickness of 5,000 Å on a long roll-like stainless-steel substrate (electroconductive substrate 301) 0.1 mm thick that had been cleaned. Then, n-, i-, and p-type amorphous silicon semiconductor layers (semiconductor layer 303) were formed so as to have thicknesses of 300 Å, 4,000 Å, and 100 Å, respectively, using the plasma CVD method and using a gas of $PH_3$, $SiH_4$, and $H_2$ for the n-type semiconductor, a gas of $SiH_4$ and $H_2$ for the i-type semiconductor, and a gas of $B_2H_6$, $SiH_4$, and $H_2$ for the p-type semiconductor.

Subsequently, an ITO (transparent conductive layer 304) of thickness 800 Å was formed by resistance heating evaporation to form an amorphous silicon solar cell element. Then, a press machine was used to punch the long solar cell element produced as described above into the shape shown in FIG. 3 to produce a plurality of solar cell strips 400. In part of the cut surface of the solar cell strip 400 cut by the press machine, the solar cell strip 400 was crushed to short-circuit the ITO electrode and the stainless steel substrate.

Figure 2:
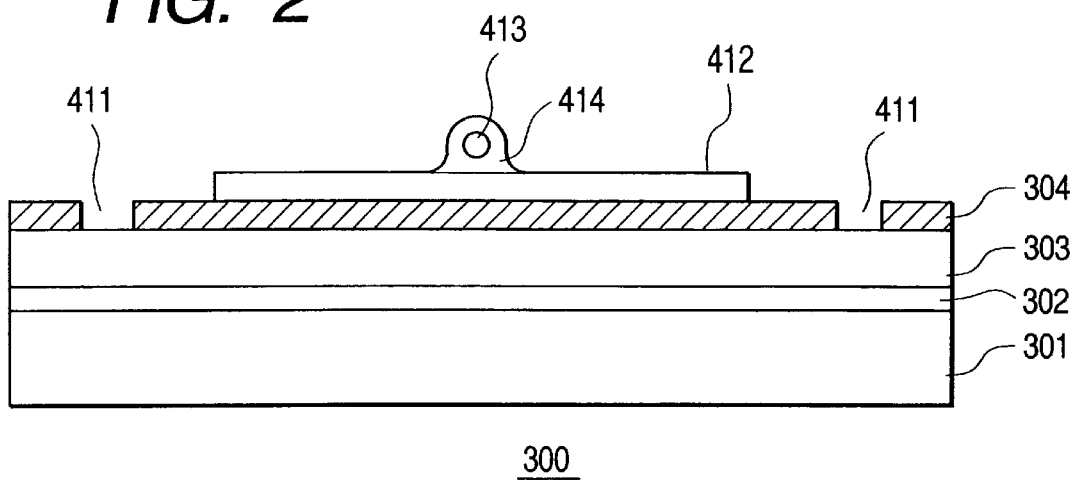
FIG. 2 is a schematic sectional view showing an example of a configuration of a solar cell element applicable to this invention.
Figure 3:
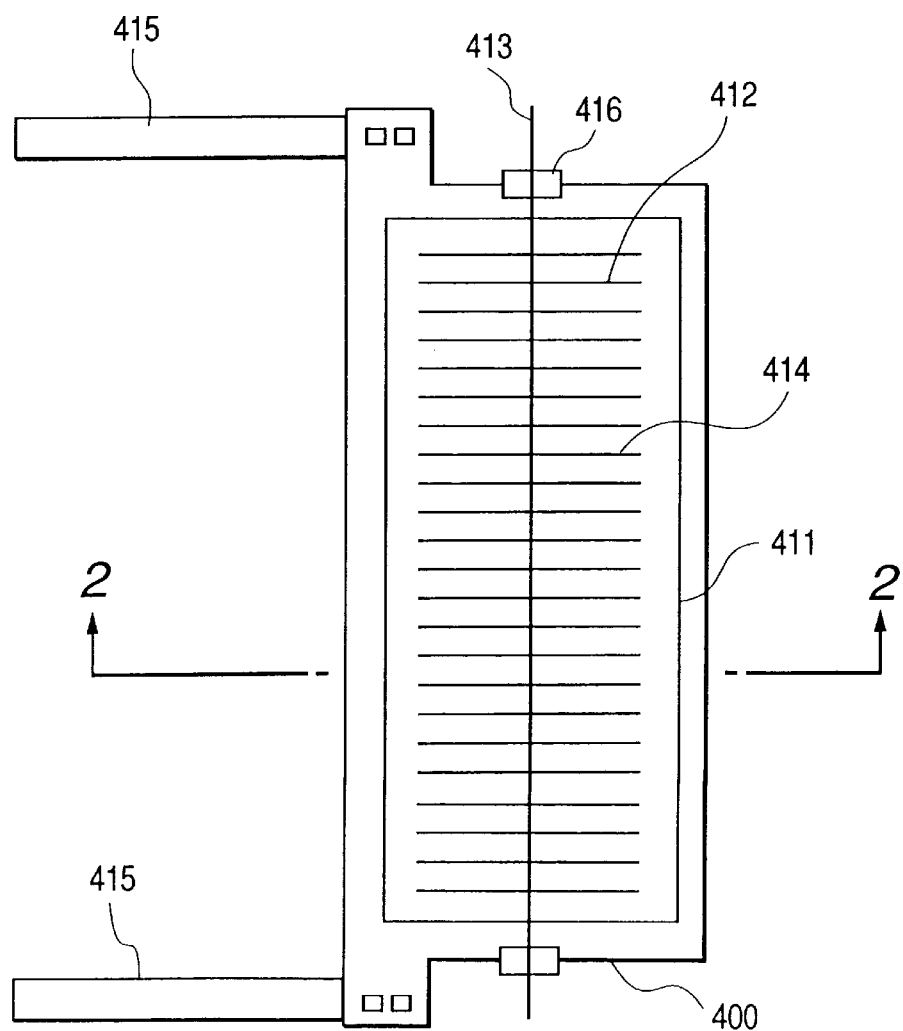
FIG. 3 is a schematic plan view of the solar cell element.
Figure 4:
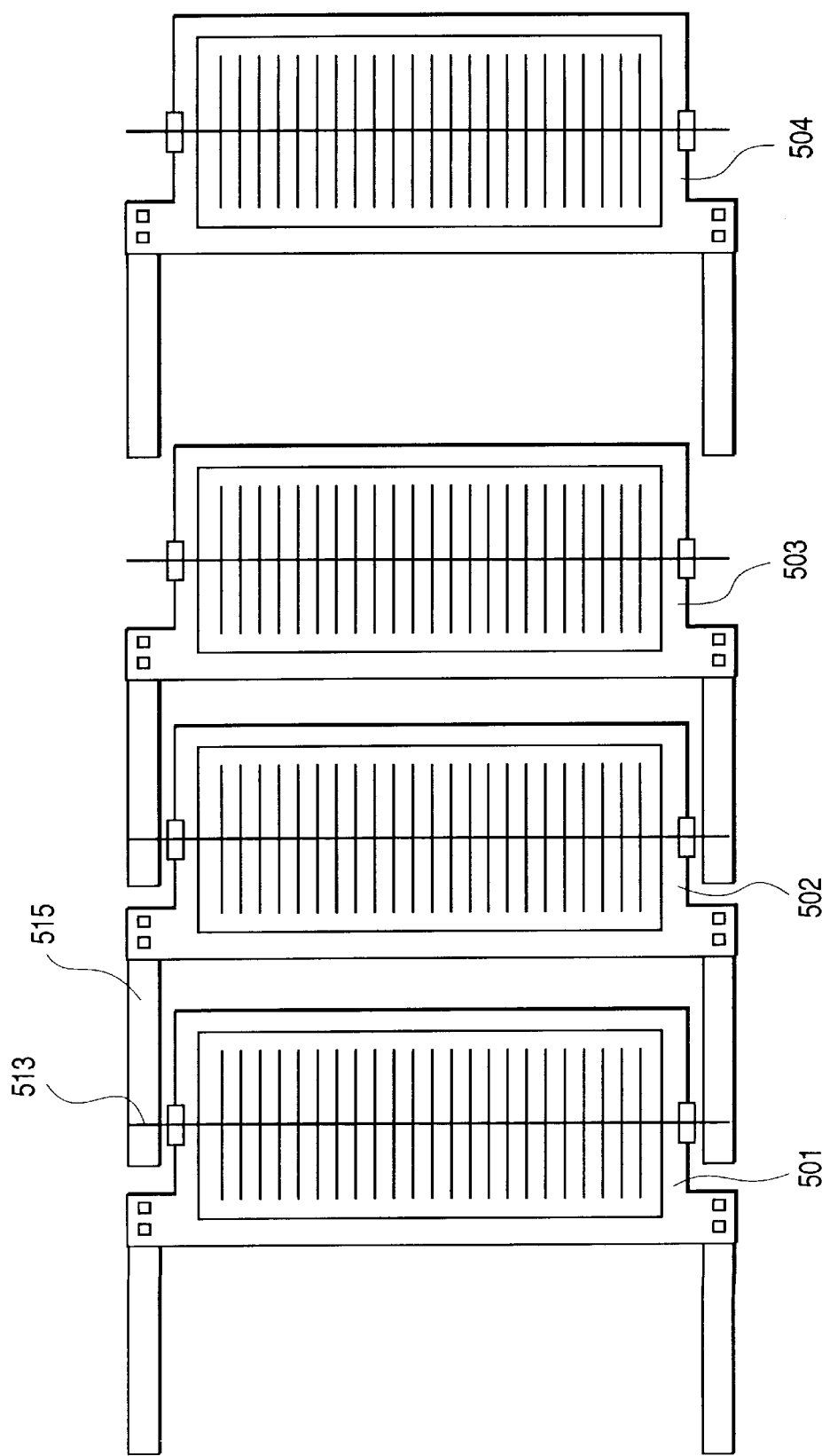
FIG. 4 is a schematic plan view showing an example in which the solar cell element as shown in FIG. 3 is provided in plurality.

Then, to repair this short circuit, an element separating portion 411 was provided on the periphery of the ITO electrode of each solar cell element, as shown in FIGS. 2 and 3, by removing the periphery of the ITO electrode. This removal was specifically executed as follows. An etching agent ($FeCl_3$ solution) that dissolves the ITO but that does not dissolve amorphous silicon semiconductor was screen-printed on the periphery of the ITO slightly inward from the cut surface of each solar cell strip 400. Then, the ITO was dissolved, and the strip was then washed with water to form the element separating portion 411 for the ITO electrode.

Then, silver paste including polyester resin as a binder ("5007" manufactured by Du Pont Company) was formed as a collecting grid electrode 412 on the ITO, by screen printing. Then, a tin-plated copper wire 413 for acting as a collecting electrode of the grid electrode 412 was arranged perpendicular to the grid electrode 412. Subsequently, as an adhesive silver ink 414, "C-220" manufactured by EMERSON & CUMING, INC. was dropped onto the intersection of the tin-plated copper wire 413 and the grid electrode 412 and was then dried at 150° C. for thirty minutes to connect the grid electrode 412 to the tin-plated copper wire 413. In this case, to prevent the tin-plated copper wire 413 from contacting the end surface of the stainless steel substrate, a polyimide tape 416 was stuck between the end surface of the substrate and the tin-plated copper wire 413.

Then, the ITO layer/a-Si layer on a part of the non-power-generating area of the solar cell strip consisting of the amorphous silicon solar cell element was removed using a grinder to expose the stainless steel substrate, and a copper foil 415 was then welded to the exposed portion using a spot welder. Then, a tin-plated copper wire 513 of a solar cell strip 501 and a copper foil 515 of a solar cell strip 502 were soldered together to connect the strips in series. Similarly, the tin-plated copper wire 513 and copper foil 515 of adjacent solar cell strips were soldered together to connect the strips 501, 502, 503, and 504 in series.

Plus and minus terminal portions for drawing electricity out from the solar cell are formed on the back surface of the solar cell in such a way as to be close to one another.

Figure 5:
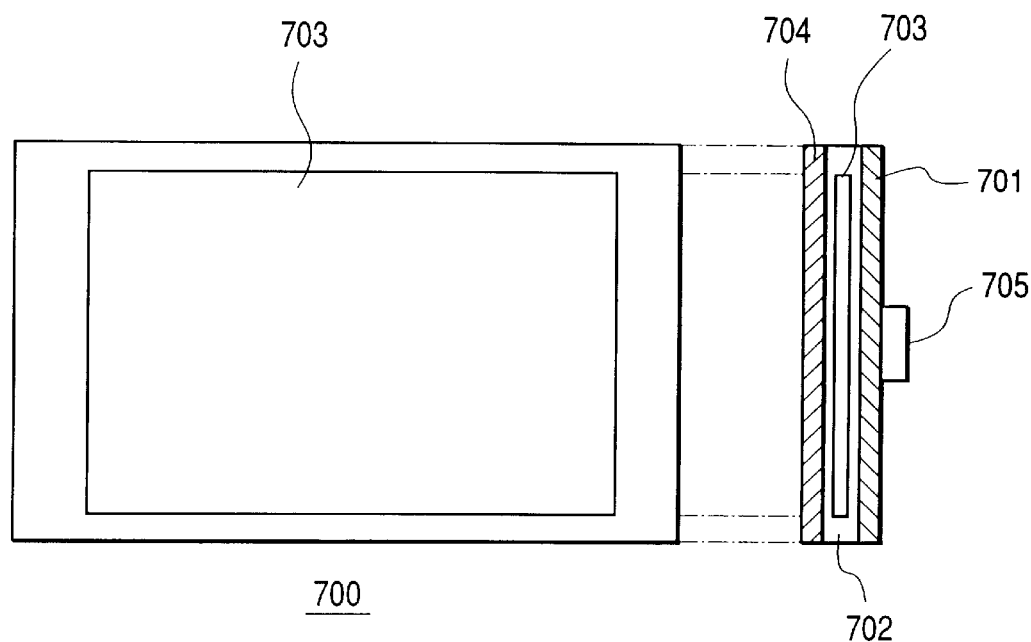
FIG. 5 is a schematic view showing a configuration of a solar cell module.

Then, as shown in FIG. 5, a galbarium steel plate 701 of 0.8 mm thickness, an EVA 702, series-connected solar cell elements 703, an EVA 702, and a fluorine resin film 704 consisting of the non-stretching ethylene-tetraethylene copolymer fluorine resin film of 50 μ thickness "Aflex (manufactured by Asahi Glass Co., Ltd.)" were sequentially stacked in this order, and a vacuum laminator was used to melt the EVAs at 150° C. to produce a solar cell module 700.

Two holes were previously opened in the galbarium steel plate 701 at close positions to allow terminals to be drawn out. The adhering surface of the fluorine resin film 704 was subjected to plasma processing beforehand in order to improve the adhesion between the film 704 and the EVA 702. Each of series-connected solar cell elements 703 was smaller in size than the galbarium steel plate on the back side of the element and fluorine resin film 704 in order to bend the ends of the solar cell module 700 during the subsequent step. Furthermore, the fluorine resin film 704 used in this example had a tensile elongation percentage of 250% or more. Reference numeral 705 designates a terminal draw-out box.

Figure 6:
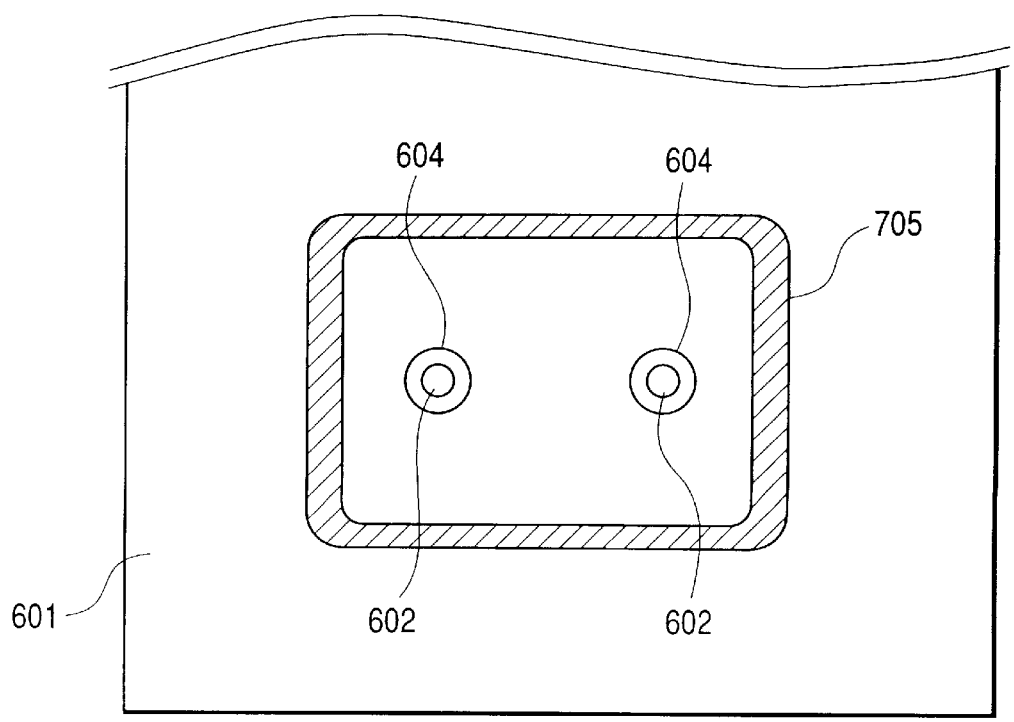
FIG. 6 is a schematic sectional view showing the periphery of a terminal output box.

Then, as shown in FIG. 6, plus and minus terminal wires 602 were exposed from two terminal draw-out holes 604 opened in the galbarium steel plate 601 on the back surface of the solar cell module, and the single terminal draw-out box 705 was mounted on the galbarium steel plate 601 using silicon resin in such a way as to cover the two terminal draw-out holes.

The terminal draw-out box 705 had a hole through which an electric connecting member was passed to electrically connect the solar cell modules. A silicone packing was integrated in this hole to prevent moisture from infiltrating between the electric connecting member such as a cable and the terminal draw-out box 605.

Figure 7:
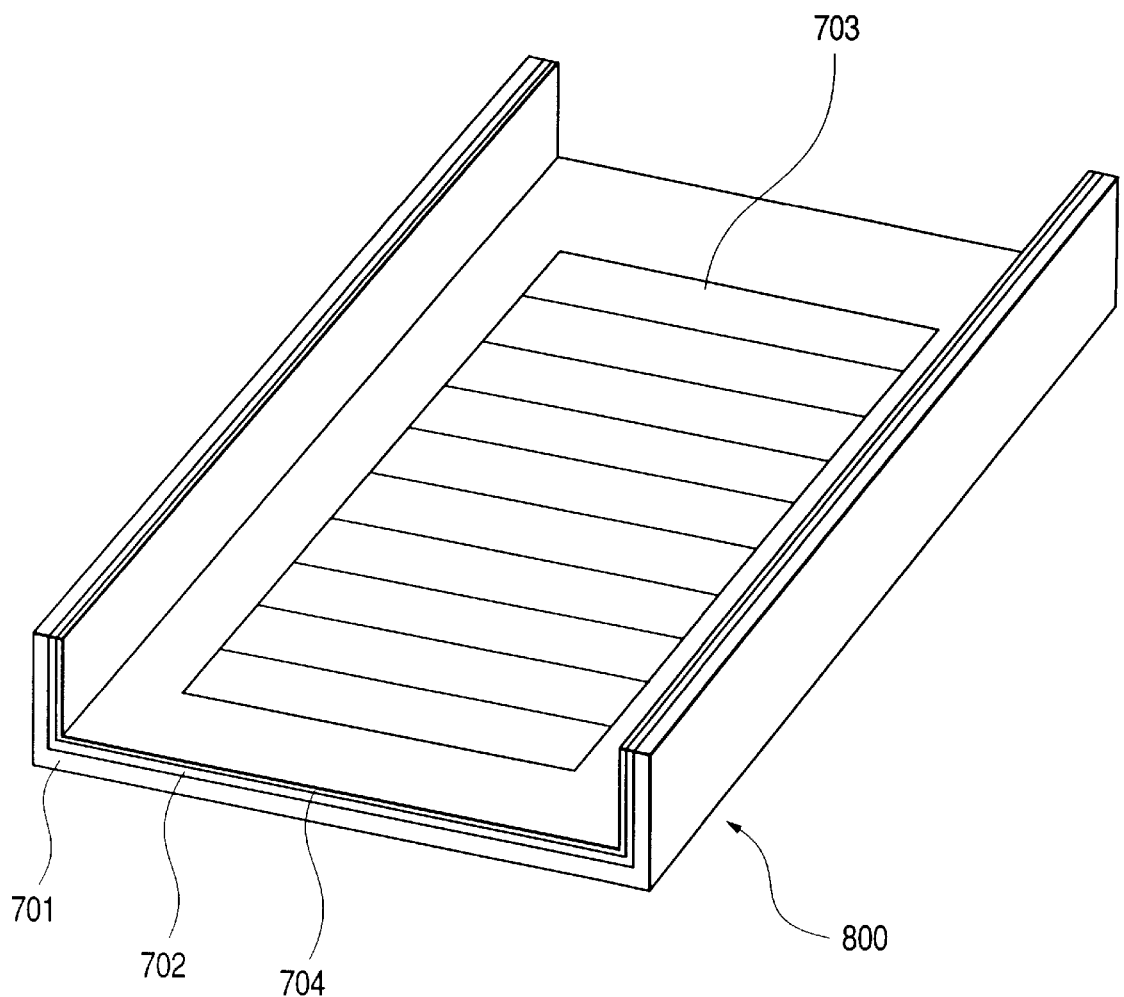
FIGS. 7, 17, 22, 25 and 31 are schematic perspective views illustrating an example of an aspect of the solar cell module.

Then, as shown in FIG. 7, a bending machine was used to bend the ends of the solar cell module upward to obtain a working width of 420 mm.

That is, according to this invention, one of the two sets of opposed sides, that is, the long sides are bent in the same direction to shape the module like a trough. The bent direction of the sides is on the light incidence side of the solar cell, as shown in FIG. 7.

A ribbed seam-type solar cell enclosure installation method according to this invention is described below. As shown in FIG. 8, an asphalt roofing material acting as an underlaying material 802 was laid on a roof board 801 acting as a substrate material and comprising water-tight plywood of 12 mm thickness and was then fixed using a tacker 803. Subsequently, a set-out operation is performed using a pitch of 455 mm, and three spacer steel materials 804 were fastened to the underlaying material (and the substrate material) 802 at the set-out positions using a drill machine screw 805, as shown in FIG. 9.

Figure 10:
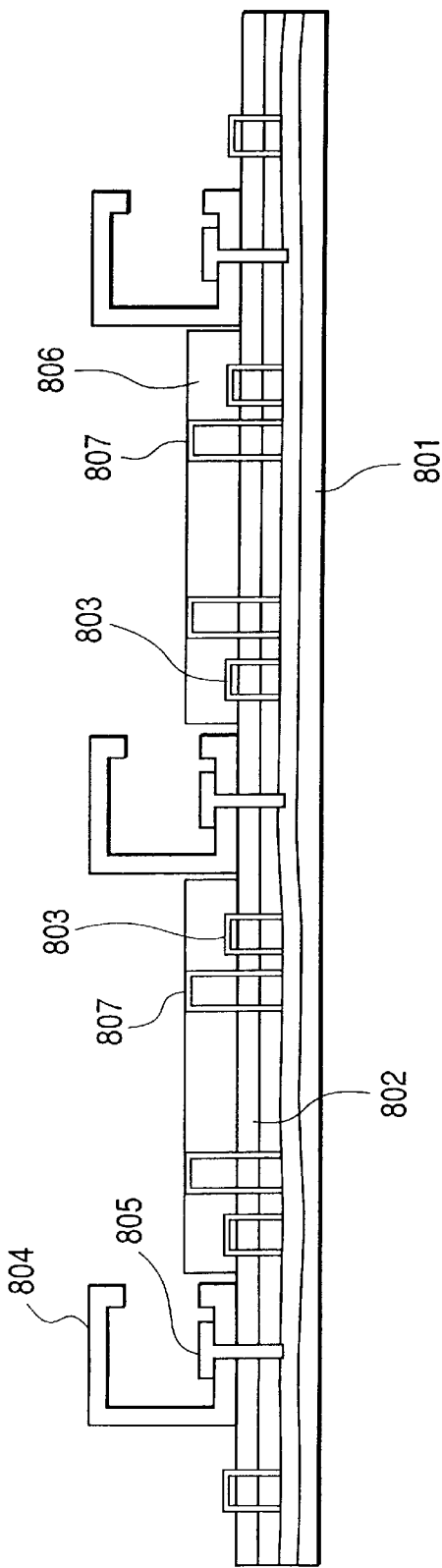
Figure 11:
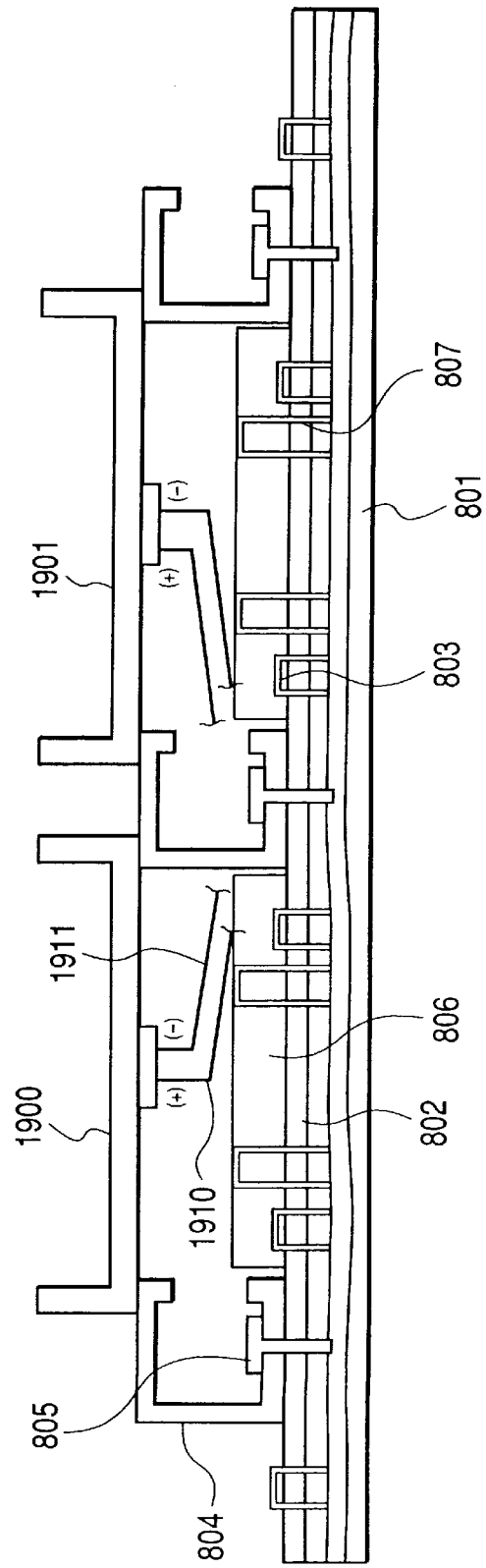

Subsequently, a rear material 806 of 15 mm thickness and 400 mm width was located between the spacer steel materials 804 and then fixed using a tacker 807, as shown in FIG. 10. Then, two solar cell modules 1900 and 1901 were placed on the spacer steel materials 804 from the right end, as shown in FIG. 11.

Subsequently, as shown in FIGS. 12A and 12B, the plus side of the solar cell module 1900 was connected to the minus side of the solar cell module 1901 using an electric connecting member 1910, while the plus side of the solar cell module 1901 was connected to the minus side of the solar cell module 1900 using an electric connecting member 1911, thereby connecting the two modules in series. Prior to the connection, however, the electric connecting members 1910 and 1911 of the same length were passed through a polyolefin tube 1912 and after the connection, the "tube" was located as a non-contact means in a region where the electric connecting member contacted the rear material, thereby preventing the electric connecting member from contacting the rear material.

Figure 13:
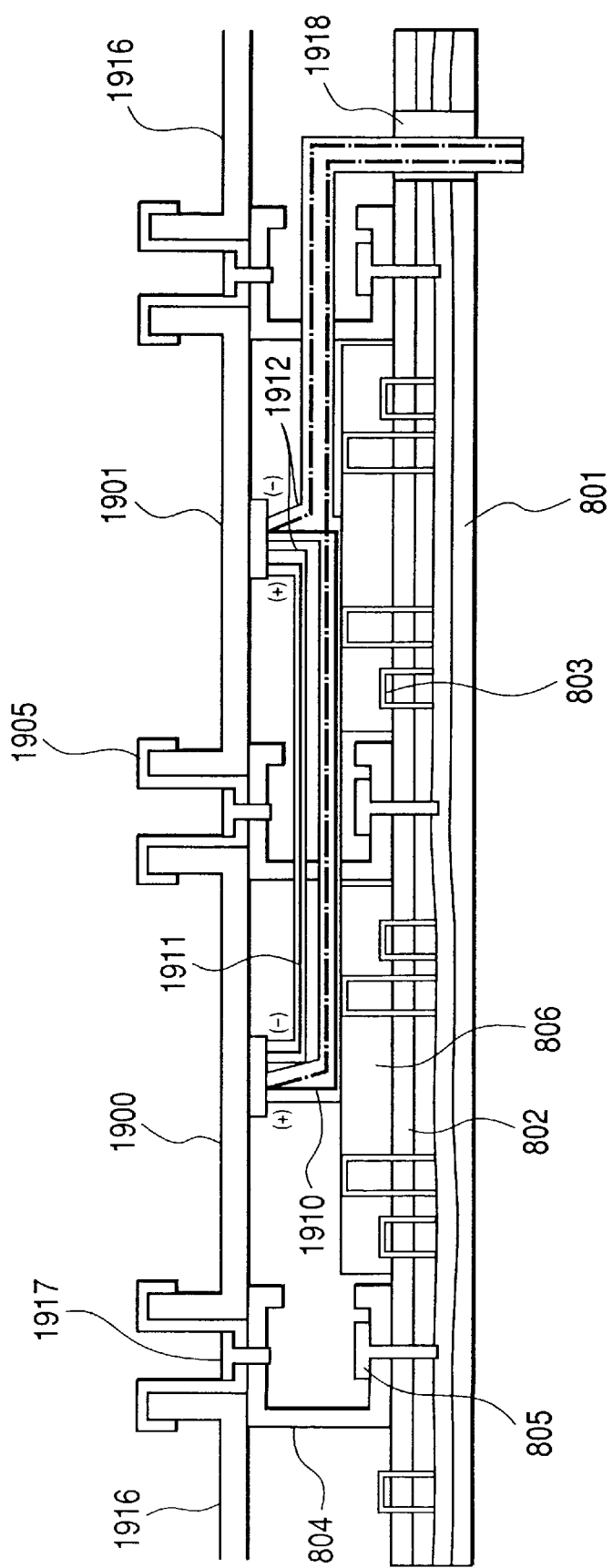

Subsequently, as shown in FIG. 13, dummy modules 1916 were placed at the respective ends, and suspension devices 1905 were fitted to the bent portions of the two solar cell modules 1900 and 1901 sequentially from the end and then tightened and fixed to the spacer steel materials 1904 using drill machine screws 1917. The electric connecting member was then drawn to the back side of the roof board through a through-hole 1918 opened in the underlaying material and substrate material. The electric connecting members drawn into the house were collected in the collecting box and then connected to a power conversion apparatus for carrying out conversion to an AC current.

Figure 14:
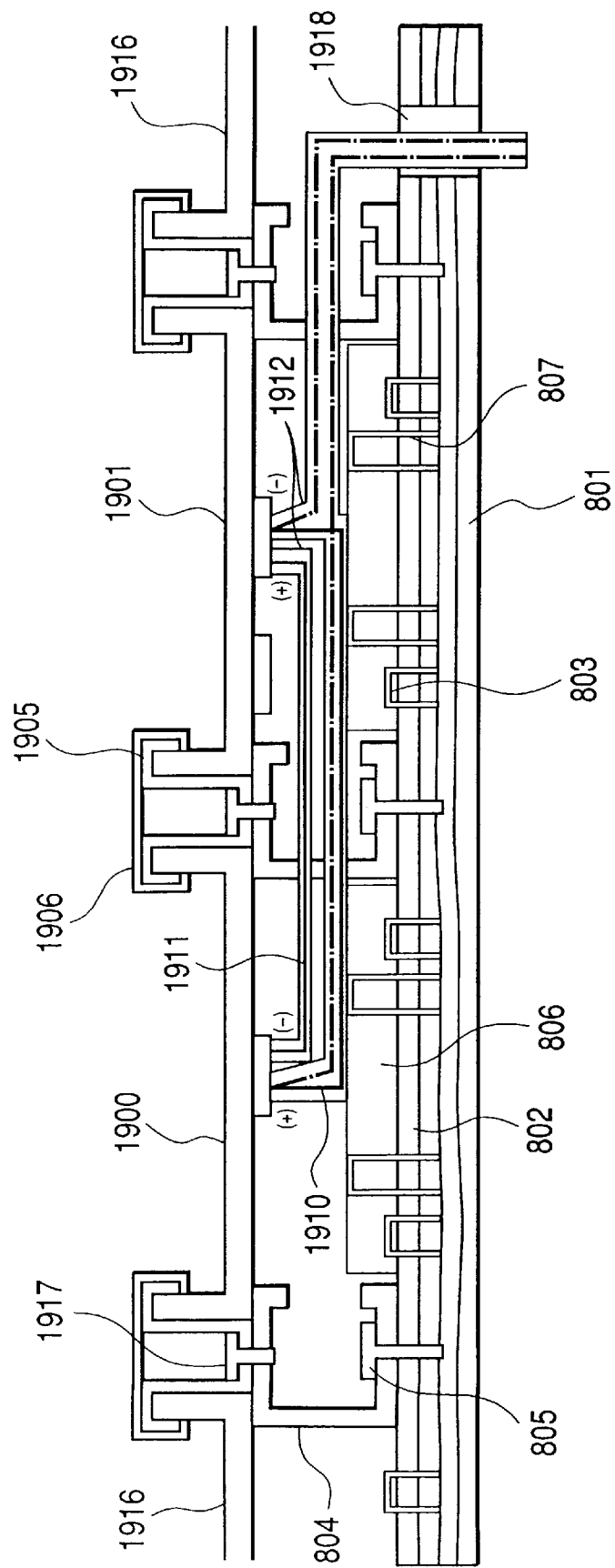

Finally, as shown in FIG. 14, a cover member 1906 was fitted on the top of the suspension device 1905 to produce a ribbed seam roof-type solar cell enclosure in which the ribbed seam-type solar cell modules 100 were installed as shown in FIG. 1B.

Verification 1

This verification used the enclosure according to Example 1, provided that in the terminal box 705, a load resistor was connected between the rear wiring material on the plus side of the solar cell module 1900 and the connection of the electric connecting member 1910, and the solar cells operated at an operating point close to an optimal one. Subsequently, as shown in FIG. 13, the dummy modules 1916 were located at the respective ends, the suspension devices 1905 were fitted to the bent portions of the two solar cell modules 1900 and 1901 sequentially from the end and then tightened and fixed to the spacer steel materials 1904 using the drill machine screws 1917. Finally, as shown in FIG. 14, the cover member 1906 was fitted on the top of the suspension device 1905 to produce a ribbed seam roof type solar cell enclosure in which the two ribbed seam type solar cell modules 1900 and 1901 were installed. Then, the polyolefin tube was evaluated while changing the electric connecting members and the rear materials.

Figure 15:
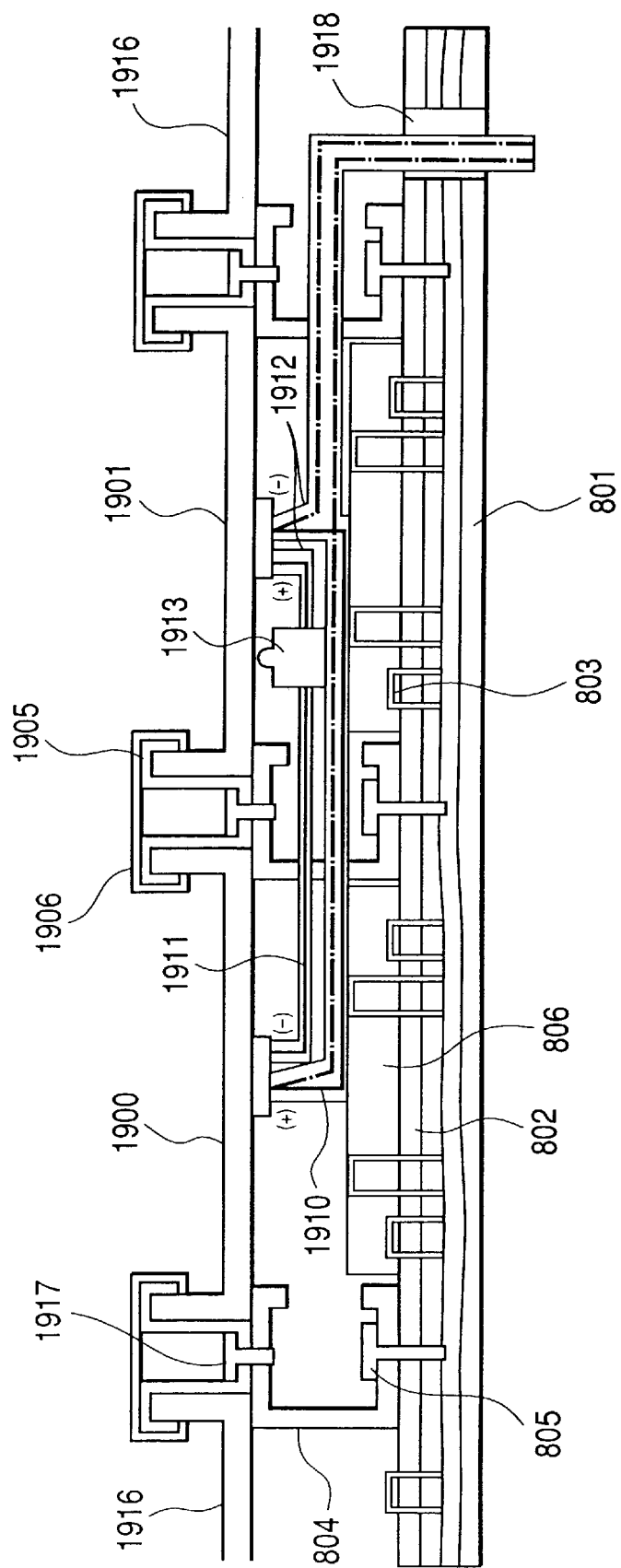
FIG. 15 is a schematic sectional view illustrating a test method for the example shown in FIG. 14.

In this verification, to ensure that the electric connecting member 1910 contacted the rear material 1907, a weight 1913 was placed on the electric connecting member 1910, as shown in FIG. 15. In this condition, an acceleration test was conducted in which the solar cell modules were assumed to be exposed to sunlight or winds or rain outdoors, for example, on the roof over a long period of time.

The acceleration test was conducted as follows.

1. The solar cell enclosure installed on the rear material was irradiated with light under the light condition of 1 SUN for 1,000 hours to spur the initial degradation of the solar cells in order to stabilize the performance of the solar cell cells.
2. Measure the initial outputs from the solar cell modules.
3. The solar cell enclosure was left in a hot and humid chamber at a temperature of 85° C. and a humidity of 85% for 500 hours.
4. Remove the weights and then the solar cell modules 1900 and 1901 from the spacer steel materials 1904.
5. The electric connecting member 1910 was wound 10,000 times around a cylinder of diameter 20 mm.
6. The enclosure was left in a sunshine Weather-Ometer for 3,000 hours.
7. The outputs from the solar cell modules were measured after the acceleration test.

The output holding rate of the solar cell is defined as the rate of those outputs from the solar cell modules which are held after the acceleration test relative to the outputs from the solar cell modules prior to the test.

In the above acceleration test, the output holding rate of the solar cell was measured by using the "polyolefin tube 1912" in some cases while not using it in the other cases, and varying the material of the "rear material 1907".

Specifically, "600-V Crosslinked Polyethylene Insulated Vinyl Sheath Power Cable (600 V CV) consisting of plus and minus conductors of the same length each having a 2 $mM^2$ cross-section (the exterior (sheath) consisted of vinyl chloride and the interior (insulator) consisted of crosslinked polyethylene) was used as the electric connecting member, "Sumi Tube" was used as the polyolefin tube, and rear materials such as of polystyrene, polyurethane, vinyl chloride and asphalt were arbitrarily combined together.

"Kane Light Foam" manufactured by Kanegafuchi Chemical Industry Inc. was used as the polystyrene rear material, "Achilles Board" manufactured by Achilles Company was used as the polyurethane rear material, "Hi Tong Tong" manufactured by Matsushita Electric Industry Inc. was used as the vinyl chloride rear material, and "Liner Roofing" was used as the asphalt rear material.

The results are shown in Table 1.

When the non-contact means was not used and the rear material comprised polystyrene, polyurethane, vinyl chloride, or asphalt, almost no outputs were obtained from the solar cell modules after the acceleration test.

When the polyolefin tube was used as the non-contact means, the outputs from the solar cell modules did not decrease after the acceleration test regardless of the type of rear material.

Those solar cell modules which did not provide outputs after the acceleration test were analyzed to find that the portion of the covering material of the electric connecting member for the solar cell module which contacted the rear material was significantly hardened, causing the electric connecting member to be partly cracked.

The resistances of the plus and minus draw-out portions were examined to find that the electric connecting member was short-circuited between the plus draw-out side and the minus draw-out side.

When the terminal draw-out box was opened to observe the inside, it was found that the terminal draw-out portion of the solar cell module was wetted by water and that water caused a short-circuit between the plus- and minus-terminal wires 602 exposed from the terminal draw-out holes 604 shown in FIG. 6.

Then, in the solar cell modules that did not provide output after the acceleration test, the portion inside the terminal box which was electrically short-circuited due to moisture was sufficiently dried using a drier and then the output from the solar cell measured again.

The results are shown in Table 2.

The output holding rate of the solar cell modules recovered to only about 80% after the short-circuited portion was dried using the drier, as shown in Table 2.

These results lead to the following assumption.

When the electric connecting member comprises vinyl chloride resin and the rear material comprises polystyrene, polyurethane, vinyl chloride, or asphalt and if the electric connecting member contacts the rear material over a long period of time, certain chemical reaction may occur between the electric connecting member and the rear material which degrades the vinyl chloride resin of the electric connecting member to reduce its flexibility, thereby causing the vinyl chloride resin to be partly cracked. As the enclosure is exposed to winds and rain outdoors over a long period of time, moisture passes through the crack and infiltrates into the terminal box through the covering material of the electric connecting member due to the capillary phenomenon, thereby causing the solar cell module to be short-circuited within the terminal box. The moisture reaches the solar cell element through the terminal hole degrades the performance of the element.

On the other hand, when the polyolefin tube is used as the non-contact means, the chemical reaction with the rear material is unlikely to occur regardless of the type of the material, thereby preventing the electric connecting member from cracking. Thus, use of a polyolefin tube can provide a solar cell module and an enclosure that exhibit stable performance even when they are exposed to outdoor conditions over a long period of time.

The results of the acceleration test according to this example of verification show that even when the electric connecting member comprises vinyl chloride, the performance of the solar cell module can be prevented from being degraded by covering the electric connecting member with the "tube". In addition, the degradation of performance has been confirmed to be prevented by simply passing the electric connecting member through the tube.

Example 2

Although in Example 1 the amorphous silicon solar cell was used as the solar cell element, in this example glass-sealed solar cell modules comprising crystal solar cells were produced. Two solar cell modules were installed on a rear material via a space to constitute an enclosure, similarly as in Example 1.

Example 2 is described below in detail with reference to FIG. 16A.

The solar cell element comprised a crystalline silicon solar cell. Grid electrodes were attached to the cell element, and two crystalline silicon solar cell elements were connected in series. A solar cell module 210 was produced by sealing the series-connected crystalline silicon solar cells 212 with a glass surface material 211, a back sealing material 214 consisting of an aluminum foil sandwiched by moisture-resistant fluorine resin, and EVA 213 as a filler.

In the terminal draw-out portion of the solar cell module, two terminal draw-out holes were opened in an aluminum foil sandwiched by moisture-resistant fluorine resin (Tedler (Du Pont Company)/aluminum foil/Tedler) and plus and minus electrodes were drawn out through the holes, similarly as in Example 1.

A terminal draw-out box 233 and electric connecting members 231 and 232 were mounted similarly as in Example 1.

Then, the two solar cell modules 210 were sandwiched between mounting materials 220, and the mounting materials 220 were mounted on an underlying material 240 and a substrate material 250.

The two solar cell modules were electrically connected together using the electric connecting members 231 and 232. As a non-contact means, the electric connecting members 231 and 232 were covered with a polyester tape 235 before connection. In this manner, an enclosure was produced that included the glass-sealed solar cell modules comprising the crystal solar cells.

Due to its high conversion efficiency, the crystalline silicon solar cell module according to this example provides a larger amount of current than that of amorphous silicon. Therefore, the electric connecting member requires thicker electric wires, which are inevitably harder. Consequently, this example does not allow wiring binding devices or tubes to be mounted easily. This example, however, only requires the tape to be wound around the electric connecting member and can prevent the degradation of performance easily.

Verification 2

In this verification, the enclosure produced according to Example 2 was used. Similarly as in Verification 1, a part of a cable protruding from the back surface of the solar cell module was forcibly contacted with the rear material, and an acceleration test was conducted to examine the performance of the solar cell module.

Figure 16B:
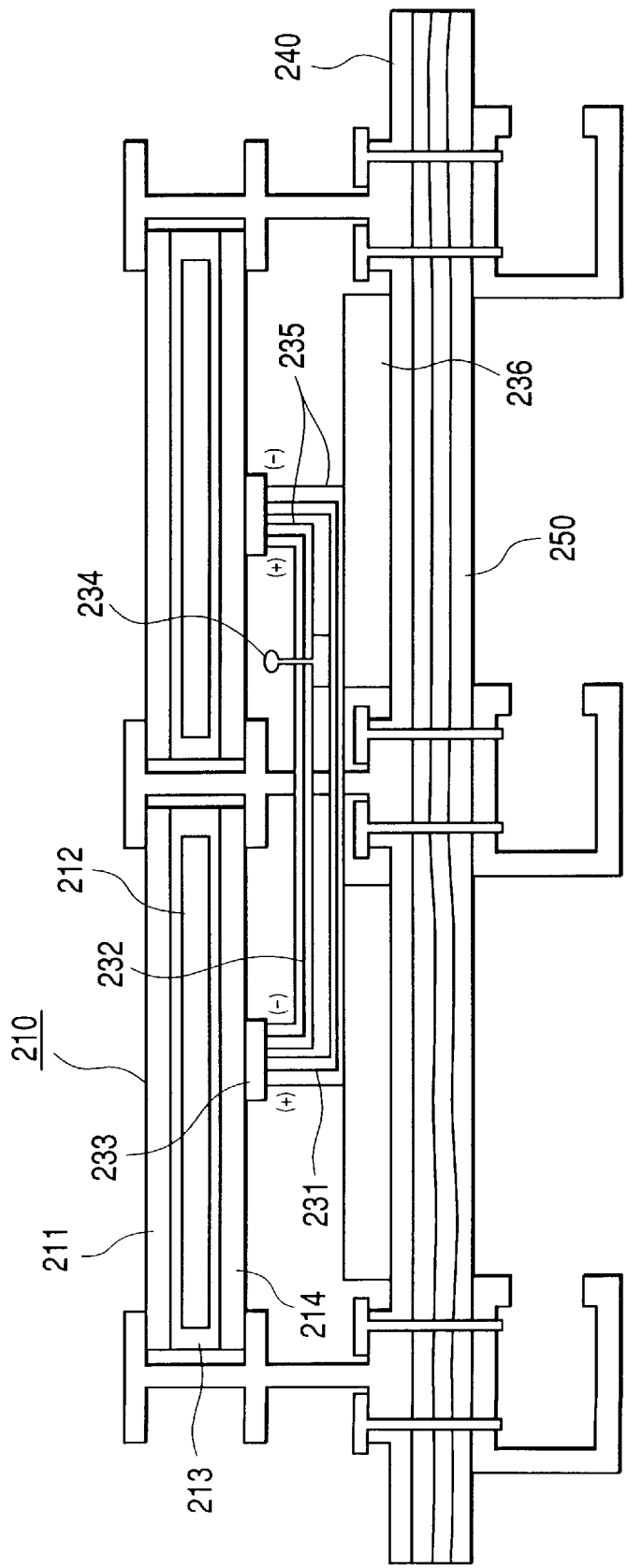

This verification is described in detail with reference to FIG. 16B.

To ensure that the electric connecting member 231 and rear material 236 of the enclosure produced according to Example 2 contacted each other, a weight 234 was placed on the electric connecting member 231. In this condition, an acceleration test was conducted in which the solar cell modules were assumed to be exposed to sunlight or winds or rain outdoors, for example, on the roof over a long period of time, similarly as in Verification 1. The outputs from the solar cell modules were measured before and after the acceleration test.

"600-V Crosslinked Polyethylene Insulated Vinyl Sheath Power Cables (600 V CV)" consisting of conductors of the same length each having a 2 $mm^2$ cross section were used as the electric connecting members 231 and 232, rear material 236 comprising polystyrene, polyurethane, vinyl chloride, or asphalt was used, and a polyester tape 235 was used as the non-contact means. These materials were arbitrarily combined together.

The specific materials of the above were the same as those used in Verification 1. The results are shown below.

When no non-contact means was used, all solar cell modules short-circuited and failed to provide output after the acceleration test, similarly as in Verification 1.

When the polyester tape was used as the non-contact means, the outputs from the solar cell modules did not decrease after the acceleration test regardless of the type of the underlaying material and/or substrate material and/or rear material, similarly as in Verification 1.

Those solar cell modules which did not provide outputs after the acceleration test were analyzed to find that the covering material of the electric connecting member for the solar cell module was notably hardened, causing the electric connecting member to be partly cracked.

When the terminal draw-out boxes for these solar cell modules were opened to observe the inside, it was found that the terminal draw-out portion of the solar cell module was wetted, causing an electric short-circuit between the plus- and minus-terminal wires exposed from the terminal draw-out hole, similarly as in Verification 1.

The results of this verification show that even when the electric connecting member comprises vinyl chloride, the performance of the solar cell module can be prevented from being degraded by covering the electric connecting member with the "tape". Similar effects have been confirmed to be obtained in the glass-sealed solar cell module in which the solar cell module comprises not only amorphous silicon but also crystalline silicon.

Example 3

Figure 16C:
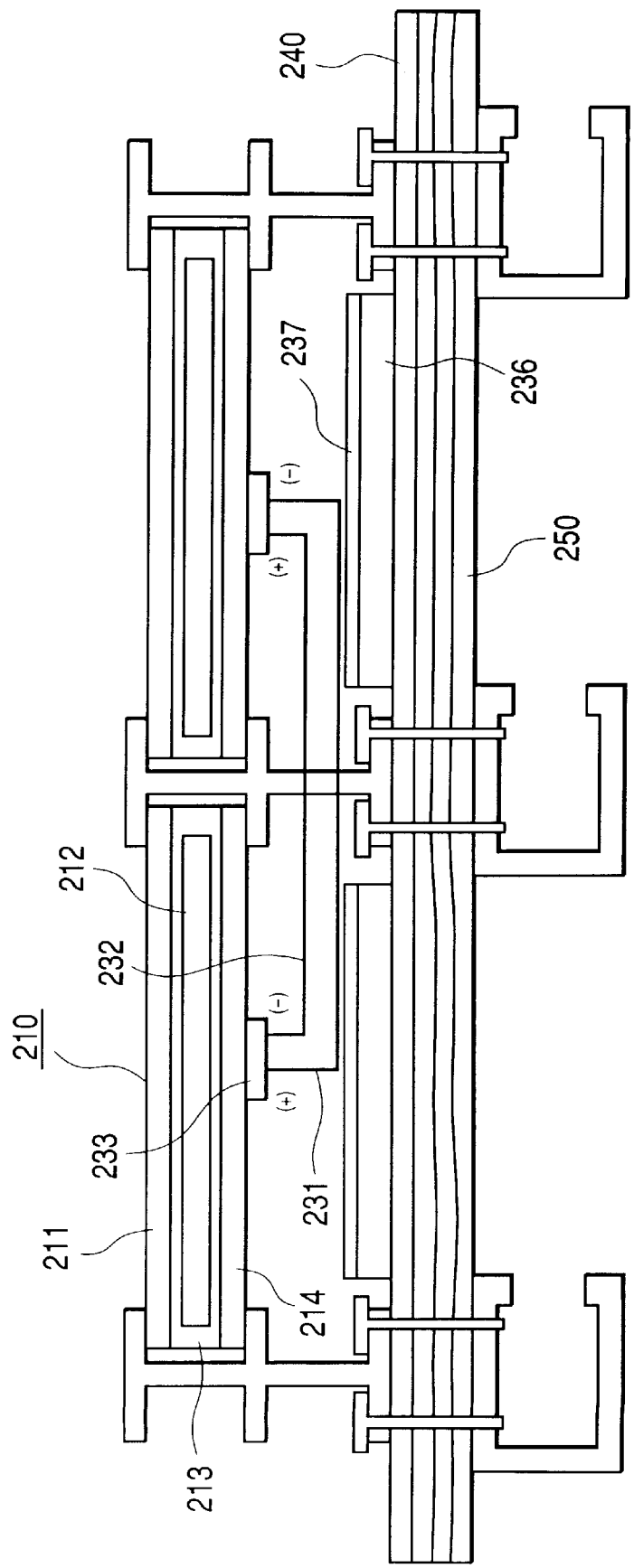

Solar cell modules were produced in the same manner as in Example 2 except that the solar cell element comprised polycrystalline silicon instead of crystalline silicon. Two solar cell modules were sandwiched between frames 220, which were then mounted on the underlaying material 240 and the substrate material 250. A polyethylene film 237 was laid like a "sheet" as a non-contact means on the rear material 235 that had been installed beforehand, and the CV cables 231 and 232 that were electric connecting members electrically connecting the adjacent solar cell modules were directly installed to produce a polycrystalline silicon solar cell module enclosure (FIG. 16C).

Due to its high conversion efficiency, the polycrystalline silicon solar cell module according to this example provides a larger amount of current than that of amorphous silicon. Therefore, the electric connecting member requires thicker electric wires, which are inevitably harder. Consequently, this example does not allow wiring binding devices or tubes to be mounted easily. Thus, this example only requires the "sheet" to be laid on the rear material corresponding to the path for the electric connecting member, thereby improving workability.

Verification 3

In this verification the enclosure produced according to Example 3 was used. An acceleration test was conducted similarly as in Verification 1.

The specific materials used were the same as those in Verification 1, and a polyethylene film 237 was installed like a "sheet" as a non-contacting means.

The results are shown below. This verification is described in detail with reference to FIG. 16D.

To ensure that the electric connecting member 231 and rear material 236 of the enclosure produced according to Example 3 contacted each other, the weight 234 was placed on the electric connecting member 231. In this condition, an acceleration test was conducted in which the solar cell modules were assumed to be exposed to sunlight or winds or rain outdoors, for example, on the roof over a long period of time, similarly as in Verification 1. The outputs from the solar cell modules were measured before and after the acceleration test.

"600-V Crosslinked Polyethylene Insulated Vinyl Sheath Power Cables (600 V CV)" consisting of conductors of the same length each having a 2 mm$^2$ cross section were used as the electric connecting members 231 and 232, rear material 236 comprising polystyrene, polyurethane, vinyl chloride, or asphalt was used, and a polyethylene film 237 was used as a non-contact means. These materials were arbitrarily combined.

The specific materials of the above were the same as those in Verification 1. The results are shown below.

When no non-contact means was used, all solar cell modules short-circuited and failed to provide output after the acceleration test, similarly as in Verification 1.

When the polyethylene film was used as a non-contact means, the outputs from the solar cell modules did not decrease after the acceleration test regardless of the type of rear material, similarly as in Verification 1.

Those solar cell modules which did not provide outputs after the acceleration test were analyzed to find that the covering material of the electric connecting member for the solar cell module was noticeably hardened causing the electric connecting member to partially crack.

When the terminal draw-out boxes for these solar cell modules were opened to observe the inside, it was found that the terminal draw-out portion of the solar cell module was wetted, causing an electric short-circuit between the plus- and minus-terminal wires exposed from the terminal draw-out hole, similarly as in Verification 1.

The results of this verification show that even when the electric connecting member comprises vinyl chloride-based resin, the performance of the solar cell module can be prevented from being degraded by placing the "sheet" as a non-contact means between the rear material and the electric connecting member. Similar effects have been confirmed to be obtained in a glass-sealed solar cell module including polycrystalline silicon solar cell elements.

Example 4

Figure 17:
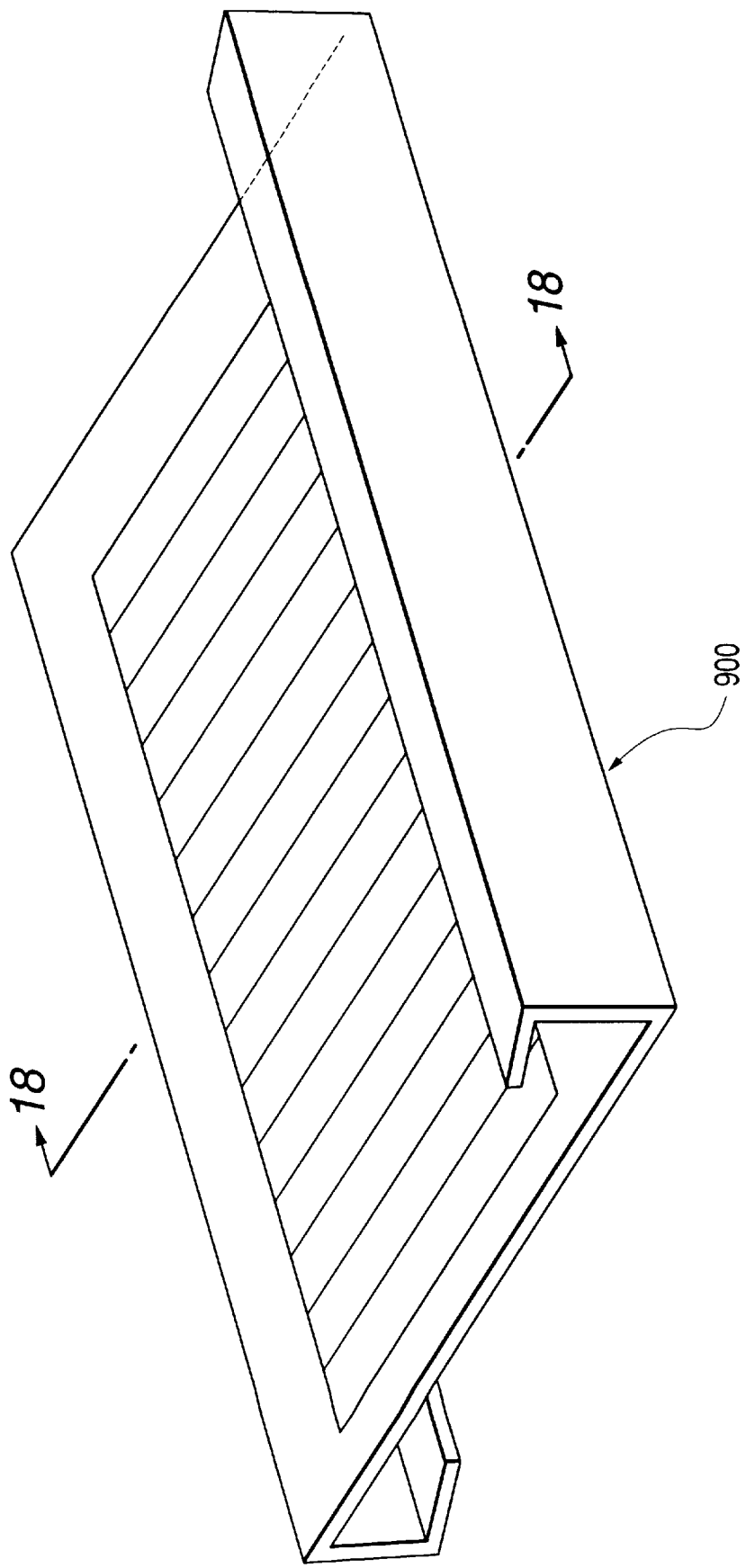
Figure 18:
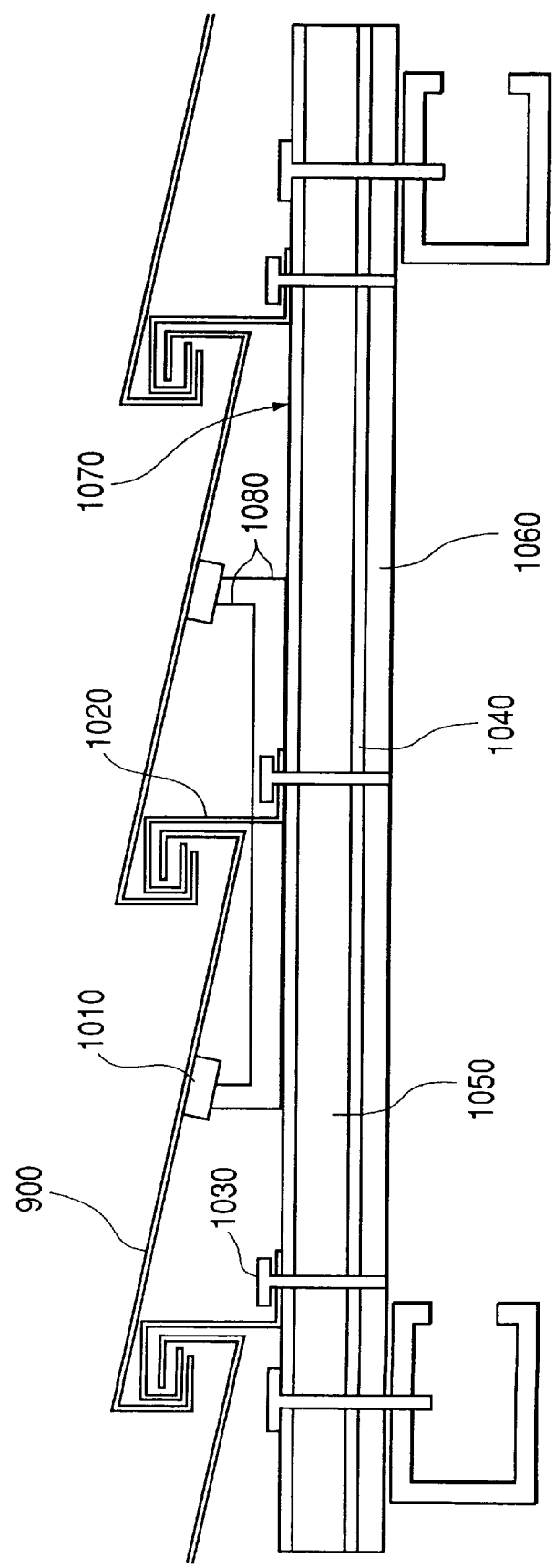

This example is the example in which a sheet was installed as a non-contact means similarly as in Example 3. Unlike the solar cell module of a ribbed seam roof type of Example 1 which was bent as shown in FIG. 7, the module of this example is of a lateral laying type which was bent as shown in FIG. 17, that is, the module was bent in the opposite directions, instead of the same direction as in FIG. 7. The cross-sectional view of a solar cell module 900 in FIG. 18 is taken along the line 18—18 of the lateral laying type solar cell module 900 in FIG. 17. The enclosure with solar cells shown in FIG. 18 comprised the same amorphous silicon solar cells as in Example 1. Reference numeral 1010 designates a terminal box. As shown in FIG. 18, the lateral laying type solar cell modules 900 installed In the vertical direction were fixed by metal suspension devices 1020, which were directly fixed to a water-tight asphalt sheet acting as an underlaying material 1040, a rear material 1050, and a roof board 1060 acting as a substrate material using bolts 1030. A polyethylene film 1070 was laid like a "sheet" as a non-contact means on the rear material 1050 that had been installed beforehand, and a CV cable 1080 that was an electric connecting member electrically connecting the adjacent solar cell modules was directly installed to produce a lateral laying type solar cell enclosure, as shown in FIG. 18.

The solar cell module integrated with a construction material according to this invention is characterized by direct installation on the underlaying material and/or substrate material or rear material. Thus, this example requires the electric connecting members to be connected and wired within a smaller space between the solar cell module and the underlaying material and/or substrate material or rear material. Thus, by laying the "sheet" as a non-contact means as in this example, the contact between the electric connecting member and the underlaying material and/or substrate material and/or rear material can be prevented easily by simply connecting the electric connecting members together without the need to cover the electric connecting members with the "tube" or "tape" in the small working space.

Verification 4

In this verification, the enclosure produced according to Example 4 was used. An acceleration test was conducted similarly as in Verification 1.

The specific materials used were the same as those in Verification 1, and a polyethylene film 1070 was installed like a "sheet" as a non-contact means.

The results are shown below.

When no non-contact means was used, all solar cell modules short-circuited and failed to provide output after the acceleration test, similarly as in Verification 1.

When the polyester tape was used as the non-contact means, the outputs from the solar cell modules did not decrease after the acceleration test regardless of the type of the underlaying material and/or substrate material and/or rear material, similarly as in Verification 1.

Those solar cell modules which did not provide outputs after the acceleration test were analyzed to find that the covering material of the electric connecting member for the solar cell module was notably causing the electric connecting member to partially crack.

When the terminal draw-out boxes for these solar cell modules were opened to observe the inside, it was found that the terminal draw-out portion of the solar cell module was wetted, causing an electric short-circuit between the plus- and minus-terminal wires exposed from the terminal draw-out hole, similarly as in Example 1.

The results of the acceleration test of this verification show that this invention enables the solar cell modules integrated with a construction material to be directly installed on the underlaying material and/or substrate material and/or rear material without using frames or spacer members, and that the use of the polyethylene film as a non-contact means restrains reaction with the underlaying material and/or substrate material and/or rear material regardless of their types, thereby preventing the electric connecting member from cracking, similarly as in Verification 1. Thus, this invention provides a solar cell module that exhibits stable performance even when it is subjected to outdoor conditions over a long period of time.

Example 5

In this example, an enclosure was produced by winding a polyester tape 1919 around electric connecting members 1910 and 1911, instead of the non-contact means of Example 1. FIG. 19A is a schematic sectional view showing the enclosure of this example. FIG. 19B is a partially enlarged sectional view showing the portion surrounded by a circle, taken along line 19B—19B of FIG. 19A.

It has been confirmed that when a very workable "tape" is used as in this example, the degradation of performance can be prevented easily by simply winding the tape around the electric connecting members. Since the tape also enables the electric connecting members to be wound round spacer steel materials easily, the electric connecting members can be prevented from directly contacting the underlaying material and/or substrate material and/or rear material by allowing the tape-wound portions of the electric connecting members to contact the underlaying material and/or substrate material and/or rear material. The electric connecting members wound with the tape can also be arranged in such way as to be suspended above the underlaying material and/or substrate material and/or rear material.

Verification 5

In this verification, the enclosure produced according to Example 5 was used. An acceleration test was conducted similarly as in Verification 1.

The specific materials used were the same as those in Verification 1, and the polyester tape 1919 as the non-contact means was wound around the electric connecting members 1910 and 1911.

When the polyester tape was used as a non-contact means, the outputs from the solar cell modules 1910 and 1911 did not decrease after the acceleration test regardless of the type of the rear material 806, similarly as in Verification 1.

The results of the acceleration test according to this verification show that by covering the electric connecting members with the "tape", the performance of the solar cell module can be prevented from being degraded even when the electric connecting members comprise vinyl chloride-based resin.

Example 6

Figure 20A:
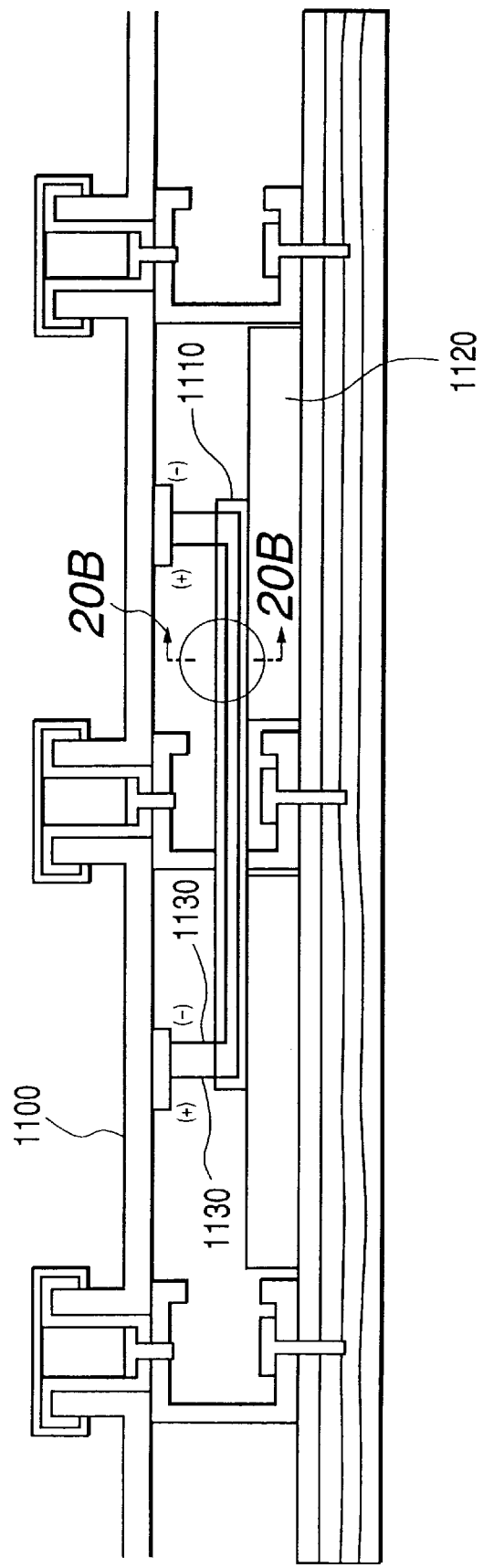
Figure 20B:
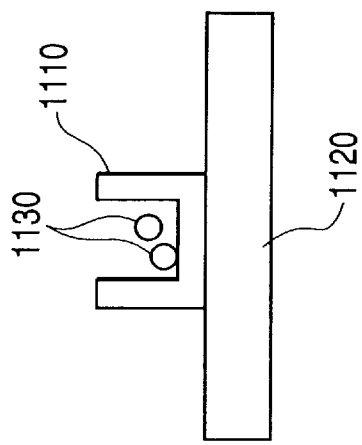
FIG. 20B is a partially enlarged cross-sectional view of the portion surrounded by a circle, taken along the line 20B—20B of FIG. 20A.

In this example, an enclosure was produced by using a "cutting duct" 1110 of nylon 6 that is an "electric path supporting material" as the non-contact means, as a path for electric connecting members 1130. FIG. 20A is a schematic sectional view showing the enclosure of this example. FIG. 20B is a partially enlarged sectional view showing the portion surrounded by a circle, taken along the line 20B—20B of FIG. 20A.

Using the "electric path supporting material" as in this example, electric connecting members other than those which connect modules such as string cables that extend into the house can be passed over or through the "electric path supporting material" to prevent all the electric connecting members above the rear material from contacting the rear material. The "electric path supporting material" may be located only in the passage for the electric connecting members and can be cut easily. In addition, when connected, such electric path supporting materials can deal with curves. Furthermore, due to its strength, this material can be installed in the direction perpendicular to the ground in an extreme case and can thus be adapted for various installation sites.

Verification 6

In this verification, the enclosure produced according to Example 6 was used. An acceleration test was conducted similarly as in Verification 1.

The specific materials used were the same as those in Verification 1, and the electric path supporting material 1110, in a "cutting duct" of nylon 6 was used as a non-contact means, in the path for the electric connecting members 1130.

When the "cutting duct" was used as a non-contact means, the output from a solar cell module 1100 did not decrease after the acceleration test regardless of the type of rear material 1120 behind the module, similarly as in Verification 1.

The results of the acceleration test according to this verification show that by passing the electric connecting members over or through the "electric path supporting material", the performance of the solar cell module can be prevented from being degraded even when the electric connecting members comprise vinyl chloride-based resin.

Example 7

In this example, an enclosure was produced similarly as in Example 1, except that electric connecting members 1230 were fastened by Insulok Tie 1210 as a wiring binding device acting as the non-contact means in order to arrange the electric connecting members above the rear material. FIG. 21A shows a schematic sectional view showing the enclosure of this example. The wiring binding device 1210 according to this example binds the electric connecting members 1230 together in a circular space as shown in FIG. 21B.

The Insulok Tie used as the "wiring binding device" in this example is used to connect the electric connecting members and can be tightened more easily than the tape.

Verification 7

In this verification the enclosure produced according to Example 7 was used. An acceleration test was conducted similarly as in Verification 1.

The specific materials used were the same as in Verification 1, and the Insulok Tie acting as the wiring binding device 1210 acting as the non-contact means was tightened around the electric connecting members 1230 to suspend them above the rear material.

The output from a solar cell module 1200 did not decrease after the acceleration test regardless of the type of rear material 1220 behind the module, similarly as in Verification 1.

The results of the acceleration test according to this verification show that by using the "wiring binding device" to connect the electric connecting members to spacer steel materials or the like in order to suspend them, the electric connecting members are not contacted with the rear material, thereby preventing the reduction of the performance of the solar cell module even when the electric connecting members comprise vinyl chloride-based resin.

Example 8

In this example, an enclosure was produced similarly as in Example 1, except for sticking a "wire clip" acting as the wiring binding device 1210, to the back surface of the solar cell module 1200 to fix the electric connecting members 1230 in order to provide a non-contact space between the electric connecting members and the rear material 1220. The wiring binding device 1210 according to this example is 8-shaped as shown in FIG. 12C and binds the electric connecting members 1230 together within one of the circular spaces of the figure "8".

Because the wire clip used as the "wiring binding device" in this invention is made of metal and is weatherproof, it is very preferable as a "wiring binding device" for electric connecting members for solar cell modules used in an environment similar to the outdoors.

Verification 8

In this verification, the enclosure produced according to Example 8 was used. An acceleration test was conducted similarly as in Verification 1.

The specific materials used were the same as in Verification 1, and the "wire clip" acting as the wiring binding device 1210 was stuck to the back surface of the solar cell module 1200 to fix the electric connecting members 1230 in order to provide a non-contact space between the members 1230 and the rear material 1220.

The output from a solar cell module 1200 did not decrease after the acceleration test regardless of the type of rear material 1220, similarly as in Verification 1.

The results of the acceleration test according to this verification show that by using the "wiring binding device" to connect the electric connecting members to spacer steel materials or the like in order to suspend them, the electric connecting members are not directly contacted with the rear material, thereby preventing the reduction of the performance of the solar cell module even when the electric connecting members comprise vinyl chloride-based resin.

Example 9

Figure 22:
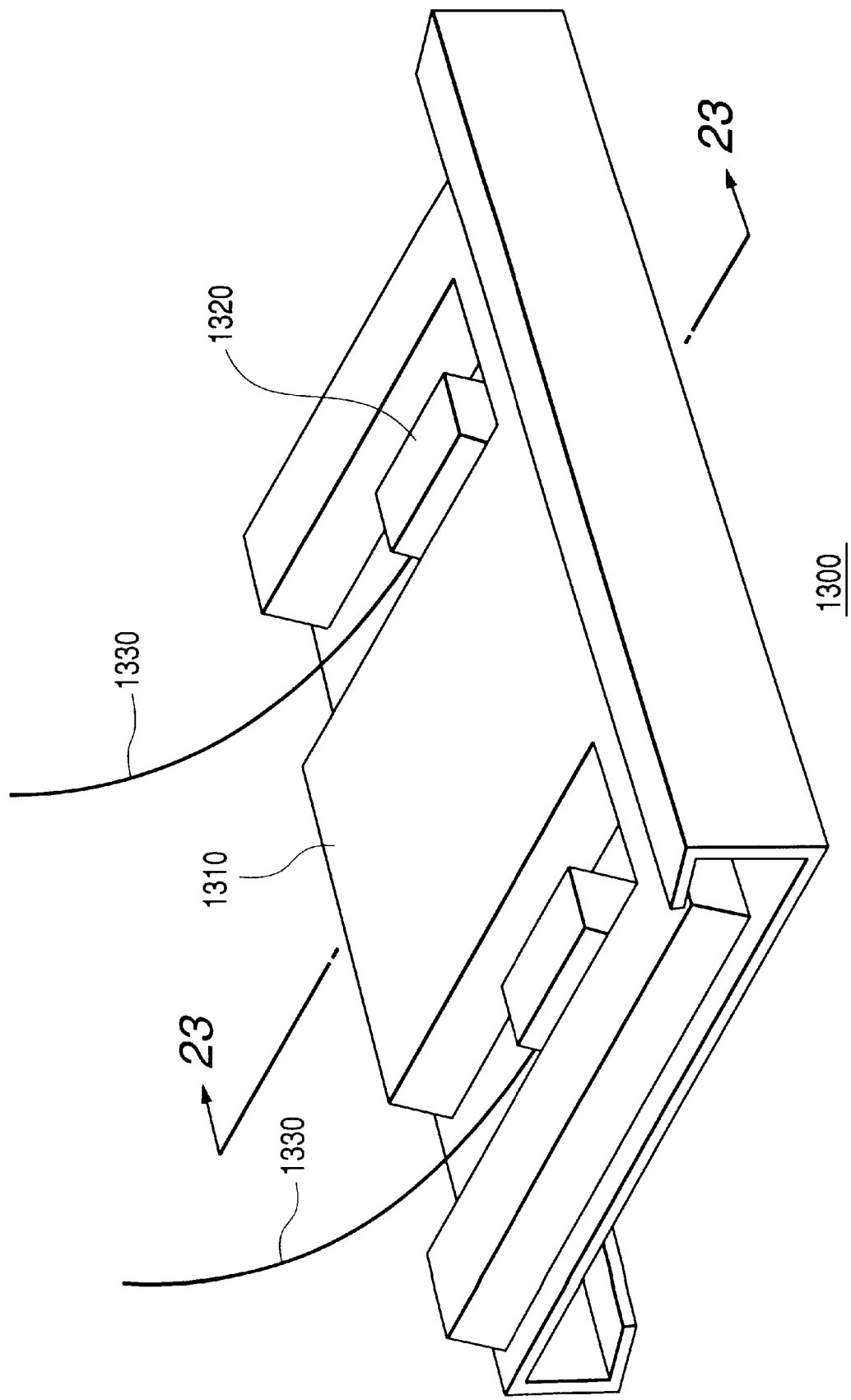
Figure 23:
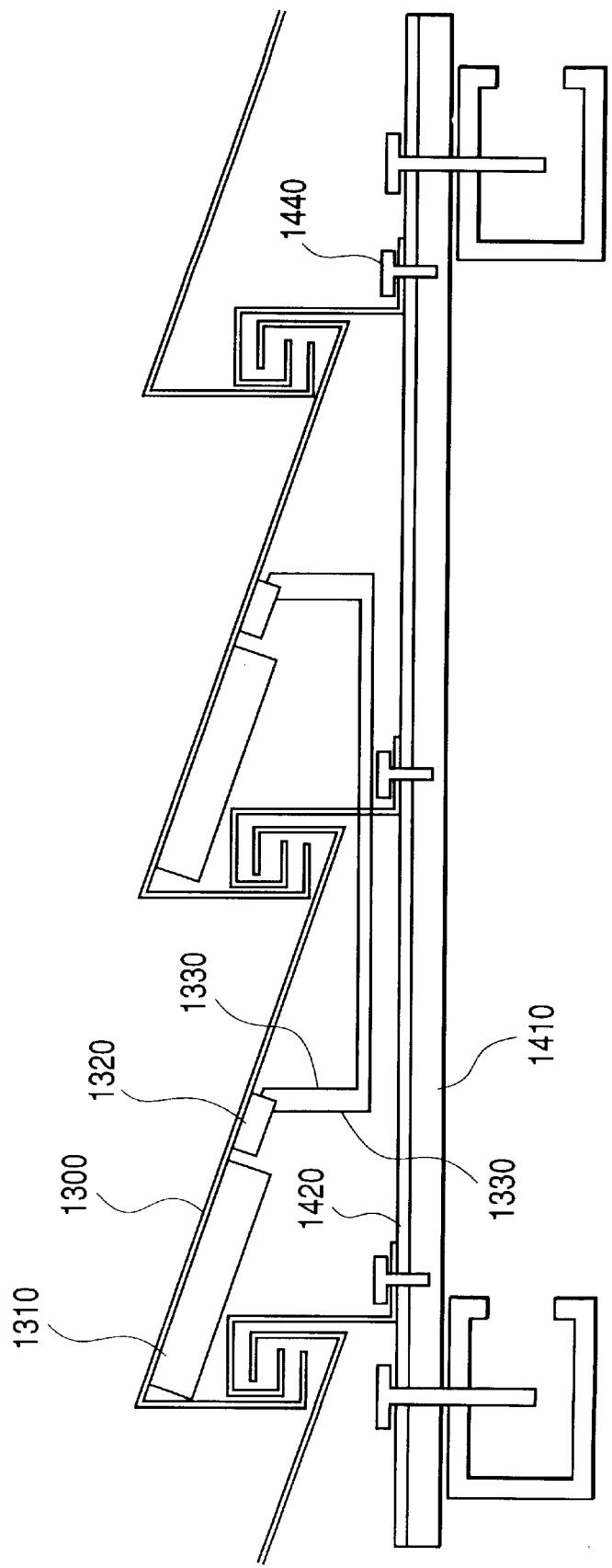

In this example, when the rear material is integrally formed with the solar cell module on its back surface, a non-contact space is provided between the electric connecting members and the rear material. This example provides a lateral laying type solar cell module 1300 with a rear material that is bent to form a lateral laying shape and that has a rear material 1310 stuck to its back surface, as shown in FIG. 22, unlike the solar cell module according to Example 1 that is bent like a ribbed seam roofing type in FIG. 7. Reference numeral 1320 denotes a terminal box and reference numeral 1330 denotes an electric connecting member. As shown in FIG. 23, a plurality of lateral laying type solar cell modules 1300 with a rear material were directly installed on a water-tight asphalt sheet 1420 laid on a roof board 1410. FIG. 23 is a cross-sectional view of the lateral laying type solar cell module 1300 with a rear material taken along the line 23—23 of FIG. 22. The solar cell module comprises the same amorphous silicon solar cell as in Example 1, and reference numeral 1320 designates a terminal box.

The lateral laying type solar cell modules 1300 with a rear material arranged in the vertical direction are fixed to the water-tight asphalt 1420 and the roof board 1410 using screws 1440.

Figure 24:
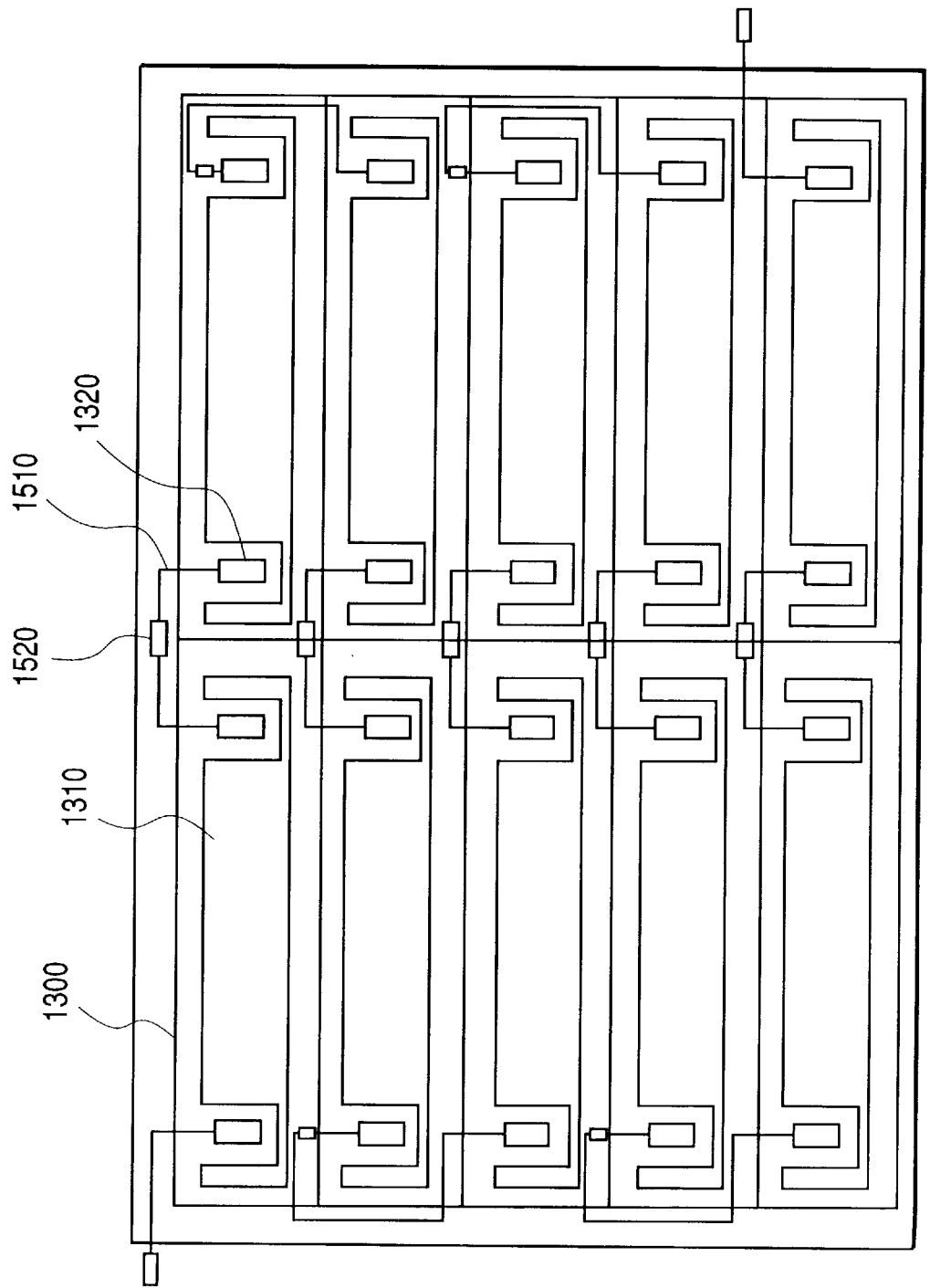
FIGS. 24, 27 and 34 are schematic plan views showing an example of an installed enclosure.

FIG. 24 shows a solar cell array in which a plurality of lateral laying type solar cell modules 1300 with a rear material are arranged, as seen from the rear of the modules. A lateral laying type solar cell enclosure with a rear material was produced by cutting out the portions of the rear material corresponding to a terminal box 1320, CV cables 1510 that are electric connecting members electrically connecting adjacent solar cell modules, and their connections 1520 to provide a non-contact space through which the electric connecting members pass, before sticking the rear material 1310 to the back surface reinforcing plate of the solar cell module.

As shown in this example, this invention enables solar cell modules integrated with a construction material and having a rear material on its back surface to be directly installed without the need for frames or spacer members and enables electric connecting members for solar cells to be installed in a narrow non-contact space by cutting out the rear material without reducing outputs. In addition, since the rear material is only partly cut out for the path for the electric connecting members, it can be extended almost all over the back surface of the module to enable the solar cell modules to be installed without losing the inherent effects of the rear material.

Verification 9

In this verification, the enclosure produced according to Example 9 was used. An acceleration test was conducted similarly as in Verification 1.

The specific materials used were the same as in Verification 1, and a non-contact space was provided by cutting out the rear material.

The output from a solar cell module 1300 did not decrease after the acceleration test regardless of the type of rear material 1310, similarly as in Verification 1.

Example 10

Figure 25:
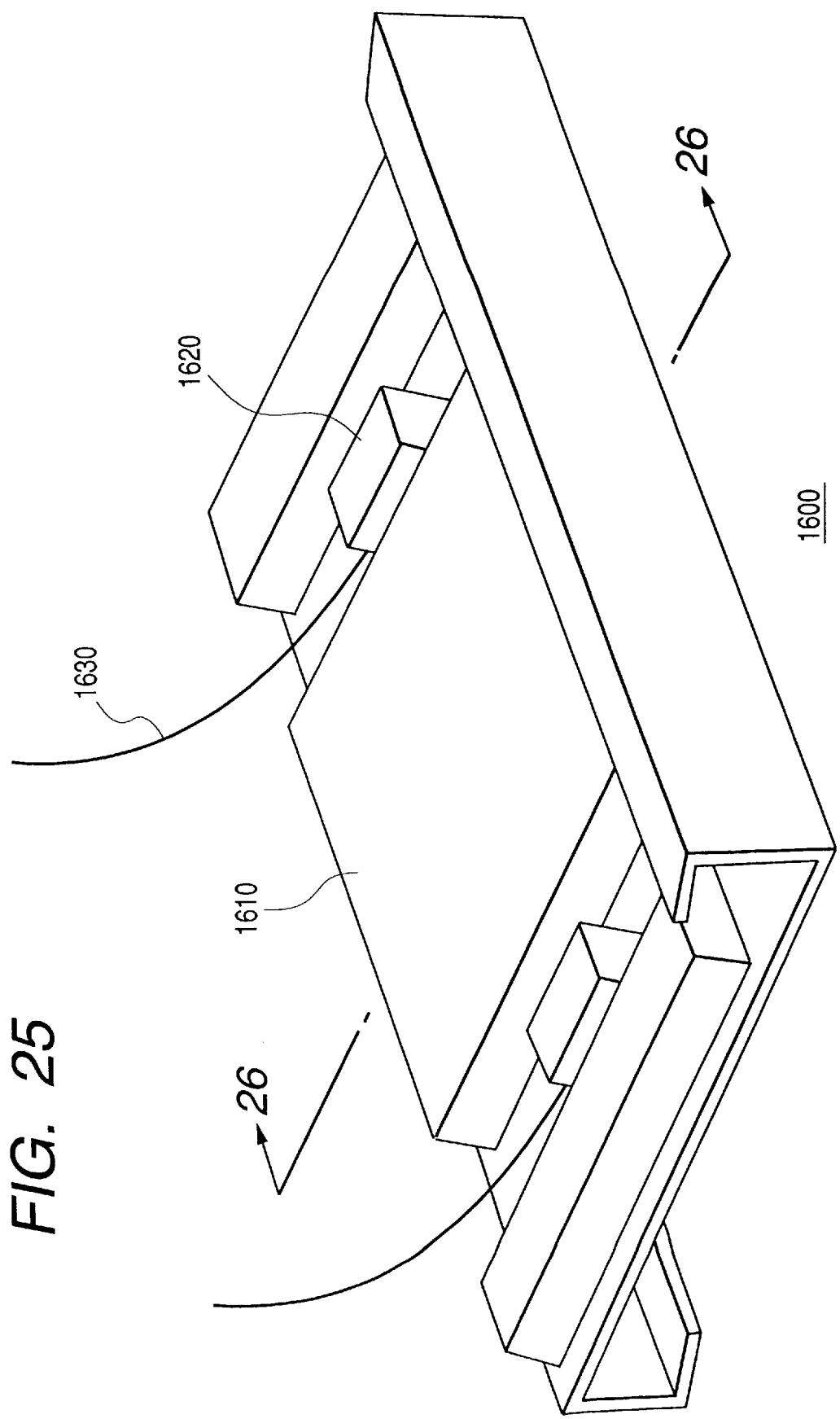
Figure 26:
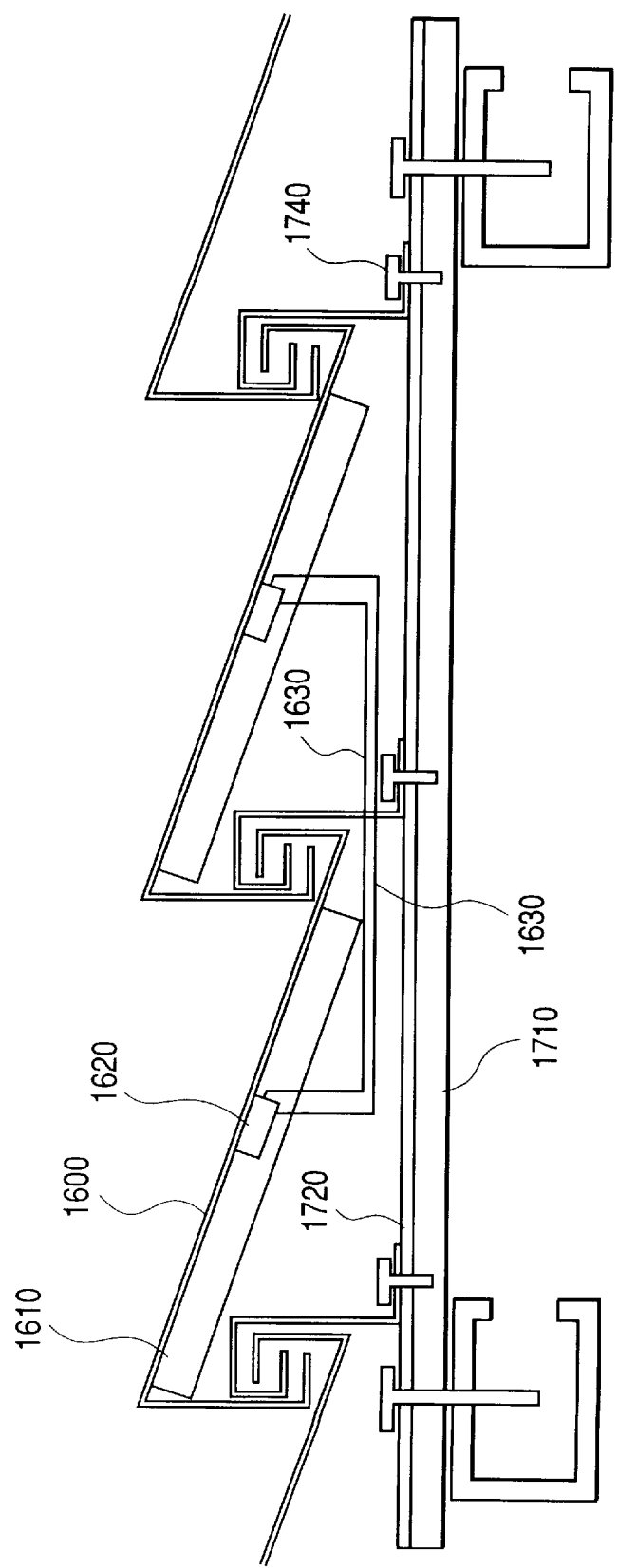

In this example, when the rear material is integrally formed with the solar cell module on its back surface, a non-contact space is provided between the electric connecting members and the rear material, similarly as in Example 9. This example provides a lateral laying type solar cell module 1600 with a rear material that is bent so as to form a lateral laying shape and that has a rear material 1610 stuck to its back surface, as shown in FIG. 25, unlike the solar cell module according to Example 1 that is bent like a ribbed seam roof as shown in FIG. 7. Reference numeral 1620 denotes a terminal box and reference numeral 1630 denotes an electric connecting member. As shown in FIG. 26, a plurality of lateral laying type solar cell modules 1600 with a rear material were directly installed on a water-tight asphalt sheet 1720 laid on a roof board 1710.

FIG. 26 is a sectional view of the lateral laying type solar cell modules 1600 with a rear material taken along the line 26—26 in FIG. 25. The solar cell module comprises the same amorphous silicon solar cell as in Example 1, and reference numeral 1620 designates a terminal box.

The lateral laying type solar cell modules 1600 with a rear material arranged in the vertical direction are fixed to the water-tight asphalt 1720 that was an underlaying material and to the roof board 1710 that was a substrate material using screws 1740. Electric connecting members 1750 were prevented from contacting the water-tight asphalt sheet 1720.

Figure 27:
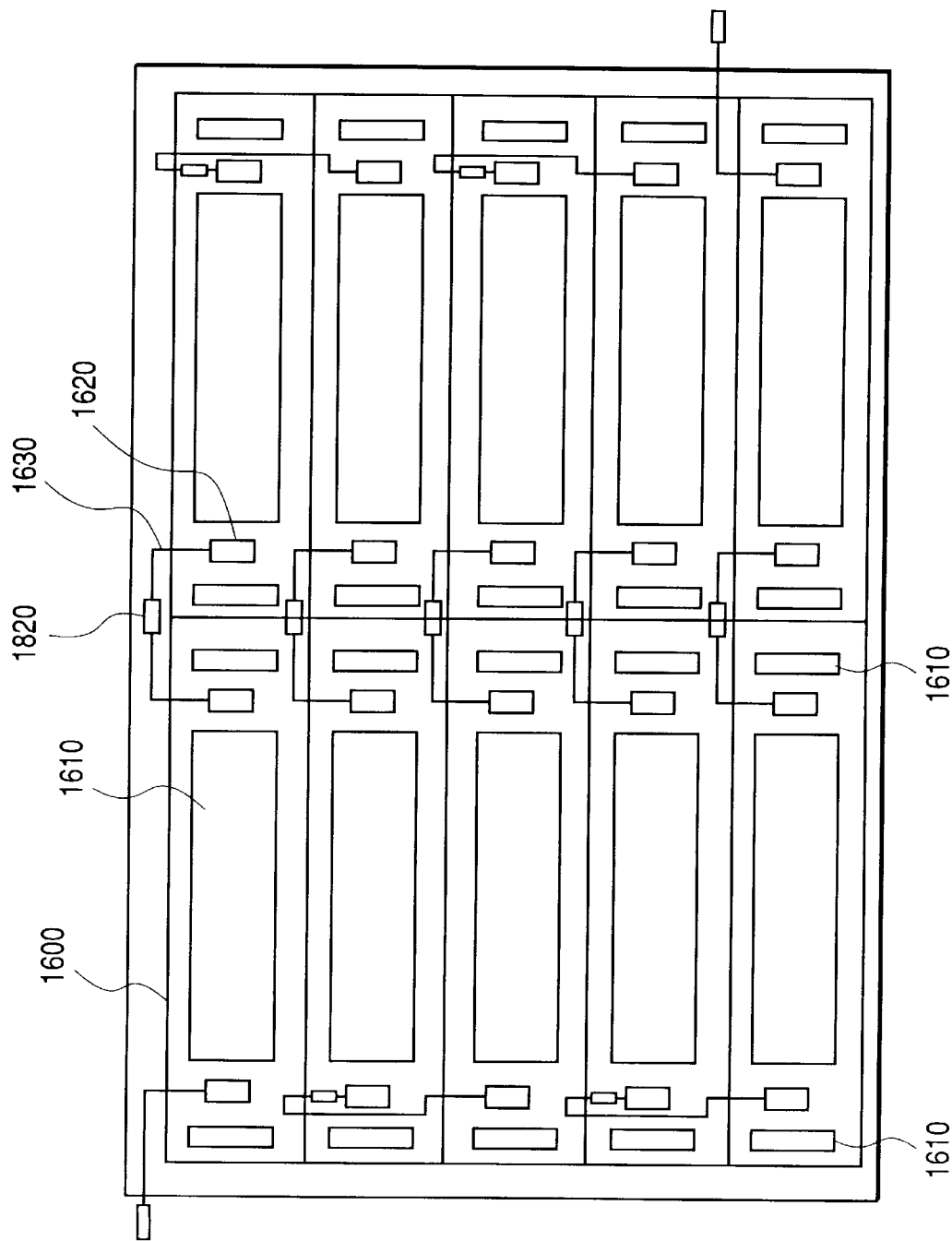

FIG. 27 is a top view of a plurality of installed lateral laying type solar cell modules 1600 with a rear material. A lateral laying type solar cell enclosure with a rear material was produced by positioning the rear material 1610 except for the positions of a terminal box 1620, CV cables 1630 that are electric connecting members electrically connecting adjacent solar cell modules, and their connections 1820 to provide a non-contact space through which the electric connecting members pass, when sticking the rear material 1610 to the back surface reinforcing plate of the solar cell module.

As shown in this example, by simply placing separated rear materials on the back surface of the solar cell module except for the path for the electric connecting members, sufficient functions can be provided using a very simply shaped rear material. That is, the contact between the rear material and the electric connecting members can be prevented without the use of rear materials specially shaped for the solar cell module by installing a plurality of appropriately conventional sized rear materials so as not to be located in the path for electric connecting members.

Verification 10

In this verification, the enclosure produced according to Example 10 was used. An acceleration test was conducted similarly as in Verification 1.

The specific materials used were the same as in Verification 1, and the rear material was separated into pieces, which were then arranged to provide a non-contact space.

The output from the solar cell module 1600 did not decrease after the acceleration test regardless of the type of rear material 1610, similarly as in Verification 1.

As shown in this verification, this invention enables solar cell modules integrated with a construction material and having a rear material on its back surface to be directly installed without the need for frames or spacer members and enables electric connecting members for solar cells to be installed in a narrow non-contact space by cutting out the rear material without reducing the outputs.

Example 11

In this example, an enclosure was produced using as a non-contact means, a polyester resin-based paint 1919 instead of the polyester tape used in Example 5; the electric connecting members were coated with the paint.

The degradation of performance has been confirmed to be easily prevented by using the electric connecting members previously coated with the "paint" according to this example. In addition, since the electric connecting members coated with a paint beforehand can be wound easily round spacer steel materials or the like as required, the electric connecting members can be prevented from directly contacting the rear material by allowing their coated portions to contact the rear material. The coated electric connecting members can also be arranged in such way as to be suspended above the rear material.

Verification 11

In this verification, the enclosure produced according to Example 1 was used. An acceleration test was conducted similarly as in Verification 1.

The specific materials used were the same as in Verification 1, and the electric connecting members 1910 and 1911 previously coated with the polyester resin-based paint 1919 were used as a non-contact means.

When the polyester resin-based paint was used as a non-contact means, the outputs from the solar cell modules 1900 and 1911 did not decrease after the acceleration test regardless of the type of rear material 806, similarly as in Verification 1.

The results of the acceleration test according to this verification show that by coating the electric connecting members with the "paint", the performance of the solar cell module can be prevented from being degraded even when the electric connecting members comprise vinyl chloride-based resin.

Example 12

Figure 28:
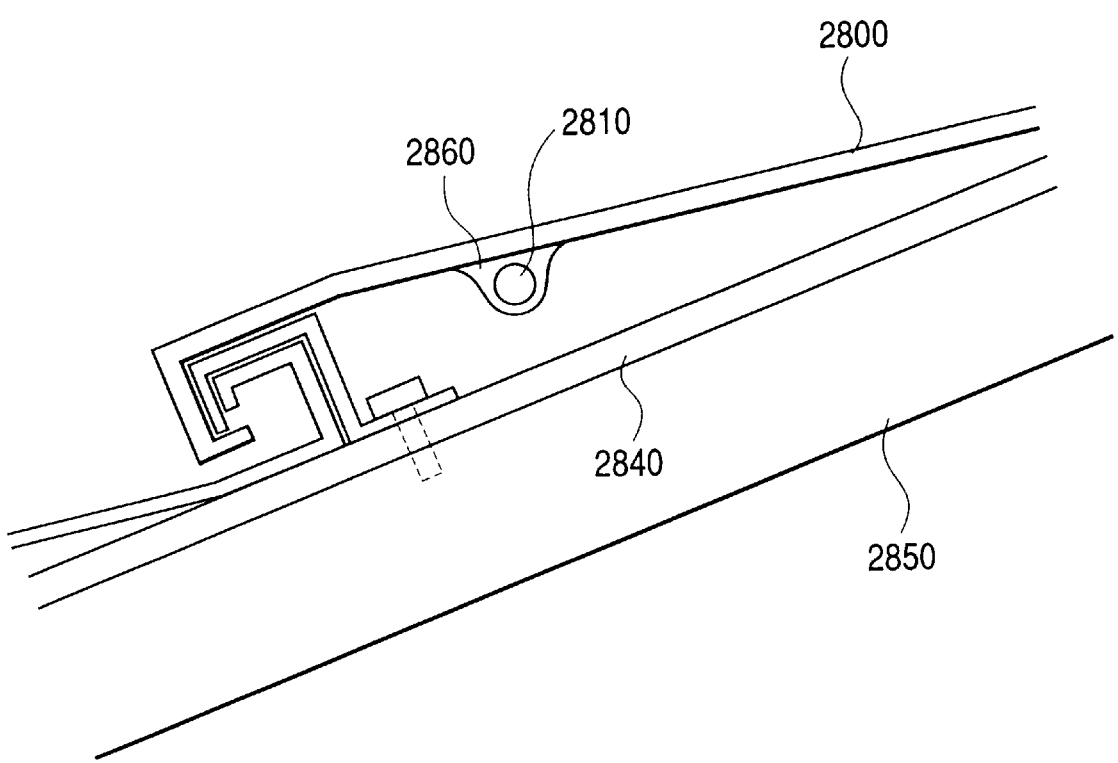

In this example, an enclosure was produced by fixing electric connecting members 2810 using an epoxy resin adhesive 2860 as a non-contact means. FIG. 28 shows a schematic sectional view.

The degradation of performance has been confirmed to be easily prevented using the electric connecting members fixed using the "adhesive" according to this example. In addition, by fixing the electric connecting members using the adhesive, the electric connecting members cannot only be prevented from directly contacting the rear material but also can be arranged in such way as to be suspended above the rear material.

Verification 12

In this verification, the enclosure produced according to Example 5 was used. An acceleration test was conducted similarly as in Verification 1.

The specific materials used were the same as in Verification 1, and the electric connecting members 2810 were fixed to regions where a rear material 2840 was absent, using an epoxy-based resin adhesive 2860 as a non-contact means.

When the epoxy resin adhesive was used as a non-contact means, the output from the solar cell module 2800 did not decrease after the acceleration test regardless of the type of rear material 2840 on the back surface of the module, similarly as in Verification 1.

The results of the acceleration test according to this verification show that by coating the electric connecting members with the "adhesive", the performance of the solar cell module can be prevented from being degraded even when the electric connecting members comprise vinyl chloride-based resin.

Example 13

Figure 29:
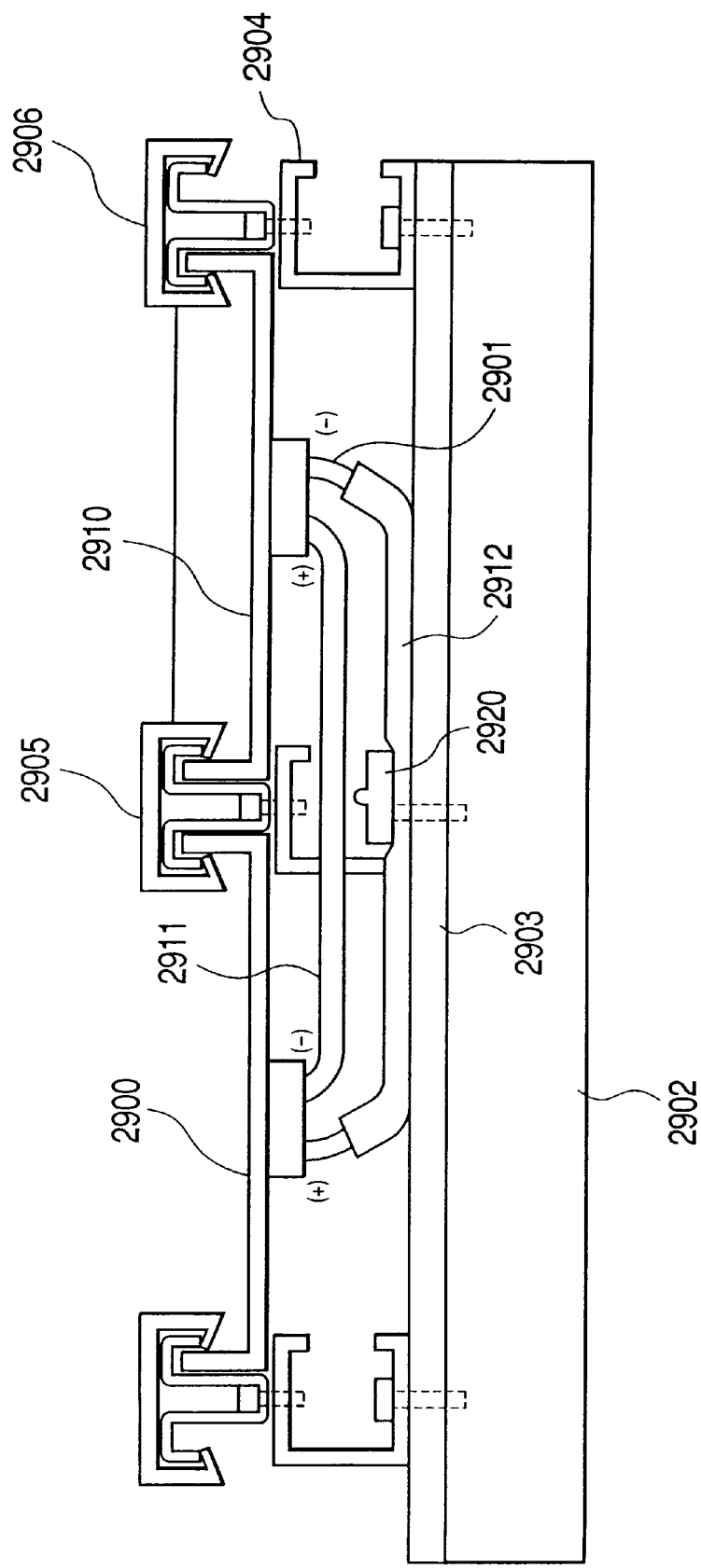

In this example, when the tube is used as a non-contact means, it is forced to contact the underlaying material in order to verify its effects. A ribbed seam roof type enclosure was produced using a bending machine to bend the ends of the solar cell module 800 upward as shown in FIG. 7, and laying an underlaying material 2903 on a substrate material 2902 and then installing two ribbed seam type solar cell modules 2900 and 2910 via C-shaped spacer steel materials 2904, as shown in FIG. 29.

The solar cell modules were fixed to the spacer steel materials 2904 using suspension devices 2905, and a cover member 2906 was installed in such a way as to cover both the module and the suspension device.

The solar cell modules were electrically connected using electric connecting members 2901 and 2911. The two solar cell modules were connected in series. That is, the plus side of the solar cell module 2900 was connected to the minus side of the solar cell module 2910 using an electric connecting member 2901, while the plus side of the solar cell module 2910 was connected to the minus side of the solar cell module 2900 using an electric connecting member 2911. Prior to the connection, however, the electric connecting member 2901 was passed through a polyolefin tube 2912, and after the connection, the tube was placed at the position at which the electric connecting member contacted the underlaying material and/or substrate material.

Inside a terminal box 605, a load resistor was connected between the back surface wiring material on the plus side of the solar cell module 2910 and the connection portion of the electric connecting member 2911 so that the solar cells could operate at an operating point close to an optimal one.

To ensure that the electric connecting member 2901 contacted the rear material 2903, a weight 2920 was placed on the electric connecting member 2901. In this condition, an acceleration test was conducted in which the solar cell modules were assumed to be exposed to sunlight or winds or rain outdoors, for example, on the roof over a long period of time.

The acceleration test was conducted as follows.

1. The solar cell enclosure installed on the underlaying material and/or substrate material was irradiated with light under the light condition of 1 SUN for 1,000 hours to spur the initial degradation of the solar cells in order to stabilize the performance of the solar cell cells.

2. The initial outputs from the solar cell modules were measured.

3. The solar cell enclosure was left in a hot and humid chamber at a temperature of 85° C. and a humidity of 85% for 500 hours.

4. The weight was measured and then the solar cell modules 2900 and 2910 were removed from the spacer steel materials 2904.

5. The electric connecting member 2901 was wound 10,000 times around a cylinder of diameter 20 mm.

6. The enclosure was left in a sunshine weather-Ometer of 3 SUN for 3,000 hours.

7. The outputs from the solar cell modules were measured after the acceleration test.

The output holding rate of the solar cell is defined as the rate of those outputs from the solar cell modules which are held after the acceleration test relative to the outputs from the solar cell modules prior to the test.

In the above acceleration test, the output holding rate of the solar cell was measured by using the "polyolefin tube 112" in some cases while not using it in the other cases, and varying the material of the "underlaying material 2903".

Specifically, "600-V Crosslinked Polyethylene Insulated Vinyl Sheath Power Cables (600 V CV)" consisting of conductors having 2 mm$^2$ cross-section were used as the electric connecting members, "Sumi Tube" was used as the polyolefin tube, and the underlaying material and/or substrate material comprising a water-tight asphalt sheet, a vinyl chloride sheet, a polyurethane thermal insulation material, a polystyrene thermal insulation material, a cemented excelsior board, or water-tight plywood were arbitrarily combined together.

"Triple-star Asphalt Roofing" manufactured by Tajima Roofing Inc. was used as the underlaying material comprising a water-tight asphalt sheet.

"Hi Tong Tong" manufactured by Matsushita Electric Works Ltd. was used as the underlaying material comprising a vinyl chloride sheet, "Achilles Board" manufactured by Achilles Company was used as the polyurethane thermal insulation material, and "Kane Light Foam" manufactured by Kanegafuchi Chemical Industry Inc. was used as the polystyrene thermal insulation material.

The results were the same as those shown in the Table 1 for Example 1.

When the non-contact means was not used and the underlaying material comprised a water-tight asphalt sheet, a vinyl chloride sheet, a polyurethane thermal insulation material, or a polystyrene thermal insulation material, almost no outputs were obtained from the solar cell modules after the acceleration test.

When the polyolefin tube was used as the non-contact means, the outputs from the solar cell modules did not decrease after the acceleration test regardless of the type of underlaying material.

On the other hand, when the cemented excelsior board or water-tight plywood was used as the substrate material, the output from the solar cell module did not decrease after the acceleration test.

Those solar cell modules which did not provide outputs after the acceleration test were analyzed to find that a portion of the covering material of the electric connecting member for the solar cell module which contacted the underlaying material and/or substrate material was significantly hardened, causing the electric connecting member to partially crack. The resistances of the plus and minus draw-out portions were examined to find that the electric connecting member short-circuited between the plus draw-out side and the minus draw-out side.

When the terminal draw-out box of the solar cell module was opened to observe the inside, it was found that the terminal draw-out portion of the solar cell module was wetted, thereby causing a short-circuit between the plus- and minus-terminal wires exposed in the terminal draw-out holes.

Then, in the solar cell module that did not provide output after the acceleration test, the wetted portion inside the terminal box which was electrically short-circuited due to moisture was sufficiently dried using a drier, and the output from the solar cell was measured again.

The results were the same as those shown in Table 2 for Example 1.

The output holding rate of the solar cell module recovered to only about 80% after the short-circuited portion was dried using the drier, as shown in Table 2.

These results lead to the following assumption.

When the electric connecting member comprises vinyl chloride resin, and when the underlaying material and/or substrate material comprises a water-tight asphalt sheet, a vinyl chloride sheet, a polyurethane thermal insulation material, or a polystyrene thermal insulation material, and if the electric connecting member contacts the underlaying material and/or substrate material over a long period of time, certain chemical reaction may occur between the electric connecting member and the underlaying material and/or substrate material which degrades the vinyl chloride resin of the electric connecting member and reduces its flexibility, thereby causing the vinyl chloride resin to partially crack. As the enclosure is exposed to winds and rain outdoors over a long period of time, moisture passes through the crack and infiltrates into the terminal box through the covering material of the electric connecting member due to the capillary phenomenon, thereby causing the solar cell module to be short-circuited within the terminal box.

The moisture infiltrates into the solar cell element through the terminal hole to reach silver paste on the solar cell element. Then, the silver was ionized under sunlight to cause electromigration, thereby degrading the performance of the solar cell element.

On the other hand, when the polyolefin tube is used as a non-contact means, the chemical reaction with the underlaying material and/or substrate material is unlikely to occur regardless of the type of underlaying material and/or the substrate material, thereby preventing the electric connecting member from cracking. Therefore, this configuration can provide a solar cell module that exhibits stable performance even when it is exposed to outdoor conditions over a long period of time.

Example 14

Although in Example 13 the amorphous silicon solar cell was used as a solar cell element, in this example glass-sealed solar cell modules comprising crystal solar cells were produced, and two solar cell modules were installed on an underlaying material and/or substrate material via a space, similarly as in Example 1. Then, a part of the electric connecting member protruding from the back side of the solar cell module was forced to contact the underlaying material and/or substrate material, and an acceleration test was conducted to determine the performance of the solar cell module.

Figure 30:
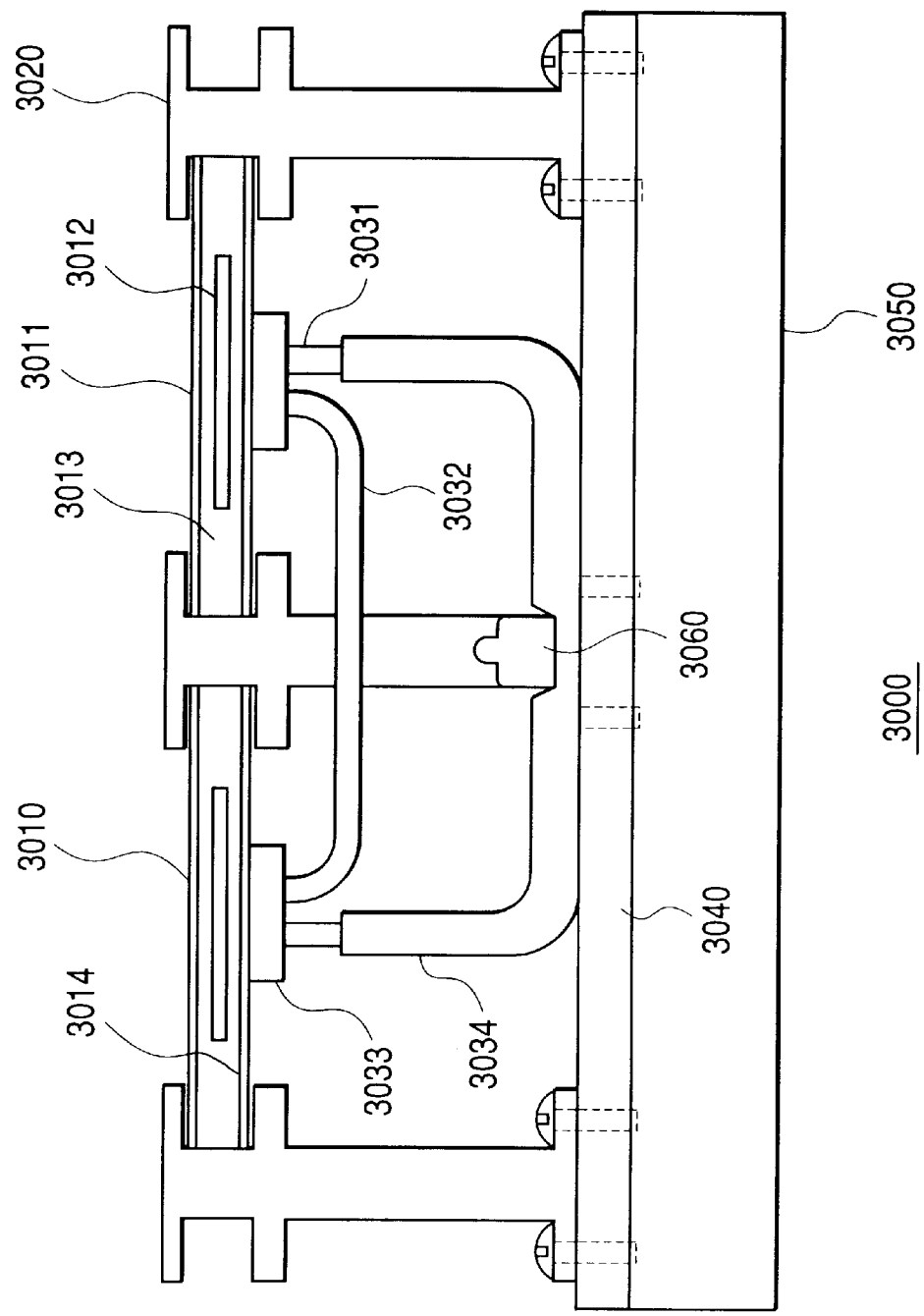

Example 14 is described below in detail with reference to FIG. 30.

The solar cell element comprised a crystalline silicon solar cell. Grid electrodes were attached to the cell element and two crystalline silicon solar cell elements were connected in series. A solar cell module 3010 was produced by sealing the series-connected crystalline silicon solar cells 3012 with a glass surface material 3011, a back sealing material 3014 consisting of an aluminum foil sandwiched with moisture-resistant fluorine resin, and EVA 3013 as a filler.

In the terminal draw-out portion of the solar cell module, two terminal draw-out holes were opened in an aluminum foil sandwiched with moisture-resistant fluorine resin (Tedler (Du Pont Company)/aluminum foil/Tedler), and plus and minus electrodes were drawn out through the holes, similarly as in Example 1.

A terminal draw-out box 3033 and electric connecting members 3031 and 3032 were attached similarly as in Example 1.

Then, the two solar cell modules 3010 were sandwiched with frames 3020, which were then mounted on an underlaying material 3040 and a substrate material 3050.

The two solar cell modules were electrically connected using the electric connecting members 3031 and 3032. The two solar cell modules were electrically connected in series similarly as in Example 1.

A load resistor was then connected as in Example 1 inside the terminal box 3033 to allow the solar cells to operate at an operating point close to an optimal one.

To ensure that the electric connecting member 3031 and the underlaying material 3040 contacted each other, a weight 3060 was placed on the electric connecting member 3031. In this condition, an acceleration test was conducted in which the solar cell modules were assumed to be exposed to sunlight or winds or rain outdoors, for example, on the roof over a long period of time, similarly as in Example 1. The outputs from the solar cell modules were measured before and after the acceleration test. "600-V Crosslinked Polyethylene Insulated Vinyl Sheath Power Cables (600 V CV)" consisting of a conductor having a 2 mm$^2$ cross-section were used as the electric connecting members, "Sumi Tube" was used as the polyolefin tube, a water-tight asphalt sheet, a vinyl chloride sheet, a polyurethane thermal insulation material, a polystyrene thermal insulation material, a cemented excelsior board, and water-tight plywood were used as the underlaying material and/or substrate material 3040, and a polyolefin tube 3034 was used as non-contact means. These materials were arbitrarily combined.

The specific materials used were the same as in Example 1. The results are shown below.

When no non-contact means was used, all solar cell modules short-circuited and failed to provide output after the acceleration test, similarly as in Example 1.

When the polyolefin tube was used as the non-contact means, the outputs from the solar cell modules did not decrease after the acceleration test regardless of the type of underlaying material and/or substrate material, similarly as in Example 1.

When the substrate material comprised a cemented excelsior board or moisture-resistant plywood, the output from the solar cell module did not decrease after the acceleration test, similarly as in Example 1.

Those solar cell modules which did not provide outputs after the acceleration test were analyzed to find that the covering material of the electric connecting member for the solar cell module was notably hardened causing the electric connecting member to partially crack.

When the terminal draw-out boxes for these solar cell modules were opened to observe the inside, it was found that the terminal draw-out portion of the solar cell module was wetted, thereby causing an electric short-circuit between the plus- and minus-terminal wires exposed in the terminal draw-out hole, similarly as in Example 1.

Example 15

Solar cell modules were produced in the same manner as in Example 14 except that the solar cell element comprised polycrystalline silicon instead of crystalline silicon. Two solar cell modules were sandwiched with the frames 3020, which were then mounted on the underlaying material 3040 and the substrate material 3050. An acceleration test was conducted similarly as in Example 14.

When no non-contact means was used and the underlaying material comprised a water-tight asphalt sheet, a vinyl chloride sheet, a polyurethane thermal insulation material, or a polystyrene thermal insulation material, almost no output was obtained by the solar cell module after the acceleration test.

In the case of the other combinations, few decreases in output were found after the acceleration test.

In Example 15, those solar cell modules which did not provide outputs after the acceleration test were also analyzed to find that the terminal draw-out portion of the solar cell module was wetted, thereby causing an electric short-circuit between the plus- and minus-terminal wires exposed in the terminal draw-out hole.

Example 16

Figure 31:
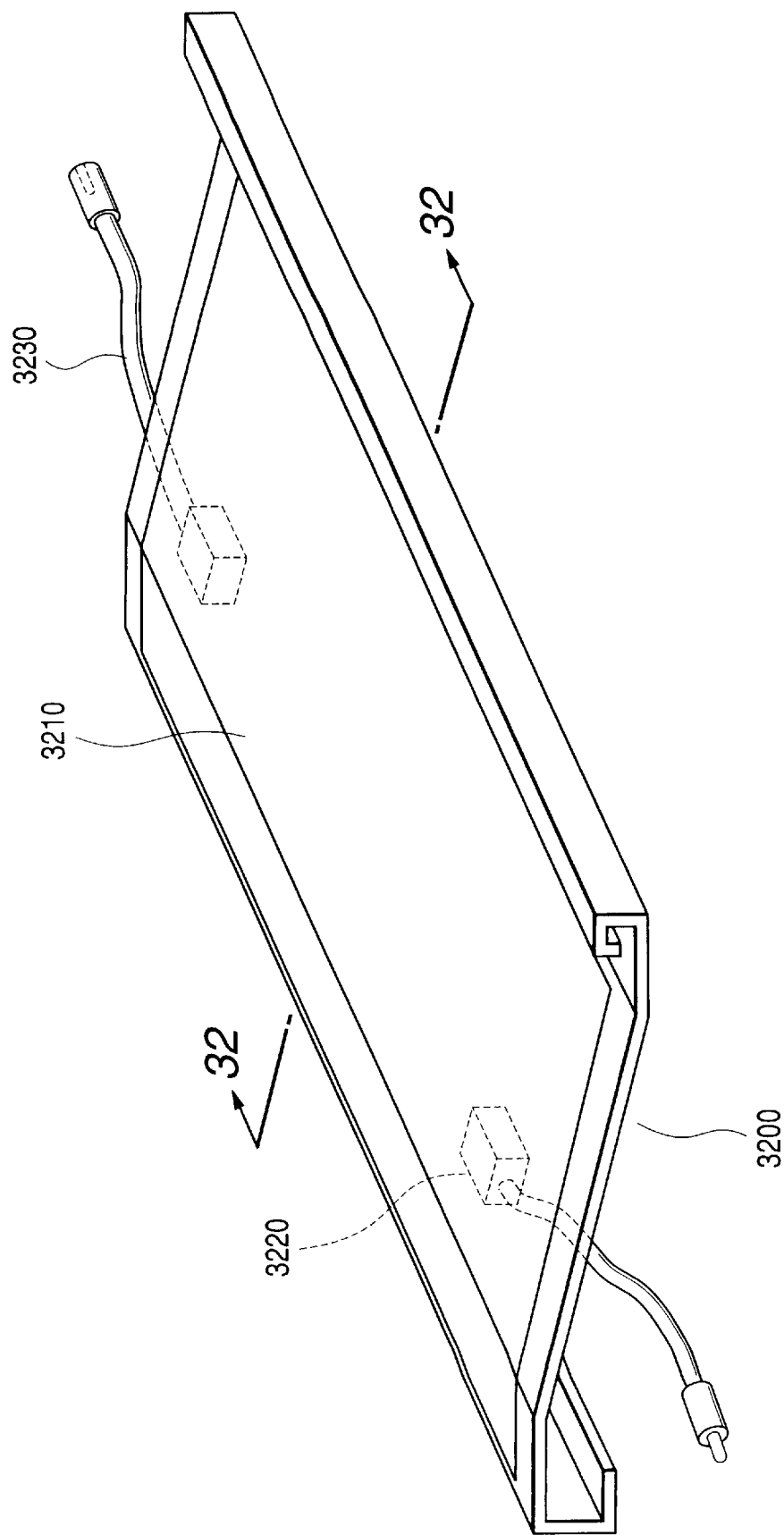
Figure 32:
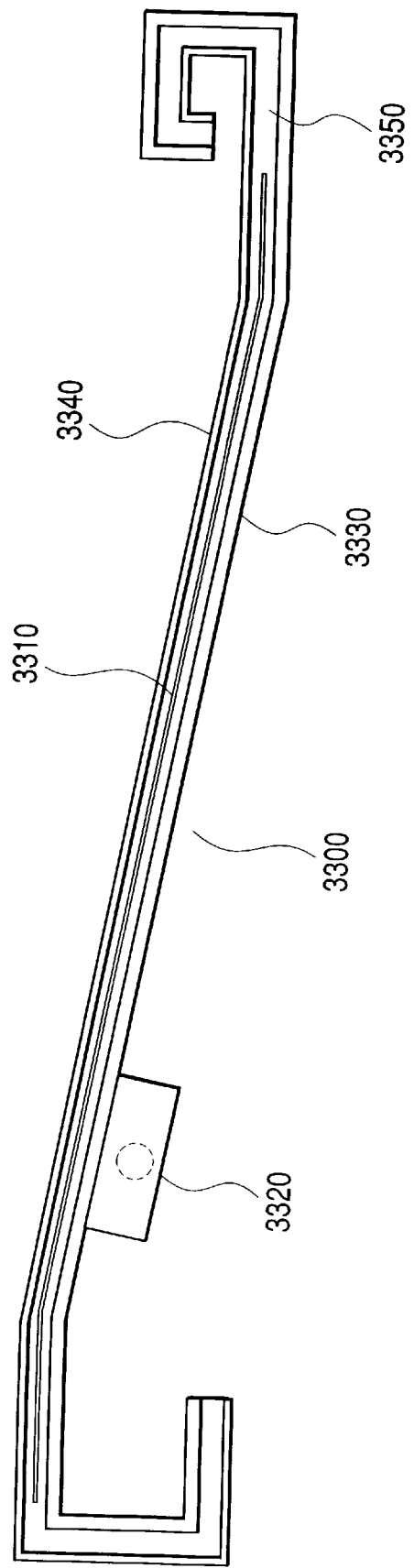
FIG. 32 is a schematic sectional view of the enclosure.
Figure 33:
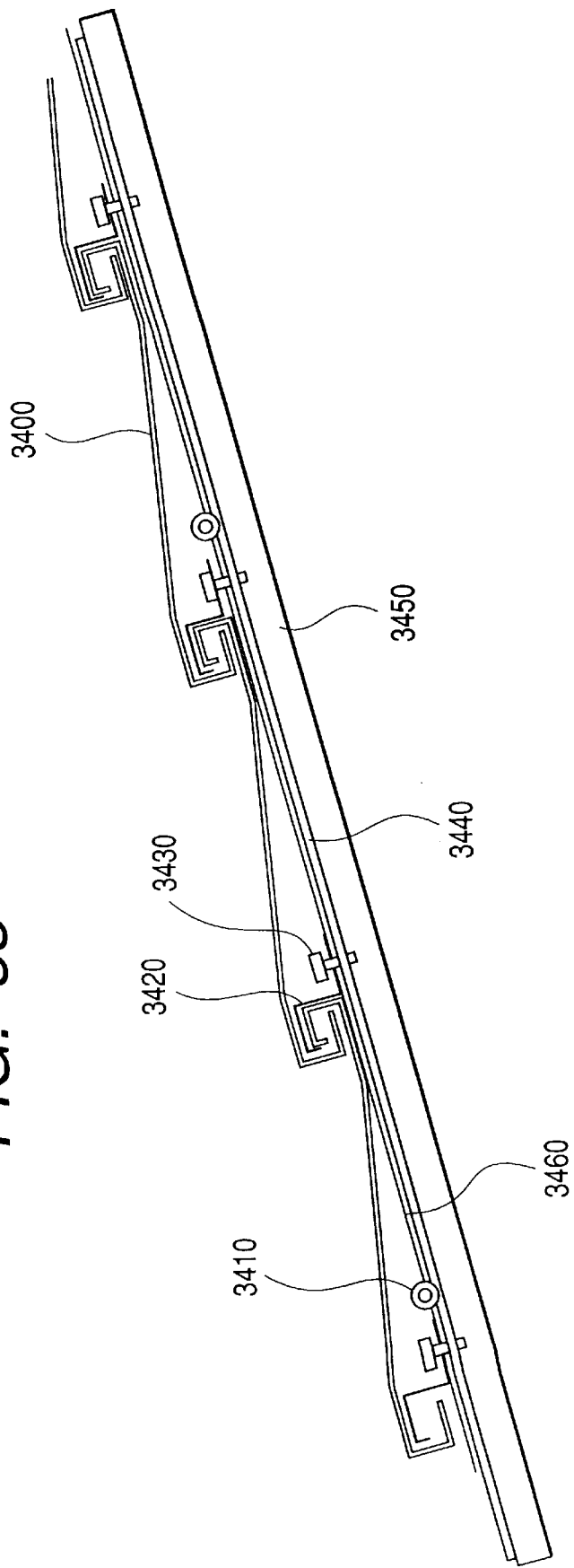

Unlike Example 1 that bends the solar cell module like a ribbed seam roof type as shown in FIG. 7, in this example the module was bent into a lateral laying shape, as shown in FIGS. 31 and 32, and a plurality of lateral laying type solar cell modules 3400 were directly installed on a water-tight asphalt sheet 3440 laid on a roof board 3450 as shown in FIG. 33.

FIG. 32 is a cross-sectional view of a lateral laying type solar cell module 3200 taken along the line 32—32 of FIG. 31. In FIG. 32, 3330 is a galbarium steel plate of 0.4 mm thick; 3310 is the same amorphous silicon solar cell as in the Example 1; 3350 is an EVA; and 3340 is a fluorine resin film. Reference numeral 3320 denotes a terminal box.

The lateral laying type solar cell modules 3400 installed in the vertical direction were fixed by metal suspension devices 3420, which were directly fixed to the water-tight asphalt sheet 3440 and the roof board 3450 using bolts 3430.

Figure 34:
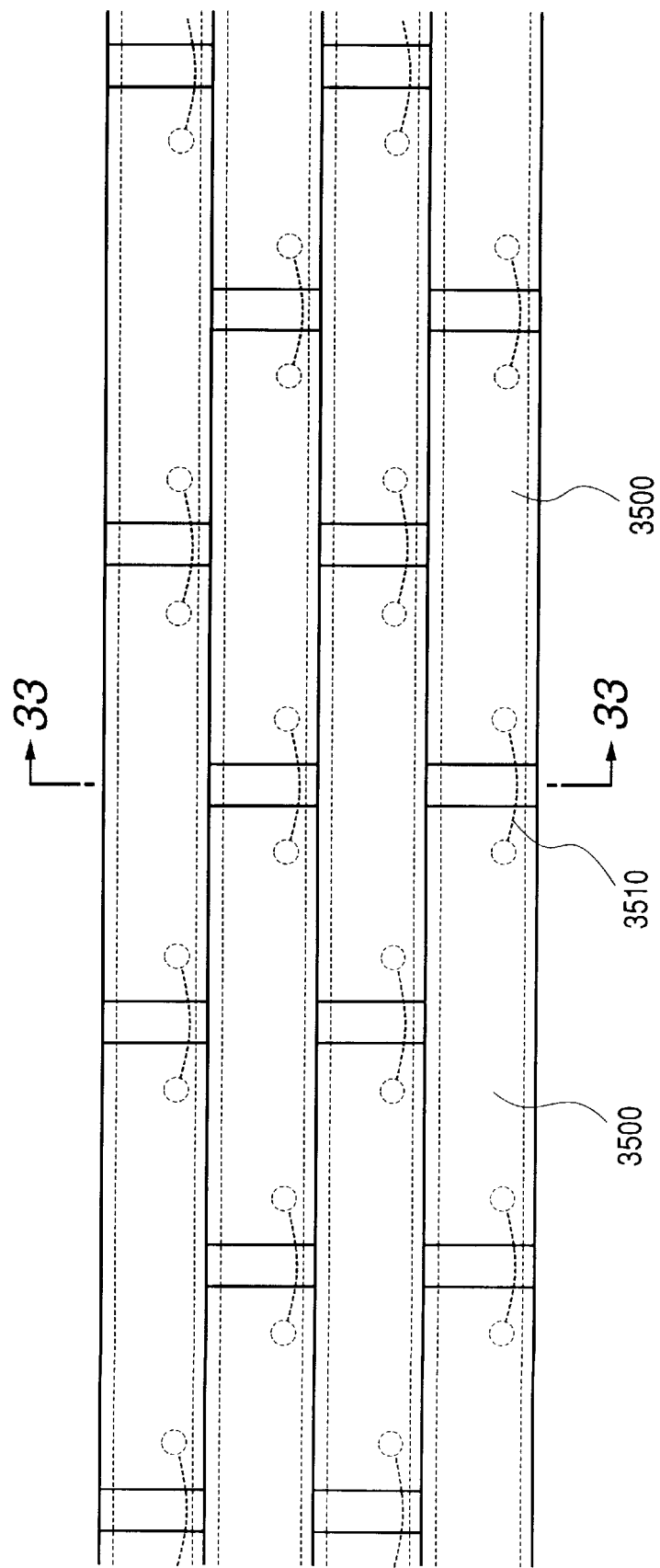

FIG. 34 is a top view showing a plurality of installed lateral laying type solar cell modules 3500. The adjacent solar cell modules were electrically connected by directly installing CV cables 3510 on the water-tight asphalt sheet 3440 having a polyethylene film 3560 laid thereon.

As shown in this example, this invention enables solar cell modules integrated with a construction material to be directly installed on an organic water-tight sheet such as a water-tight asphalt sheet on the roof board without the need for frames or spacer members and enables electric connecting members for solar cell modules to be installed on the organic water-tight sheet in a non-contact manner using a narrow space between the organic water-tight sheet and the solar cell module integrated with a construction material.

Example 17

Figure 35:
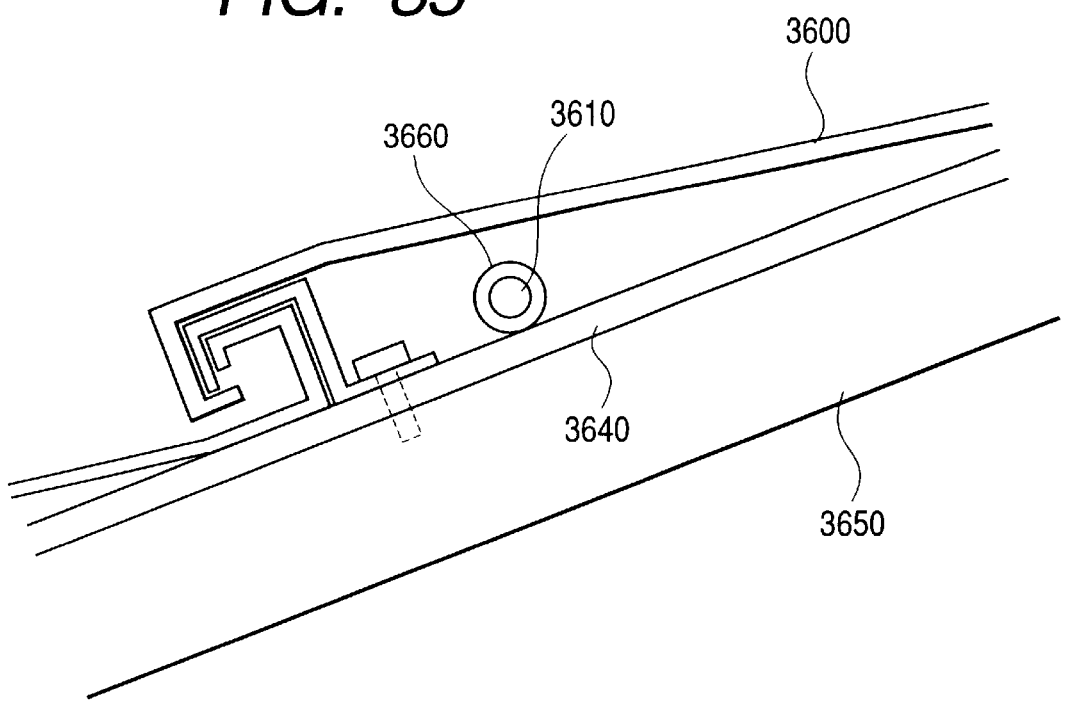

In this example a polyester tape was used as a non-contact means 3660 to conduct similar experiments (FIG. 35). As shown in Table 3, when the polyester tape was used as a non-contact means, the outputs from solar cell modules 3600 did not decrease after the acceleration test regardless of the type of underlaying material 3640 and substrate material 3650.

Example 18

Figure 36:
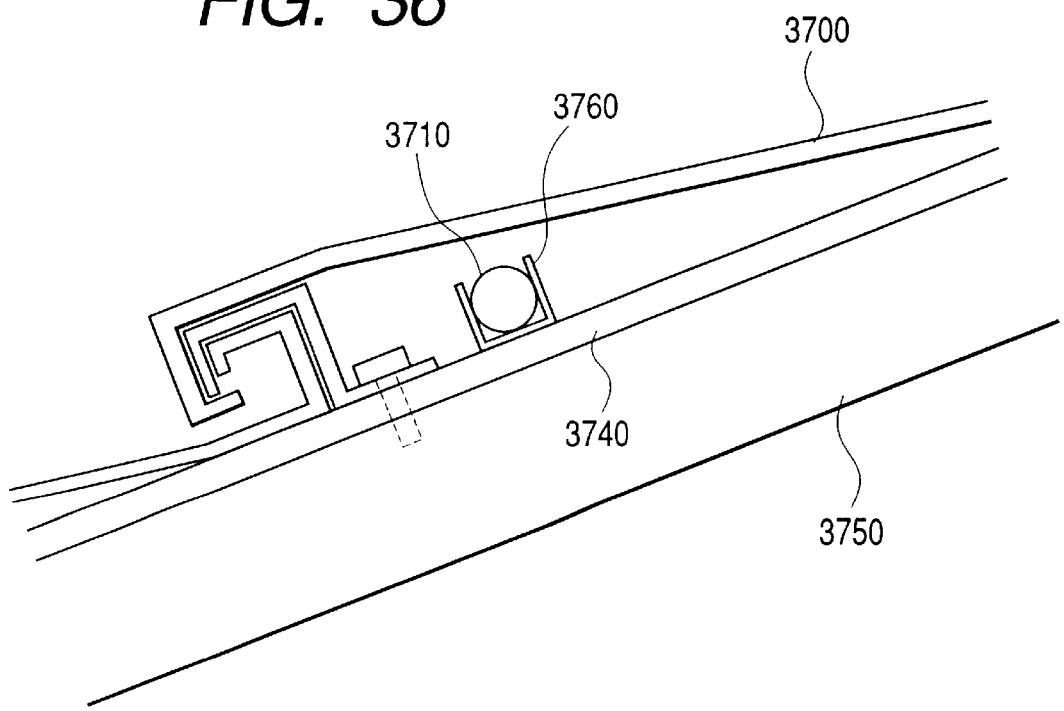

In this example a "cutting duct" of nylon 6 acting as an electric path supporting material was used as a non-contact means 3760 to conduct similar experiments (FIG. 36). As shown in Table 4, when the "cutting duct" was used as a non-contact means, the outputs from solar cell modules 3700 did not decrease after the acceleration test regardless of the type of underlaying material 3740 and substrate material 3750.

Example 19

Figure 37:
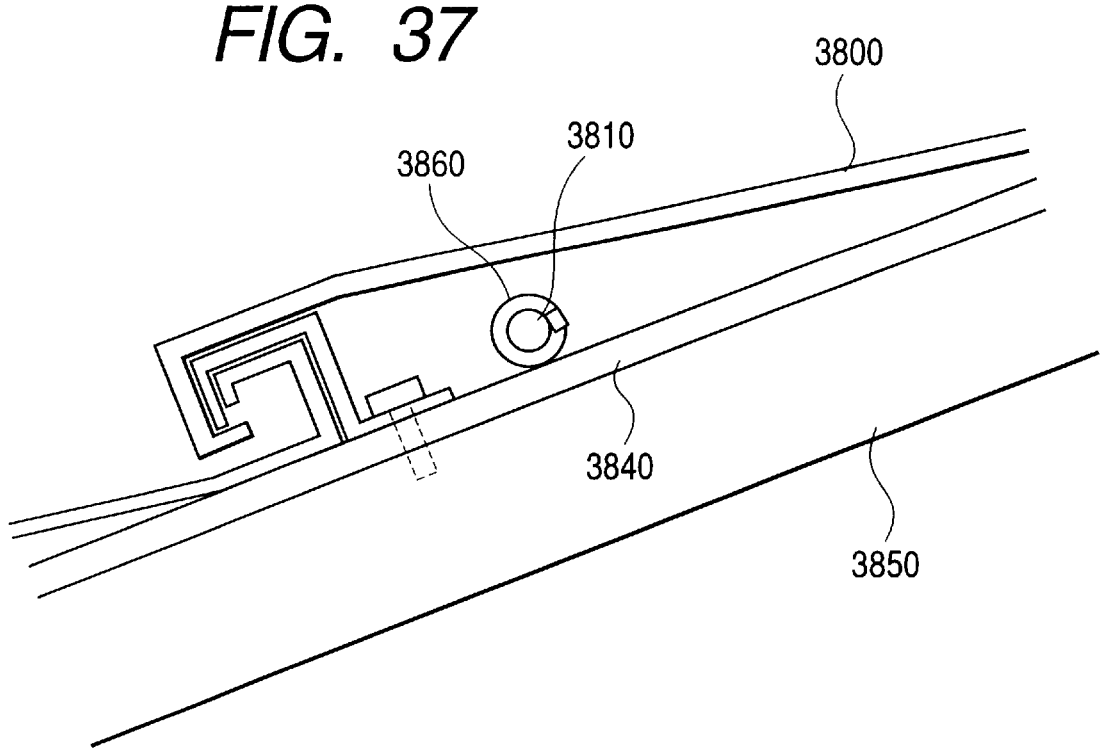

In this example, Insulok Tie acting as a wiring binding device 3860 was tightened around electric connecting members as shown in FIG. 12B to arrange the electric connecting members 3810 above the underlaying material (FIG. 37). As shown in Table 5, the outputs from solar cell modules 3800 did not decrease after the acceleration test regardless of the type of underlaying material 3840 and substrate material 3850.

Example 20

Figure 38:
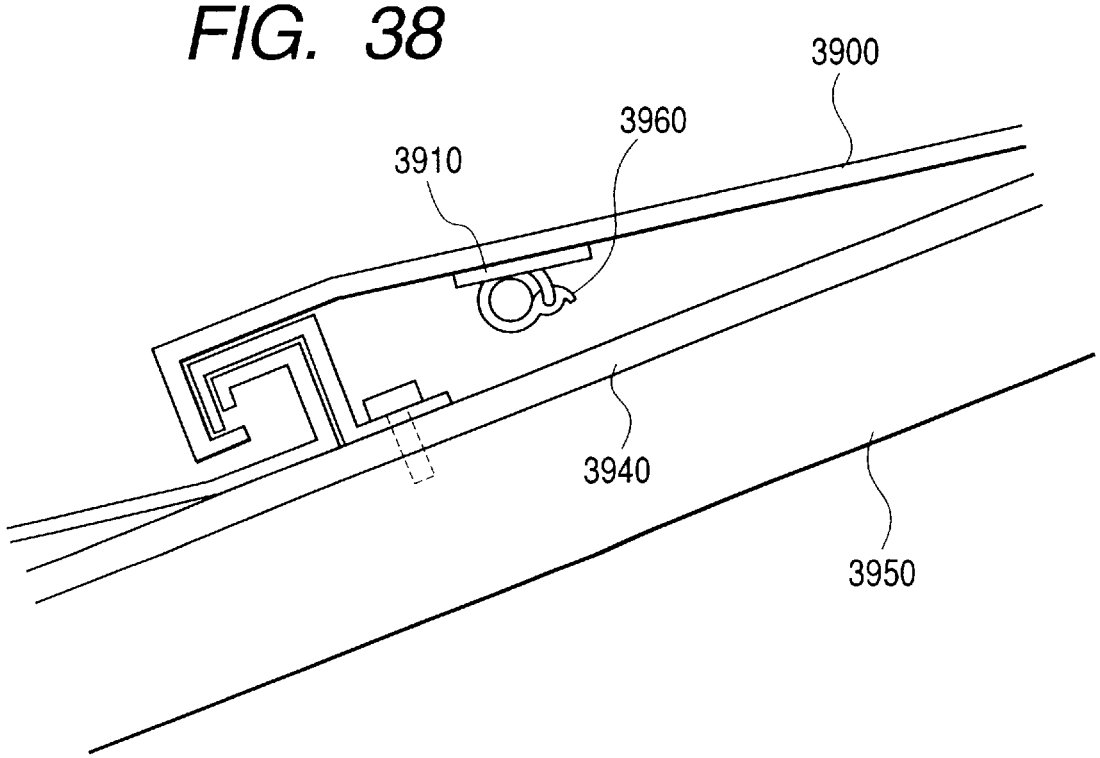

This example was conducted similarly as in Example 1, except that a "wire clip" acting as a wiring binding device 3960 was stuck to the back surface of a solar cell module 3900 and electric connecting members 3910 were fixed thereto to provide a non-contact means comprising the space between the electric connecting members and an underlaying material 3940 before conducting similar experiments (FIG. 38). As shown in Table 6, the outputs from solar cell modules 3900 did not decrease after the acceleration test regardless of the type of underlaying material 3940 and substrate material 3950.

Example 21

Figure 39:
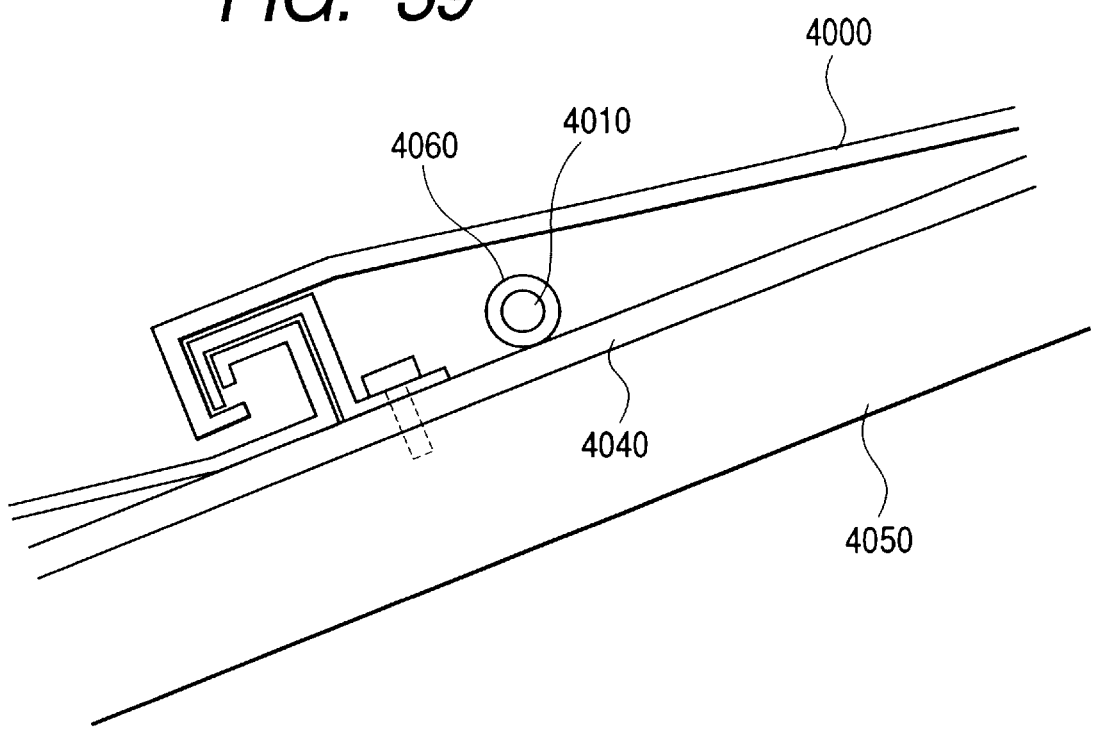

This example was conducted similarly as in Example 1, except that an electric connecting member 4010 previously coated with a polyester resin based paint 4060 was placed below the back surface of a solar cell module 4000 before similar experiments were conducted (FIG. 39). As shown in Table 7, the outputs from solar cell modules 4000 did not decrease after the acceleration test regardless of the type of underlaying material 4040 and substrate material 4050.

Example 22

Figure 40:
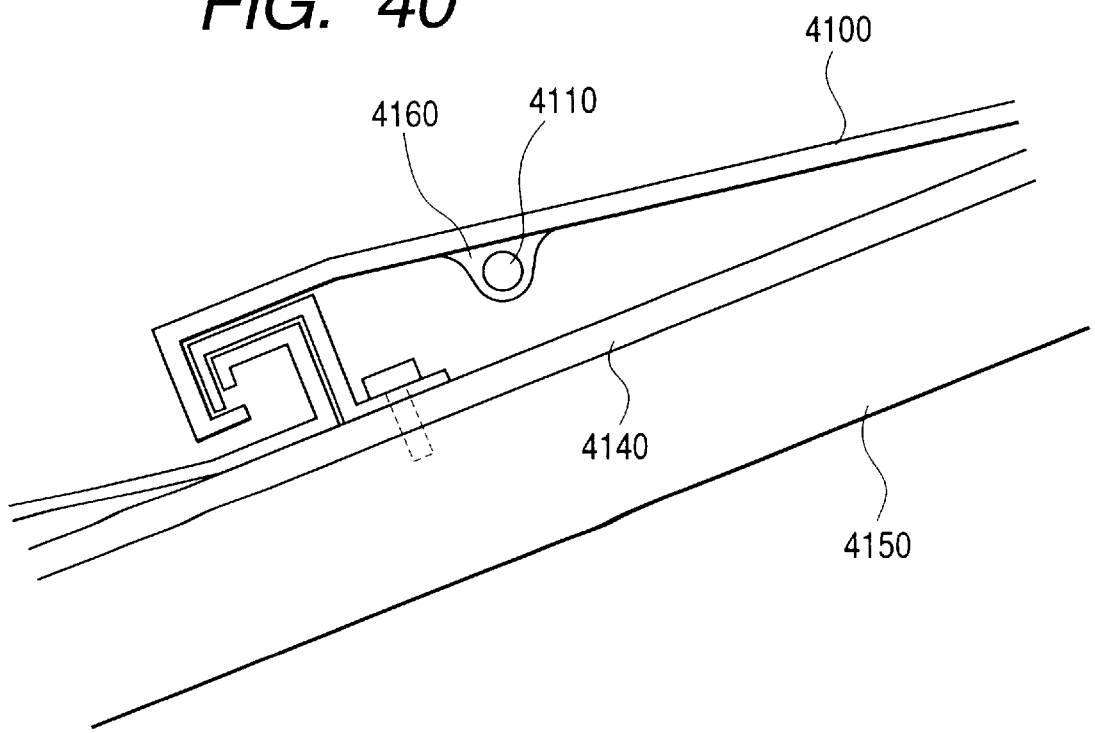

This example was conducted similarly as in Example 1, except that an electric connecting member 4110 was fixed with the adhesive "SH780" to the back surface of a solar cell module 4100 before similar experiments were conducted (FIG. 40). As shown in Table 8, the outputs from solar cell modules 4100 did not decrease after the acceleration test regardless of the type of underlaying material 4140 and substrate material 4150.

TABLE 1

Output holding rate of solar cells after the acceleration test

| Non-contact means | Present/absent | Water-tight asphalt sheet | Vinyl chloride sheet | polyurethane thermal insulation material | polystyrene thermal insulation material | Cemented excelsior board | Moisture-resistant plywood |
|---|---|---|---|---|---|---|---|
| | | Output holding rate in case of using each substrate material (%) | | | | | |
| Polyolefin tube | Present | 96 | 96 | 98 | 99 | 96 | 97 |
| | Absent | 5 | 3 | 2 | 7 | 98 | 97 |

TABLE 2

Output holding rate of solar cells after the acceleration test after drying by drier

| Non-contact means | Present/absent | Water-tight asphalt sheet | Vinyl chloride sheet | polyurethane thermal insulation material | polystyrene thermal insulation material |
|---|---|---|---|---|---|
| | | Output holding rate in case of using each substrate material (%) | | | |
| Polyolefin tube | Absent | 78 | 83 | 80 | 85 |

TABLE 3

Output holding rate of solar cells after the acceleration test

Output holding rate in case of using each substrate material (%)

| Non-contact means | Present/absent | Water-tight asphalt sheet | Vinyl chloride sheet | polyurethane thermal insulation material | polystyrene thermal insulation material | Cemented excelsior board | Moisture-resistant plywood |
|---|---|---|---|---|---|---|---|
| Poly-ester tape | Present | 98 | 98 | 101 | 99 | 100 | 97 |
| | Absent | 1 | 5 | 2 | 5 | 98 | 100 |

TABLE 4

Output holding rate of solar cells after the acceleration test

Output holding rate in case of using each substrate material (%)

| Non-contact means | Present/absent | Water-tight asphalt sheet | Vinyl chloride sheet | polyurethane thermal insulation material | polystyrene thermal insulation material | Cemented excelsior board | Moisture-resistant plywood |
|---|---|---|---|---|---|---|---|
| Cutting duct | Present | 101 | 99 | 96 | 102 | 100 | 100 |
| | Absent | 4 | 5 | 6 | 10 | 96 | 98 |

TABLE 5

Output holding rate of solar cells after the acceleration test

Output holding rate in case of using each substrate material (%)

| Non-contact means | Present/absent | Water-tight asphalt sheet | Vinyl chloride sheet | polyurethane thermal insulation material | polystyrene thermal insulation material | Cemented excelsior board | Moisture-resistant plywood |
|---|---|---|---|---|---|---|---|
| Insulok Tie | Present | 98 | 99 | 101 | 100 | 98 | 98 |
| | Absent | 4 | 2 | 5 | 3 | 100 | 99 |

TABLE 6

Output holding rate of solar cells after the acceleration test

Output holding rate in case of using each substrate material (%)

| Non-contact means | Present/absent | Water-tight asphalt sheet | Vinyl chloride sheet | polyurethane thermal insulation material | polystyrene thermal insulation material | Cement excelsior board | Moisture-resistant plywood |
|---|---|---|---|---|---|---|---|
| Wire clip | Present | 99 | 98 | 99 | 97 | 100 | 101 |
| | Absent | 6 | 4 | 7 | 5 | 97 | 99 |

TABLE 7

Output holding rate of solar cells after the acceleration test

Output holding rate in case of using each substrate material (%)

| Non-contact means | Present/absent | Water-tight asphalt sheet | Vinyl chloride sheet | polyurethane thermal insulation material | polystyrene thermal insulation material | Cemented excelsior board | Moisture-resistant plywood |
|---|---|---|---|---|---|---|---|
| Polyester based resin paint | Present | 99 | 100 | 102 | 97 | 100 | 101 |
|  | Absent | 8 | 8 | 2 | 5 | 100 | 99 |

TABLE 8

Output holding rate of solar cells after the acceleration test

Output holding rate in case of using each substrate material (%)

| Non-contact means | Present/absent | Water-tight asphalt sheet | Vinyl chloride sheet | polyurethane thermal insulation material | polystyrene thermal insulation material | Cemented excelsior board | Moisture-resistant plywood |
|---|---|---|---|---|---|---|---|
| Adhesive (SH780) | Present | 101 | 100 | 99 | 101 | 100 | 98 |
|  | Absent | 8 | 8 | 7 | 2 | 101 | 99 |

As described above, this invention provides a non-contact space for electric connecting members to install a plurality of solar cell modules above an underlaying material and/or a substrate material and/or a rear material, thereby providing an enclosure with solar cells having an underlaying material and/or a substrate material and/or a rear material which have excellent heat resistance, thermal insulation and weatherproofness; and electric connecting members having excellent weatherproofness and durability.

When the underlaying material and/or substrate material and/or rear material contacts the electric connecting members, a non-contact means such as a tube, a film, a tape, an electric path supporting material, a wiring binding device, a paint, an adhesive, or a pressure sensitive adhesive can be installed between the underlaying material and/or substrate material and/or rear material and the electric connecting members to provide an enclosure with solar cells that is reliable over a long period of time even when the casing material of the electric connecting members comprises vinyl chloride.

In addition, the electric connecting members for solar cell modules installed above the underlaying material and/or substrate material and/or rear material can also be laid on or above the underlaying material and/or substrate material and/or rear material so as not to contact these materials, thereby allowing the length of the electric connecting member of the solar cell module to be increased. Thereby, when the solar cell modules are installed on or above the underlaying material and/or substrate material and/or rear material, excessive force can be prevented from being exerted on the connection between the solar cell member and the electric connecting member, thereby improving the workability of the solar cell modules.

Furthermore, due to the above effects, the solar cell enclosure according to this invention can be installed in such a manner that the solar cell modules do not contact the underlaying material and/or substrate material and/or rear material and the electric connecting members which are located behind the solar cell modules, and the space between the underlaying material and/or substrate material and/or rear material and the electric connecting members can be reduced. As a result, solar cell modules of a lateral laying covering shape or the like can be directly installed on the underlaying material and/or substrate material and/or rear material. This configuration can provide a new type of solar cell module that can be directly installed on the underlaying material and/or substrate material and/or rear material as solar cell modules integrated with a construction material, without the need for frames or spacer members between the modules and the underlaying material and/or substrate material and/or rear material, and that allow the electric connecting members to be passed through even a narrow space.

Furthermore, this invention prevents the electric connecting members for current collection from the solar cell modules from cracking when the electric connecting members are drawn into the house through through-holes opened in the underlaying material and/or substrate material and/or rear material, thereby improving reliability.

What is claimed is:

1. An enclosure with solar cells comprising an underlaying material or a substrate material disposed on the back side of a solar cell module outputting electricity through electric connecting members, each of which comprises a wire and a sheath material, and a non-contact space provided between the sheath material and the underlaying material or the substrate material, wherein the sheath material encases the wire, is not in contact with the underlaying material or the substrate material, and comprises a vinyl chloride resin, and wherein the underlaying material or the substrate material comprises one selected from asphalt based roofing, roofing comprising asphalt containing a rubber or a resin, vinyl chloride resin based roofing, polystyrene based resin, and polyurethane based resin.

2. An enclosure with solar cells according to claim 1, wherein said electric connecting members attached to said solar cell module are used for plus and minus terminals, respectively, and have the same length.

3. An enclosure with solar cells according to claim 1, wherein said electric connecting member consists of a lead and connectors.

4. An enclosure with solar cells according to claim 1, wherein the solar cell module comprises a solar cell element and wherein a photoactive member constituting the solar cell element comprises an amorphous silicon semiconductor.

5. An enclosure with solar cells according to claim 4, wherein the solar cell element is buried in a filler between a back reinforcing plate and a light-transmitting film.

6. An enclosure with solar cells according to claim 5, wherein said back reinforcing plate has a dark color based casing.

7. A sunlight generating apparatus comprising the enclosure with solar cells according to claim 1 and a power conversion means.

8. A method for installing an enclosure with solar cells which comprises:
   disposing an underlaying material or a substrate material on the back side of a solar cell module outputting electricity through electric connecting members, each of which comprises a wire and a sheath material, and
   providing a non-contact space between the sheath material and the underlaying material or the substrate material to complete the installation of the enclosure,
   wherein the sheath material encases the wire, is not in contact with the underlaying material or the substrate material, and comprises a vinyl chloride resin, and
   wherein the underlaying material or the substrate material comprises one selected from asphalt based roofing, roofing comprising asphalt containing a rubber or a resin, vinyl chloride resin based roofing, polystyrene based resin, and polyurethane based resin.

9. A method for installing an enclosure with solar cells according to claim 8, wherein the electric connecting members connecting the solar cell module to a collecting box provided in a house are drawn into the house through through-holes opened in the underlaying material or the substrate material, and wherein a non-contact space is provided between the electric connecting members and the underlaying material or the substrate material.

10. A solar cell module comprising an underlaying material or a substrate material disposed on the back side of a solar cell module outputting electricity through electric connecting members, each of which comprises a wire and a sheath material, and a non-contact means provided between the sheath material and the underlaying material or the substrate material,
   wherein the sheath material encases the wire, is not in contact with the underlaying material or the substrate material, and comprises a vinyl chloride resin, and
   wherein the underlaying material or the substrate material comprises one selected from asphalt based roofing, roofing comprising asphalt containing a rubber or a resin, vinyl chloride resin based roofing, polystyrene based resin, and polyurethane based resin.

11. A solar cell module according to claim 10, wherein said non-contact means is a tube for covering said electric connecting members.

12. A solar cell module according to claim 10, wherein said non-contact means is a film sheet.

13. A solar cell module according to claim 10, wherein said non-contact means is a tape.

14. A solar cell module according to claim 10, wherein said non-contact means is an electric path supporting material.

15. A solar cell module according to claim 10, wherein said non-contact means is a wiring binding device.

16. A solar cell module according to claim 10, wherein said non-contact means is a paint.

17. A solar cell module according to claim 10, wherein said non-contact means is an adhesive or a pressure sensitive adhesive.

18. A solar cell module according to claim 10, wherein the solar cell module comprises a solar cell element and wherein a photoactive member constituting the solar cell element comprises an amorphous silicon semiconductor.

19. A solar cell module according to claim 18, wherein the solar cell element is buried in a filler between a back reinforcing plate and a light-transmitting film.

20. A solar cell module according to claim 19, wherein said back reinforcing plate has a dark color based casing.

21. A solar cell module according to claim 10, wherein said electric, connecting members attached to said solar cell module are used for plus and minus terminals, respectively, and have the same length.

22. A solar cell module according to claim 10, wherein said electric connecting member consists of a lead and connectors.

23. An enclosure with solar cells comprising an underlaying material or a substrate material disposed on the back side of a solar cell module outputting electricity through electric connecting members, each of which comprises a wire and a sheath material, and a non-contact means provided between the sheath material and the underlaying material or the substrate material,
   wherein the sheath material encases the wire, is not in contact with the underlaying material or the substrate material, and comprises a vinyl chloride resin, and
   wherein the underlaying material or the substrate material comprises one selected from asphalt based roofing, roofing comprising asphalt containing a rubber or a resin, vinyl chloride resin based roofing, polystyrene based resin, and polyurethane based resin.

24. An enclosure with solar cells according to claim 23, wherein said non-contact means is a tube for covering said electric connecting members.

25. An enclosure with solar cells according to claim 23, wherein said non-contact means is a film sheet.

26. An enclosure with solar cells according to claim 23, wherein said non-contact means is a tape.

27. An enclosure with solar cells according to claim 23, wherein said non-contact means is an electric path supporting material.

28. An enclosure with solar cells according to claim 23, wherein said non-contact means is a wiring binding device.

29. An enclosure with solar cells according to claim 23, wherein said non-contact means is a paint.

30. An enclosure with solar cells according to claim 23, wherein said non-contact means is an adhesive or a pressure sensitive adhesive.

31. An enclosure with solar cells according to claim 23, wherein the solar cell module comprises a solar cell element and wherein a photoactive member constituting the solar cell element comprises an amorphous silicon semiconductor.

32. An enclosure with solar cells according to claim 31, wherein the solar cell element is buried in a filler between a back reinforcing plate and a light-transmitting film.

33. An enclosure with solar cells according to claim 32, wherein said back reinforcing plate has a dark color based casing.

34. An enclosure with solar cells according to claim 23, wherein said electric connecting members attached to said solar cell module are used for plus and minus terminals, respectively, and have the same length.

35. An enclosure with solar cells according to claim 23, wherein said electric connecting member consists of a lead and connectors.

36. A sunlight generating apparatus comprising the enclosure with solar cells according to claim 23 and a power conversion means.

37. A method for installing an enclosure with solar cells which comprises:
   disposing an underlaying material or a substrate material on the back side of a solar cell module outputting electricity through electric connecting members, each of which comprises a wire and a sheath material, and
   arranging the electric connecting members by using a non-contact means between the electric connecting members and the underlaying material or the substrate material so that the sheath material does not contact the underlaying material or the substrate material,
   wherein the sheath material encases the wire and comprises a vinyl chloride resin, and
   wherein the underlaying material or the substrate material comprises one selected from asphalt based roofing, roofing comprising asphalt containing a rubber or a resin, vinyl chloride resin based roofing, polystyrene based resin, and polyurethane based resin.

38. A method for installing an enclosure with solar cells according to claim 37, wherein the electric connecting members connecting the solar cell module to a collecting box provided in a house are drawn into the house through through-holes opened in the underlaying material or the substrate material, and wherein a non-contact means is provided between the electric connecting members and the underlaying material or the substrate material.

39. A solar cell module comprising a rear material disposed on the back side of a solar cell module outputting electricity through electric connecting members, each of which comprises a wire and a sheath material, and a non-contact space provided between the sheath material and the rear material,
   wherein the sheath material encases the wire, is not in contact with the rear material, and comprises a vinyl chloride resin, and
   wherein the rear material comprises one selected from polystyrene based rear material, polyurethane based rear material, vinyl chloride based rear material, and asphalt based rear material.

40. A solar cell module with a rear material according to claim 39, wherein the non-contact space is provided by cutting out the rear material in the wiring site of said electric connecting members.

41. A solar cell module with a rear material according to claim 39, wherein the non-contact space is provided by separating said rear material into a plurality of pieces.

42. A solar cell module with a rear material according to claim 39, wherein the solar cell module comprises a solar cell element and wherein a photoactive member constituting the solar cell element comprises an amorphous silicon semiconductor.

43. A solar cell module with a rear material according to claim 42, wherein the solar cell element is buried in a filler between a back reinforcing plate and a light-transmitting film.

44. A solar cell module with a rear material according to claim 43, wherein said back reinforcing plate has a dark color based casing.

45. A solar cell module with a rear material according to claim 39, wherein said electric connecting members attached to said solar cell module are used for plus and minus terminals, respectively, and have the same length.

46. A solar cell module with a rear material according to claim 39, wherein said electric connecting member consists of a lead and connectors.

47. An enclosure with solar cells which comprises a rear material disposed on the back side of a solar cell module outputting electricity through electric connecting members, each of which comprises a wire and a sheath material, and a non-contact space provided between the sheath material and the rear material,
   wherein the sheath material encases the wire, is not in contact with the rear material, and comprises a vinyl chloride resin, and
   wherein the rear material comprises one selected from polystyrene based rear material, polyurethane based rear material, vinyl chloride based rear material, and asphalt based rear material.

48. An enclosure with solar cells according to claim 47, wherein the non-contact space is provided by cutting out the rear material in the wiring site of said electric connecting members.

49. An enclosure with solar cells according to claim 47, wherein the non-contact space is provided by separating said rear material into a plurality of pieces.

50. An enclosure with solar cells according to claim 47, wherein the solar cell module comprises a solar cell element and wherein a photoactive member constituting the solar cell element comprises an amorphous silicon semiconductor.

51. An enclosure with solar cells according to claim 50, wherein the solar cell element is buried in a filler between a back reinforcing plate and a light-transmitting film.

52. An enclosure with solar cells according to claim 51, wherein said back reinforcing plate has a dark color based casing.

53. An enclosure with solar cells according to claim 47, wherein said electric connecting members attached to said solar cell module have the same length.

54. An enclosure with solar cells according to claim 47, wherein said electric connecting member consists of a lead and connectors.

55. A sunlight generating apparatus comprising the enclosure with solar cells according to claim 47 and a power conversion means.

56. A method for installing a solar cell module with a rear material in an enclosure for solar cells which comprises:
   disposing an underlaying material or a substrate material on the back side of a solar cell module outputting electricity through electric connecting members, each of which comprises a wire and a sheath material, wherein a non-contact space is provided between the sheath material and the underlaying material or the substrate material or the rear material to complete the installation of the enclosure,
   wherein the sheath material encases the wire, is not in contact with the underlaying material, the substrate material or the rear material, and comprises a vinyl chloride resin,
   wherein the rear material comprises one selected from polystyrene based rear material, polyurethane based rear material, vinyl chloride based rear material, and asphalt based rear material, and wherein the underlaying material or the substrate material comprises one selected from asphalt based roofing, roofing comprising asphalt containing a rubber or a resin, vinyl chloride resin based roofing, polystyrene based resin, and polyurethane based resin.

57. A method for installing a solar cell module with a rear material in an enclosure for solar cells according to claim 56, wherein the electric connecting members connecting the solar cell module to a collecting box provided in a house are drawn into the house through through-holes opened in the underlaying material or the substrate material, and wherein a non-contact space is provided between the electric connecting members and the underlaying material or substrate material or the rear material.

58. A method for installing a solar cell module in an enclosure for solar cells which comprises:
   placing a rear material between the solar cell module and an underlaying material or the substrate material,
   using electric connecting members, each of which comprises a wire and a sheath material, to electrically connect a plurality of solar cell modules outputting electricity from a non-light-receiving surface side through the electric connecting members, and
   providing a non-contact space between the sheath material and the underlaying material or the substrate material or the rear material,
   wherein the sheath material encases the wire, is not in contact with the underlaying material, the substrate material or the rear material, and comprises a vinyl chloride resin,
   wherein the rear material comprises one selected from polystyrene based rear material, polyurethane based rear material, vinyl chloride based rear material, and asphalt based rear material, and
   wherein the underlaying material or the substrate material comprises one selected from asphalt based roofing, roofing comprising asphalt containing a rubber or a resin, vinyl chloride resin based roofing, polystyrene based resin, and polyurethane based resin.

59. A method for installing a solar cell module in an enclosure for solar cells according to claim 58, wherein the electric connecting members connecting the solar cell module to a collecting box provided in a house are drawn into the house through through-holes opened in the underlaying material or the substrate material, and wherein a non-contact space is provided between the electric connecting members and the underlaying material or the substrate material or the rear material.

60. A solar cell module comprising a rear material disposed on the back side of a solar cell module outputting electricity through electric connecting members, each of which comprises a wire and a sheath material, and a non-contact means provided between the sheath material and the rear material,
   wherein the sheath material encases the wire, is not in contact with the rear material, and comprises a vinyl chloride resin, and
   wherein the rear material comprises one selected from polystyrene based rear material, polyurethane based rear material, vinyl chloride based rear material, and asphalt based rear material.

61. A solar cell module with a rear material according to claim 60, wherein said non-contact means is a tube for covering said electric connecting members.

62. A solar cell module with a rear material according to claim 60, wherein said non-contact means is a film sheet.

63. A solar cell module with a rear material according to claim 60, wherein said non-contact means is a tape.

64. A solar cell module with a rear material according to claim 60, wherein said non-contact means is an electric path supporting material.

65. A solar cell module with a rear material according to claim 60, wherein said non-contact means is a wiring binding device.

66. A solar cell module with a rear material according to claim 60, wherein said non-contact means is a paint.

67. A solar cell module with a rear material according to claim 60, wherein said non-contact means is an adhesive or a pressure sensitive adhesive.

68. A solar cell module with a rear material according to claim 60, wherein the solar cell module comprises a solar cell element and wherein a photoactive member constituting the solar cell element comprises an amorphous silicon semiconductor.

69. A solar cell module with a rear material according to claim 68, wherein the solar cell element is buried in a filler between a back reinforcing plate and a light-transmitting film.

70. A solar cell module with a rear material according to claim 69, wherein said back reinforcing plate has a dark color based casing.

71. A solar cell module with a rear material according to claim 60, wherein said electric connecting members attached to said solar cell module have the same length.

72. A solar cell module with a rear material according to claim 60, wherein said electric connecting member consists of a lead and connectors.

73. An enclosure with solar cells comprising a rear material disposed on the back side of a solar cell module outputting electricity through electric connecting members, each of which comprises a wire and a sheath material, and a non-contact means provided between the sheath material and the rear material,
   wherein the sheath material encases the wire, is not in contact with the rear material, and comprises a vinyl chloride resin, and
   wherein the rear material comprises one selected from polystyrene based rear material, polyurethane based rear material, vinyl chloride based rear material, and asphalt based rear material.

74. An enclosure with solar cells according to claim 73, wherein said non-contact means is a tube for covering said electric connecting members.

75. An enclosure with solar cells according to claim 73, wherein said non-contact means is a film sheet.

76. An enclosure with solar cells according to claim 73, wherein said non-contact means is a tape.

77. An enclosure with solar cells according to claim 73, wherein said non-contact means is an electric path supporting material.

78. An enclosure with solar cells according to claim 73, wherein said non-contact means is a wiring binding device.

79. An enclosure with solar cells according to claim 73, wherein said non-contact means is a paint.

80. An enclosure with solar cells according to claim 73, wherein said non-contact means is an adhesive or a pressure sensitive adhesive.

81. An enclosure with solar cells according to claim 73, wherein the solar cell module comprises a solar cell element and wherein a photoactive member constituting the solar cell element comprises an amorphous silicon semiconductor.

82. An enclosure with solar cells according to claim 81, wherein the solar cell element is buried in a filler between a back reinforcing plate and a light-transmitting film.

83. An enclosure with solar cells according to claim 82, wherein said back reinforcing plate has a dark color based casing.

84. An enclosure with solar cells according to claim 73, wherein said electric connecting members attached to said solar cell module have the same length.

85. An enclosure with solar cells according to claim 73, wherein said electric connecting member consists of a lead and connectors.

86. A sunlight generating apparatus comprising the enclosure with solar cells according to claim 73 and a power conversion means.

87. A method for installing a solar cell module with a rear material in an enclosure for solar cells which comprises:

disposing an underlaying material or a substrate material on the back side of a solar cell module outputting electricity through electric connecting members, each of which comprises a wire and a sheath material, wherein a non-contact means is provided between the sheath material and the underlaying material or the substrate material or the rear material to prevent the members from contacting the material, wherein the sheath material encases the wire, is not in contact with the underlaying material, the substrate material or the rear material, and comprises a vinyl chloride resin, wherein the rear material comprises one selected from polystyrene based rear material, polyurethane based rear material, vinyl chloride based rear material, and asphalt based rear material, and wherein the underlaying material or the substrate material comprises one selected from asphalt based roofing, roofing comprising asphalt containing a rubber or a resin, vinyl chloride resin based roofing, polystyrene based resin, and polyurethane based resin.

88. A method for installing a solar cell module with a rear material in an enclosure for solar cells according to claim 87, wherein the electric connecting members connecting the solar cell module to a collecting box provided in a house are drawn into the house through through-holes opened in the underlaying material or the substrate material, and wherein a non-contact space is provided between the electric connecting members and the underlaying material or the substrate material or the rear material.

89. A method for installing a solar cell module in an enclosure for solar cells which comprises:

placing a rear material between the solar cell module and an underlaying material or the substrate material, using electric connecting members, each of which comprises a wire and a sheath material, to electrically connect a plurality of solar cell modules outputting electricity from a non-light-receiving surface side through the electric connecting members, and providing a non-contact means between the sheath material and the underlaying material or the substrate material or the rear material, wherein the sheath material encases the wire, is not in contact with the underlaying material, the substrate material or the rear material, and comprises a vinyl chloride resin, wherein the rear material comprises one selected from polystyrene based rear material, polyurethane based rear material, vinyl chloride based rear material, and asphalt based rear material, and wherein the underlaying material or the substrate material comprises one selected from asphalt based roofing, roofing comprising asphalt containing a rubber or a resin, vinyl chloride resin based roofing, polystyrene based resin, and polyurethane based resin.

90. A method for installing a solar cell module in an enclosure for solar cells according to claim 89, wherein the electric connecting members connecting the solar cell module to a collecting box provided in a house are drawn into the house through through-holes opened in the underlaying material or the substrate material, and wherein a non-contact means is provided between the electric connecting members and the underlaying material or the substrate material or the rear material.

* * * * *

UNITED STATES PATENT AND TRADEMARK OFFICE
CERTIFICATE OF CORRECTION

PATENT NO. : 6,245,987 B1
DATED : June 12, 2001
INVENTOR(S) : Satoru Shiomi et al.

It is certified that error appears in the above-identified patent and that said Letters Patent is hereby corrected as shown below:

Title page,
Item [56] References Cited, under OTHER PUBLICATIONS;
In "Hunrath," "use" should read -- Use --.

Column 1,
Line 30, "connected" should read -- connected in --.

Column 10,
Line 25, "Lnc." should read -- Inc. --.

Column 20,
Line 64, "hole" should read -- hole and --.

Column 24,
Line 15, "In" should read -- in --.

Column 29,
Line 52, "such way" should read -- such a way --.

Column 30,
Line 19, "such way" should read -- such a way --.

Column 42,
Line 23, "electric," should read -- electric --.

Signed and Sealed this

Second Day of April, 2002

Attest:

JAMES E. ROGAN
*Attesting Officer*    *Director of the United States Patent and Trademark Office*